(12) United States Patent
Nishijima

(10) Patent No.: US 9,748,400 B2
(45) Date of Patent: Aug. 29, 2017

(54) SEMICONDUCTOR DEVICE

(71) Applicant: Semiconductor Energy Laboratory Co., Ltd., Atsugi-shi, Kanagawa-ken (JP)

(72) Inventor: Tatsuji Nishijima, Hadano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/249,569

(22) Filed: Apr. 10, 2014

(65) Prior Publication Data

US 2014/0217403 A1    Aug. 7, 2014

Related U.S. Application Data

(63) Continuation of application No. 13/472,018, filed on May 15, 2012, now Pat. No. 8,698,521.

(30) Foreign Application Priority Data

May 20, 2011    (JP) ................ 2011-113080

(51) Int. Cl.
   *H01L 29/786*     (2006.01)
   *H03K 19/0944*    (2006.01)
   *H03K 19/20*      (2006.01)

(52) U.S. Cl.
   CPC ..... *H01L 29/7869* (2013.01); *H03K 19/0944* (2013.01); *H03K 19/20* (2013.01)

(58) Field of Classification Search
   CPC . H01L 29/7869; H03K 19/0944; H03K 19/20
   See application file for complete search history.

(56) References Cited

U.S. PATENT DOCUMENTS

| | | | |
|---|---|---|---|
| 4,466,081 A | 8/1984 | Masuoka | |
| 5,202,591 A | 4/1993 | Walden | |

(Continued)

FOREIGN PATENT DOCUMENTS

| | | |
|---|---|---|
| EP | 0528302 A | 2/1993 |
| EP | 0905902 A | 3/1999 |

(Continued)

OTHER PUBLICATIONS

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Jarrett Stark
(74) *Attorney, Agent, or Firm* — Robinson Intellectual Property Law Office; Eric J. Robinson

(57) ABSTRACT

A semiconductor device in which a transistor using an oxide semiconductor containing In, Zn, or the like for a channel region can be driven like a p-channel transistor is provided. The semiconductor device includes a transistor and an inverter, wherein an output of the inverter is input to a gate of the transistor, a channel region of the transistor includes an oxide semiconductor film containing In, Zn, or Sn, and each channel region of transistors in the inverter contains silicon. When a high voltage is input to the inverter, a low voltage is output from the inverter and is input to the gate of the transistor, so that the transistor is turned off. When a low is input to the inverter, a high voltage is output from the inverter and is input to the gate of the transistor, so that the transistor is turned on.

24 Claims, 65 Drawing Sheets

(56) References Cited

U.S. PATENT DOCUMENTS

| | | | |
|---|---|---|---|
| 5,336,624 A | 8/1994 | Walden | |
| 5,568,062 A | 10/1996 | Kaplinsky | |
| 5,731,856 A | 3/1998 | Kim et al. | |
| 5,744,864 A | 4/1998 | Cillessen et al. | |
| 5,939,937 A | 8/1999 | Terletzki | |
| 6,144,580 A * | 11/2000 | Murray | G11C 16/045 |
| | | | 365/185.01 |
| 6,294,274 B1 | 9/2001 | Kawazoe et al. | |
| 6,515,511 B2 | 2/2003 | Sugibayashi et al. | |
| 6,563,174 B2 | 5/2003 | Kawasaki et al. | |
| 6,617,892 B2 * | 9/2003 | Krishnamurthy | H04L 25/0292 |
| | | | 326/112 |
| 6,727,522 B1 | 4/2004 | Kawasaki et al. | |
| 7,018,875 B2 * | 3/2006 | Madurawe | H01L 27/0688 |
| | | | 438/151 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,233,041 B2 | 6/2007 | Duan et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,483,013 B2 | 1/2009 | Osame | |
| 7,501,293 B2 | 3/2009 | Ito et al. | |
| 7,528,643 B2 | 5/2009 | Kimura | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 8,222,092 B2 | 7/2012 | Yamazaki et al. | |
| 8,304,298 B2 | 11/2012 | Ofuji et al. | |
| 9,136,390 B2 | 9/2015 | Yamazaki et al. | |
| 2001/0015450 A1 | 8/2001 | Sugibayashi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 * | 9/2005 | Chiang | H01L 29/7869 |
| | | | 257/368 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0262483 A1 | 11/2006 | Osame | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0242992 A1 * | 10/2009 | Kim | H01L 21/823462 |
| | | | 257/360 |
| 2009/0278122 A1 | 11/2009 | Hosono et al. | |
| 2009/0280600 A1 | 11/2009 | Hosono et al. | |
| 2010/0059744 A1 * | 3/2010 | Yin | H01L 21/84 |
| | | | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0176395 A1 * | 7/2010 | Choi | H01L 27/12 |
| | | | 257/43 |
| 2010/0276689 A1 | 11/2010 | Iwasaki | |
| 2010/0279462 A1 | 11/2010 | Iwasaki | |
| 2011/0101332 A1 | 5/2011 | Yamazaki et al. | |
| 2011/0101351 A1 | 5/2011 | Yamazaki | |
| 2011/0121887 A1 * | 5/2011 | Kato | H01L 27/0688 |
| | | | 327/534 |
| 2011/0181349 A1 | 7/2011 | Yamazaki et al. | |
| 2011/0210328 A1 | 9/2011 | Yamazaki et al. | |
| 2011/0212571 A1 | 9/2011 | Yamazaki et al. | |
| 2011/0215318 A1 | 9/2011 | Yamazaki et al. | |
| 2011/0285442 A1 | 11/2011 | Saito | |
| 2012/0099368 A1 | 4/2012 | Kamata | |
| 2016/0005876 A1 | 1/2016 | Yamazaki et al. | |

FOREIGN PATENT DOCUMENTS

| | | |
|---|---|---|
| EP | 1 727 154 B | 11/2006 |
| EP | 1 737 044 A | 12/2006 |
| EP | 1 727 154 | 5/2010 |
| EP | 2 226 847 A | 9/2010 |
| JP | 47-016085 A | 8/1972 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| JP | 64-079862 A | 3/1989 |
|---|---|---|
| JP | 05-218849 A | 8/1993 |
| JP | 05-235729 A | 9/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-230326 A | 8/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-101407 A | 4/2003 |
| JP | 2004-103957 A | 4/2004 |
| JP | 2004-273614 A | 9/2004 |
| JP | 2004-273732 A | 9/2004 |
| JP | 2006-165532 | 6/2006 |
| JP | 2006-352090 A | 12/2006 |
| JP | 2007-103918 A | 4/2007 |
| JP | 2009-135350 A | 6/2009 |
| JP | 2010-141230 | 6/2010 |
| JP | 2010-171404 A | 8/2010 |
| JP | 2011-059682 A | 3/2011 |
| TW | 388981 | 5/2000 |
| TW | 200908222 | 2/2009 |
| WO | WO 2004/114391 | 12/2004 |
| WO | WO 2007/029844 | 3/2007 |
| WO | WO-2008/143304 | 11/2008 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

(56) References Cited

OTHER PUBLICATIONS

Sakata et al., "Development of 4.0-In. AMOLED Display with Driver Circuit Using Amorphous In—Ga—Zn-Oxide TFTs," IDW '09: Proceedings of the 16th International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by Peald Grown ZnO TFT," IMID '07 Digest, 2007, pp. 1249-1252.

Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Osada et al., "Development of Driver-Integrated Panel using Amorphous In—Ga—Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Kamiya et al., "Carrier transport properties and electronic structures of amorphous oxide semiconductors: the present status," Solid State Physics, Sep. 1, 2009, vol. 44, No. 9, pp. 621-633, Agne Gijutsu Center.

Kim et al., "High mobility bottom gate InGaZnO thin film transistors with SiOx etch stopper," Appl. Phys. Lett. (Applied Physics Letters), May 24, 2007, vol. 90, No. 21, pp. 212114-1-212114-3.

Jeon et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

\* cited by examiner

| input | |
|---|---|
| 126 | 131 |
| H | L |
| L | H |
| L | L |

| input | |
|---|---|
| 126 | 131 |
| H | L |
| L | H |
| L | L |

| input | |
|---|---|
| 126 | 131 |
| H | L |
| L | H |
| L | L |

| input | |
|---|---|
| 126 | 131 |
| H | L |
| L | H |
| L | L |

| input | |
|---|---|
| 196 | 201 |
| H | L |
| L | H |
| H | H |

| input | |
|---|---|
| 226 | 231 |
| H | L |
| L | H |
| H | H |

| input | |
|---|---|
| 226 | 231 |
| H | L |
| L | H |
| H | H |

FIG. 41A
FIG. 41B
FIG. 41C
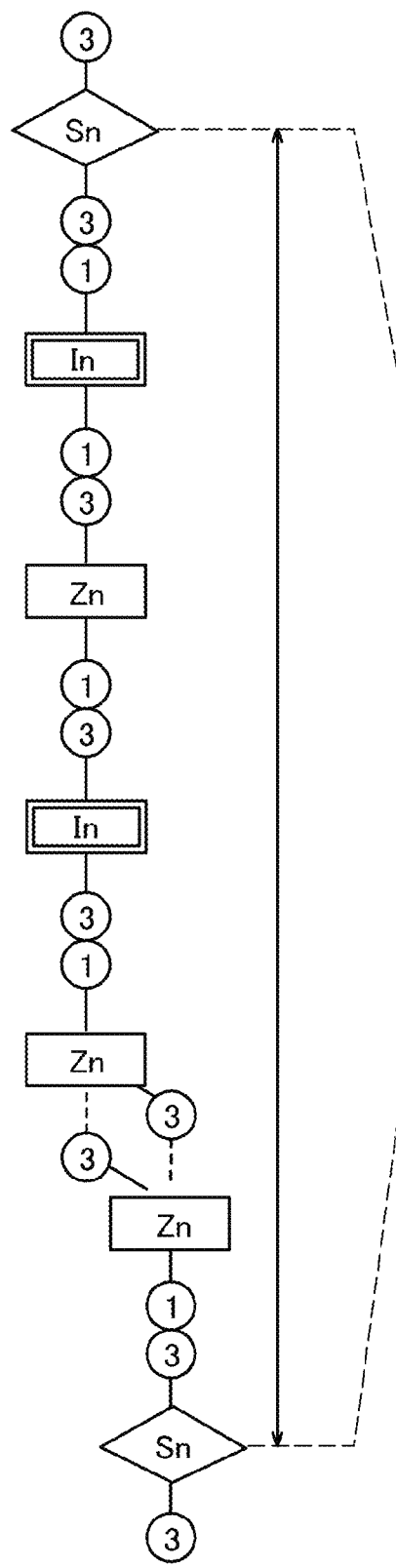
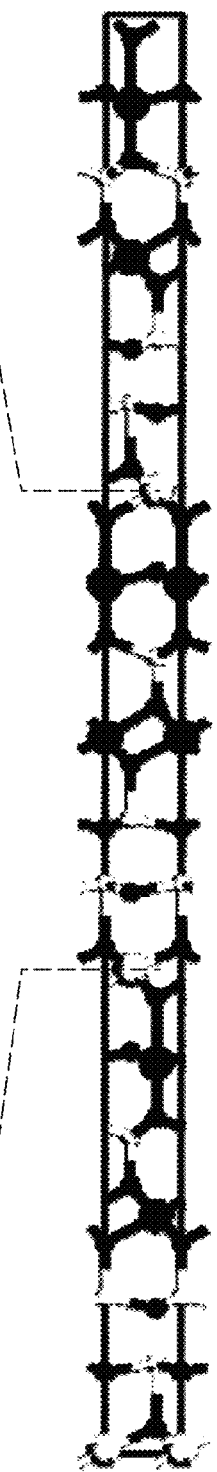
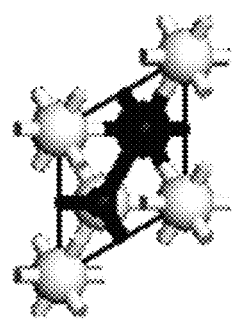
- In
- Sn
- Zn
- O

FIG. 42A
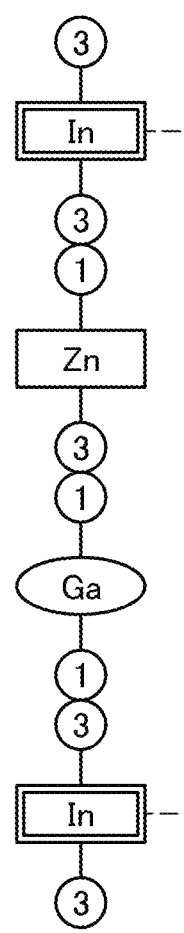
FIG. 42B
FIG. 42C
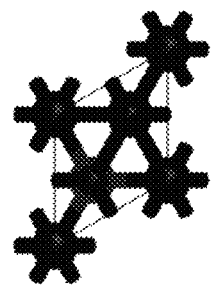
● In
○ Ga
○ Zn
● O

SEMICONDUCTOR DEVICE

BACKGROUND OF THE INVENTION

1. Field of the Invention

The present invention relates to a transistor in which an oxide semiconductor film containing In, Zn, or Sn is used for a channel region, and relates to a semiconductor device including the transistor. In particular, the present invention relates to a semiconductor device including a logic circuit using the transistor.

2. Description of the Related Art

Patent Document 1 discloses a circuit including a transistor in which an amorphous oxide is used for a channel region. The amorphous oxide contains In—Ga—Zn—O or the like. The transistor is a normally-off type transistor in which the electron mobility is 1 $cm^2/V \cdot sec$ or more and current flowing between source and drain when voltage is not applied to a gate electrode (in an off state) (the current also called off-leakage current) is less than 10 microamperes.

REFERENCE

Patent Document 1: Japanese Published Patent Application No. 2006-165532

SUMMARY OF THE INVENTION

In Patent Document 1, a circuit including an n-channel transistor and a p-channel transistor is disclosed. However, a channel region of the p-channel transistor is not formed of an amorphous oxide containing In, Zn, or Sn, but is formed of an inorganic semiconductor such as doped Si, a low-molecular organic compound such as pentacene, a high-molecular organic compound such as polythiophene, or an oxide semiconductor such as $Cu_2O$. Thus, the material used for the channel region of the n-channel transistor is different from that used for the channel region of the p-channel transistor, so that the performance of the p-channel transistor is different from that of the n-channel transistor. Therefore, it is necessary that the same material be used for respective channel regions of the n-channel transistor and the p-channel transistor.

So far, however, a p-channel transistor, i.e., a transistor which is turned on by inputting a low-voltage signal to the gate electrode has not been realized among transistors in which an oxide semiconductor containing In, Zn, or Sn is used for a channel region.

According to one embodiment of the present invention, a semiconductor device in which a transistor using an oxide semiconductor containing In, Zn, or Sn for a channel region can be driven like a p-channel transistor is provided.

The present inventor attained the above-described semiconductor device as follows: a gate of a transistor using an oxide semiconductor containing In, Zn, or Sn for a channel region (hereinafter the transistor referred to as an oxide semiconductor transistor) is electrically connected to an output of an inverter including transistors each using a semiconductor such as silicon for a channel region (hereinafter the transistors each referred to as a silicon transistor). Such connection of the gate of the transistor (oxide semiconductor transistor) to the output of the inverter enables the transistor (oxide semiconductor transistor) to be driven like a p-channel transistor.

A first embodiment of the present invention is a semiconductor device including a transistor and an inverter, in which an output of the inverter is input to a gate of the transistor, a channel region of the transistor includes an oxide semiconductor film containing In, Zn, or Sn, and each channel region of transistors included in the inverter contains silicon.

When a high voltage (hereinafter also referred to as an H voltage) is input to the inverter, a low voltage (hereinafter also referred to as an L voltage) is output. The L voltage is input to the gate of the transistor, so that the transistor is turned off.

When an L voltage is input to the inverter, an H voltage is output. The H voltage is input to the gate of the transistor, so that the transistor is turned on.

Thus, the transistor can be turned off by the H voltage and turned on by the L voltage; the transistor can be driven as a pseudo p-channel transistor.

A second embodiment of the present invention is a semiconductor device including a first transistor, a second transistor, and an inverter, in which an output of the inverter is input to a gate of the first transistor, an input to the inverter is also input to a gate of the second transistor, a channel region of the first transistor and a channel region of the second transistor include respective oxide semiconductor films containing In, Zn, or Sn, and a channel region of a transistor included in the inverter contains silicon.

When an H voltage is input to the inverter and the gate of the second transistor, an L voltage is output from the inverter. The L voltage output from the inverter is input to the gate of the first transistor, so that the first transistor is turned off.

In that case, the second transistor is turned on. For example, in the case where a ground potential or a reference potential (hereinafter also referred to as Vss) is applied to one of a source and a drain of the second transistor, an L voltage such as Vss is output from the other of the source and the drain of the second transistor.

When an L voltage is input to the inverter and the gate of the second transistor, an H voltage is output from the inverter. The H voltage output from the inverter is input to the gate of the first transistor, so that the first transistor is turned on. For example, in the case where a bias voltage or a power supply potential (hereinafter also referred to as Vdd) is applied to one of a source and a drain of the first transistor, an H voltage such as Vdd is output from the other of the source and the drain of the first transistor.

In that case, the second transistor is turned off.

The L voltage can be output from the semiconductor device of the second embodiment of the present invention by inputting the H voltage and the H voltage can be output therefrom by inputting the L voltage. Thus, the semiconductor device can function as an inverter.

A third embodiment of the present invention is a semiconductor device including a first transistor, a second transistor, and an inverter, in which an output of the inverter is input to a gate of the second transistor, an input to the inverter is also input to a gate of the first transistor, a channel region of the first transistor and a channel region of the second transistor include respective oxide semiconductor films containing In, Zn, or Sn, and each channel region of transistors included in the inverter contains silicon.

When an H voltage is input to the inverter and the gate of the first transistor, an L voltage is output from the inverter. The L voltage output from the inverter is input to the gate of the second transistor, so that the second transistor is turned off.

In that case, the first transistor is turned on. For example, in the case where a bias voltage or a power supply potential (hereinafter also referred to as Vdd) is applied to one of a source and a drain of the first transistor, an H voltage such as Vdd is output from the other of the source and the drain of the first transistor.

When an L voltage is input to the inverter and the gate of the first transistor, an H voltage is output from the inverter. The H voltage output from the inverter is input to the gate of the second transistor, so that the second transistor is turned on. For example, in the case where a ground potential or a reference potential (hereinafter also referred to as Vss) is applied to one of a source and a drain of the second transistor, an L voltage such as Vss is output from the other of the source and the drain of the second transistor.

In that case, the first transistor is turned off.

The H voltage can be output from the semiconductor device of the first embodiment of the present invention by inputting the H voltage and the L voltage can be output therefrom by inputting the L voltage. Thus, the semiconductor device can function as a buffer.

A fourth embodiment of the present invention is a semiconductor device including a first transistor, a second transistor, a first inverter, and a second inverter, in which an output of the first inverter is input to a gate of the first transistor, an output of the second inverter is input to the first inverter and a gate of the second transistor, a channel region of the first transistor and a channel region of the second transistor include respective oxide semiconductor films containing In, Zn, or Sn, and respective channel regions of transistors included in the first inverter and the second inverter contain silicon. The semiconductor device can function as a buffer.

Alternatively, a fourth embodiment of the present invention is a semiconductor device including a first transistor, a second transistor, a first inverter, a second inverter, and a third inverter, in which an output of the first inverter is input to a gate of the first transistor, an output of the second inverter is input to the first inverter and a gate of the second transistor, an output of the third inverter is input to the second inverter, a channel region of the first transistor and a channel region of the second transistor include respective oxide semiconductor films containing In, Zn, or Sn, and respective channel regions of transistors included in the first inverter, the second inverter, and the third inverter contain silicon. The semiconductor device can function as an inverter.

A fifth embodiment of the present invention is a semiconductor device including a first transistor, a second transistor, a first inverter, and a second inverter, in which an output of the first inverter is input to a gate of the second transistor, an output of the second inverter is input to the first inverter and a gate of the first transistor, a channel region of the first transistor and a channel region of the second transistor include respective oxide semiconductor films containing In, Zn, or Sn, and respective channel regions of transistors included in the first inverter and the second inverter contain silicon. The semiconductor device can function as an inverter.

Alternatively, a fifth embodiment of the present invention is a semiconductor device including a first transistor, a second transistor, a first inverter, a second inverter, and a third inverter, in which an output of the first inverter is input to a gate of the second transistor, an output of the second inverter is input to the first inverter and a gate of the first transistor, an output of the third inverter is input to the second inverter, a channel region of the first transistor and a channel region of the second transistor include respective oxide semiconductor films containing In, Zn, or Sn, and respective channel regions of transistors included in the first inverter, the second inverter, and the third inverter contain silicon. The semiconductor device can function as a buffer.

A sixth embodiment of the present invention is a semiconductor device including a first transistor, a second transistor, an inverter, and a NAND gate, in which an output of the inverter is input to a gate of the first transistor, an output of the NAND gate is input to the inverter and a gate of the second transistor, a channel region of the first transistor and a channel region of the second transistor include respective oxide semiconductor films containing In, Zn, or Sn, and respective channel regions of transistors included in the inverter and the NAND gate contain silicon. The semiconductor device can function as an AND gate.

Alternatively, a sixth embodiment of the present invention is a semiconductor device including a first transistor, a second transistor, a first inverter, a second inverter, and a NAND gate, in which an output of the first inverter is input to a gate of the first transistor, an output of the second inverter is input to the first inverter and a gate of the second transistor, an output of the NAND gate is input to the second inverter, a channel region of the first transistor and a channel region of the second transistor include respective oxide semiconductor films containing In, Zn, or Sn, and respective channel regions of transistors included in the first inverter, the second inverter, and the NAND gate contain silicon. The semiconductor device can function as a NAND gate.

A seventh embodiment of the present invention is a semiconductor device including a first transistor, a second transistor, an inverter, and a NAND gate, in which an output of the inverter is input to a gate of the second transistor, an output of the NAND gate is input to the inverter and a gate of the first transistor, a channel region of the first transistor and a channel region of the second transistor include respective oxide semiconductor films containing In, Zn, or Sn, and respective channel regions of transistors included in the inverter and the NAND gate contain silicon. The semiconductor device can function as a NAND gate.

Alternatively, a seventh embodiment of the present invention is a semiconductor device including a first transistor, a second transistor, a first inverter, a second inverter, and a NAND gate, in which an output of the first inverter is input to a gate of the second transistor, an output of the second inverter is input to the first inverter and a gate of the first transistor, an output of the NAND gate is input to the second inverter, a channel region of the first transistor and a channel region of the second transistor include respective oxide semiconductor films containing In, Zn, or Sn, and respective channel regions of transistors included in the first inverter, the second inverter, and the NAND gate contain silicon. The semiconductor device can function as an AND gate.

An eighth embodiment of the present invention is a semiconductor device including a first transistor, a second transistor, an inverter, and a NOR gate, in which an output of the inverter is input to a gate of the first transistor, an output of the NOR gate is input to the inverter and a gate of the second transistor, a channel region of the first transistor and a channel region of the second transistor include respective oxide semiconductor films containing In, Zn, or Sn, and respective channel regions of transistors included in the inverter and the NOR gate contain silicon. The semiconductor device can function as an OR gate.

Alternatively, an eighth embodiment of the present invention is a semiconductor device including a first transistor, a second transistor, a first inverter, a second inverter, and a NOR gate, in which an output of the first inverter is input to a gate of the first transistor, an output of the second inverter is input to the first inverter and a gate of the second transistor, an output of the NOR gate is input to the second inverter, a channel region of the first transistor and a channel region of the second transistor include respective oxide semiconductor films containing In, Zn, or Sn, and respective channel regions of transistors included in the first inverter, the second inverter, and the NOR gate contain silicon. The semiconductor device can function as a NOR gate.

A ninth embodiment of the present invention is a semiconductor device including a first transistor, a second transistor, an inverter, and a NOR gate, in which an output of the inverter is input to a gate of the second transistor, an output of the NOR gate is input to the inverter and a gate of the first transistor, a channel region of the first transistor and a channel region of the second transistor include respective oxide semiconductor films containing In, Zn, or Sn, and respective channel regions of transistors included in the inverter and the NOR gate contain silicon. The semiconductor device can function as a NOR gate.

Alternatively, a ninth embodiment of the present invention is a semiconductor device including a first transistor, a second transistor, a first inverter, a second inverter, and a NOR gate, in which an output of the first inverter is input to a gate of the second transistor, an output of the second inverter is input to the first inverter and a gate of the first transistor, an output of the NOR gate is input to the second inverter, a channel region of the first transistor and a channel region of the second transistor include respective oxide semiconductor films containing In, Zn, or Sn, and respective channel regions of transistors included in the first inverter, the second inverter, and the NOR gate contain silicon. The semiconductor device can function as an OR gate.

Another embodiment of the present invention is an RS flip-flop including the semiconductor device described in any one of the above-described embodiments.

Another embodiment of the present invention is a D flip-flop including the above-described RS flip-flop.

According to the first embodiment of the present invention, an oxide semiconductor transistor can be driven as a pseudo p-channel transistor. Accordingly, the semiconductor device of the first embodiment of the present invention includes the pseudo p-channel transistor whose mobility is high and off-leakage current is small.

According to the second embodiment of the present invention, one of two oxide semiconductor transistors can be driven as a pseudo p-channel transistor whereas the other can be driven as an n-channel transistor. Accordingly, the semiconductor device of the second embodiment of the present invention includes the pseudo p-channel transistor and the n-channel transistor each of which has high mobility and small off-leakage current.

The semiconductor devices of the second to ninth embodiments of the present invention can function as an inverter, a buffer, a NAND gate, an AND gate, a NOR gate, or an OR gate whose retention characteristics of an output voltage is high.

The RS flip-flop and the D flip-flop of other embodiments of the present invention each have high voltage retention characteristics.

BRIEF DESCRIPTION OF THE DRAWINGS

FIGS. 41A to 41C illustrate a crystal structure of an oxide semiconductor;

FIGS. 42A to 42C illustrate a crystal structure of an oxide semiconductor;

DETAILED DESCRIPTION OF THE INVENTION

Figure 1A:
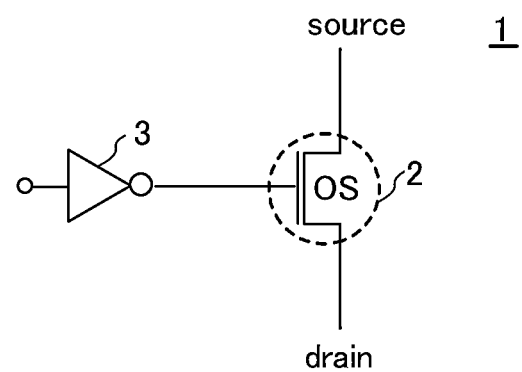
FIGS. 1A and 1B illustrate a semiconductor device in Embodiment 1.

Hereinafter, embodiments of the present invention are described. However, the present invention can be carried out in many different modes, and it will be readily understood by those skilled in the art that modes and details of the present invention can be modified in various ways without departing from the purpose and scope of the present invention. Therefore, the present invention is not construed as being limited to description of the embodiments. The same reference numerals denote the same portions or portions having similar functions throughout the drawings, and repetitive explanation is skipped in some cases.

Functions of a "source" and a "drain" may be switched accompanying a change of the conductivity type of the transistor, a change of the current flow in a circuit operation, or the like. Therefore, the terms "source" and "drain" can be switched to be used in this specification.

Further, being "electrically connected" encompasses being connected through anything having any electric function. There is no particular limitation on the object having any electric function as long as electric signals can be exchanged between the components connected through the object. Examples of the object having any electric function are a switching element such as a transistor, a resistor, an inductor, a capacitor, and any other element with a variety of functions in addition to an electrode and a wiring.

In addition, the case where independent components are shown as if they are electrically connected to each other in a circuit diagram encompasses the case where one conductive film has functions of a plurality of components, such as the case where part of a wiring also functions as an electrode. The term "electrical connection" in this specification includes in its category such a case where one conductive film has functions of a plurality of components.

Further, the terms "over" and "below" do not necessarily mean "directly on" and "directly below", respectively, in the position relation between components. For example, in the case of a "gate electrode over a gate insulating layer", any other component may be provided between the gate insulating layer and the gate electrode.

The position, size, range, or the like of each component in the drawings and the like is not accurately depicted in some cases for easy understanding. Therefore, the disclosed invention is not necessarily limited to the position, size, range, or the like as disclosed in the drawings and the like.

Further, the ordinal number such as "first", "second", and "third" are used just to avoid confusion among components.

Embodiment 1

Described in this embodiment is a semiconductor device including a transistor and an inverter, in which an output of the inverter is input to a gate of the transistor, a channel region of the transistor includes an oxide semiconductor film containing In and/or Zn, and each channel region of transistors included in the inverter contains silicon.

A semiconductor device 1 is shown in FIG. 1A. The semiconductor device 1 includes a transistor 2 and an inverter 3. A channel region of the transistor 2 is formed of an oxide semiconductor film containing In, Zn, or Sn. Each channel region of the inverter 3 contains silicon. Such a transistor whose channel region is formed of an oxide semiconductor film containing In, Zn, or Sn is also referred to as an oxide semiconductor transistor or an OS transistor, and such a transistor whose channel region contain a semiconductor such as silicon is also referred to as a silicon transistor or an Si transistor. Further, in some of the drawings, "OS" is added to the transistor whose channel region is formed of an oxide semiconductor film containing In, Zn, or Sn.

The transistor 2 is an OS transistor, and is a kind of so-called n-channel transistor; the transistor 2 is turned on by application of an H voltage. Hereinafter, the transistor 2 is also referred to as an OS transistor 2.

Figure 1B:
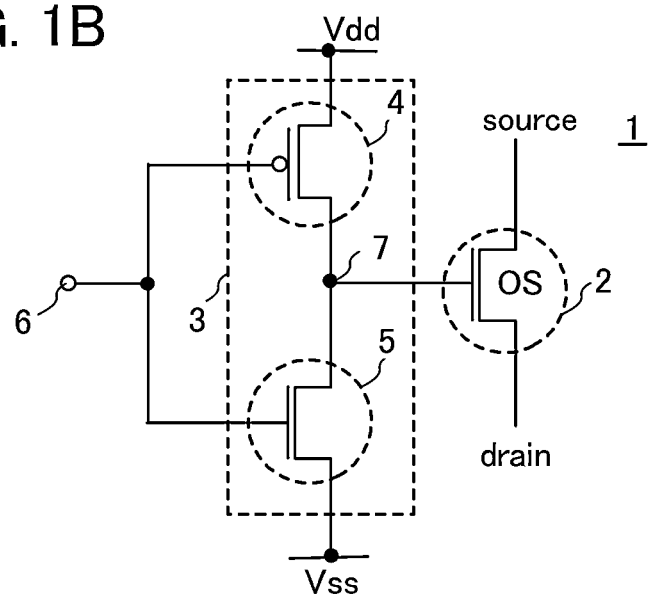

An output of the inverter 3 is electrically connected to a gate of the OS transistor 2. FIG. 1B shows the semiconductor device 1 in which a structure of the inverter 3 is illustrated. The inverter 3 includes a p-channel Si transistor 4 and an n-channel Si transistor 5.

A gate of the p-channel Si transistor 4 is electrically connected to a signal input portion 6, one of a source and a drain of the p-channel Si transistor 4 may be applied with a bias voltage or a power supply potential (hereinafter also referred to as Vdd), and the other of the source and the drain is electrically connected to a signal output portion 7. Hereinafter, the signal input portion and the signal output portion are also each referred to as a node.

A gate of the n-channel Si transistor 5 is electrically connected to the signal input portion 6, one of a source and a drain of the n-channel Si transistor 5 may be applied with a ground potential or a reference potential (hereinafter also referred to as Vss), and the other of the source and the drain is electrically connected to the signal output portion 7.

The signal output portion 7 is electrically connected to the gate of the OS transistor 2. Therefore, the other of the source and the drain of the p-channel Si transistor 4 and the other of the source and the drain of the n-channel Si transistor 5 are electrically connected to the gate of the OS transistor 2.

In the semiconductor device 1, the OS transistor 2 can be driven like a p-channel transistor. That is, the OS transistor 2 is turned off by inputting an H voltage to the semiconductor device 1, and the OS transistor 2 is turned on by inputting an L voltage to the semiconductor device 1. An operation of the semiconductor device 1 is described below, using FIGS. 2A and 2B and FIGS. 3A and 3B.

Figure 2A:
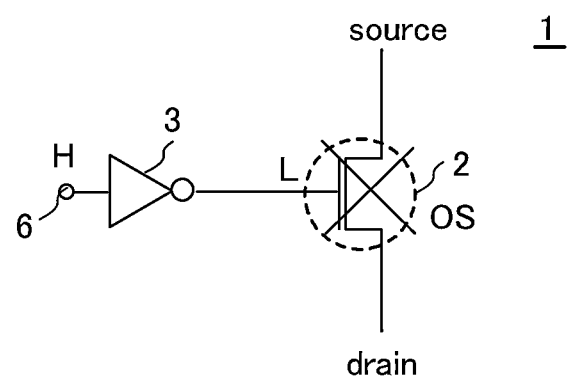
FIGS. 2A and 2B illustrate an operation of the semiconductor device in Embodiment 1.
Figure 2B:
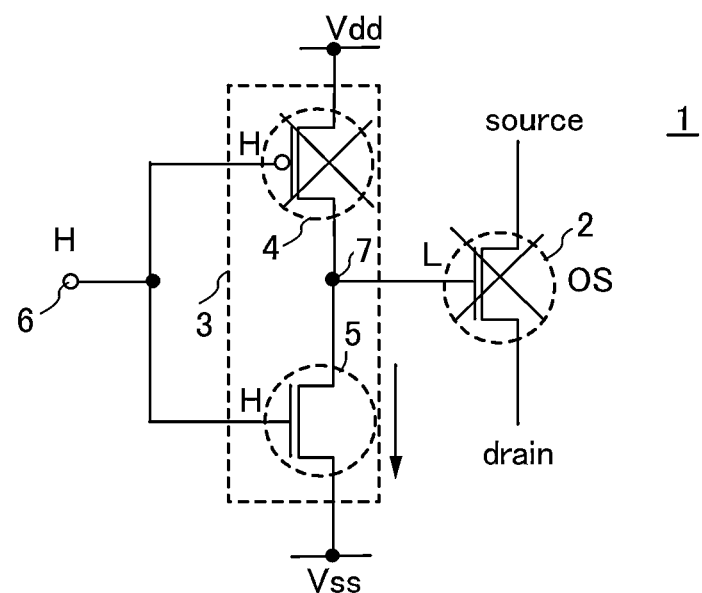

As shown in FIGS. 2A and 2B, an H voltage is input to the signal input portion 6 of the semiconductor device 1.

The H voltage is input to the gate of the p-channel Si transistor 4 in the inverter 3, so that the p-channel Si transistor 4 is turned off.

The H voltage is also input to the gate of the n-channel Si transistor 5 in the inverter 3, so that the n-channel Si transistor 5 is turned on. Consequently, an L voltage is output to the signal output portion 7 of the inverter 3.

Thus, the L voltage is input to the gate of the OS transistor 2, so that the OS transistor 2 is turned off.

Figure 3A:
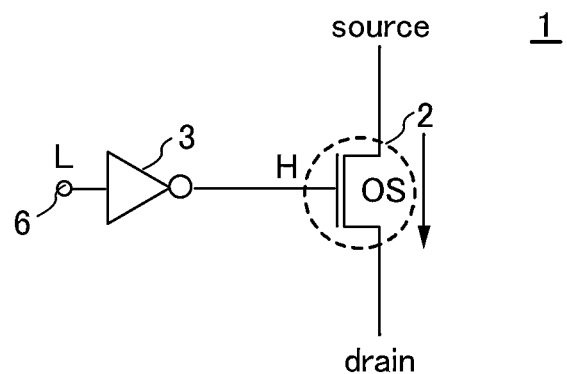
FIGS. 3A and 3B illustrate an operation of the semiconductor device in Embodiment 1.
Figure 3B:
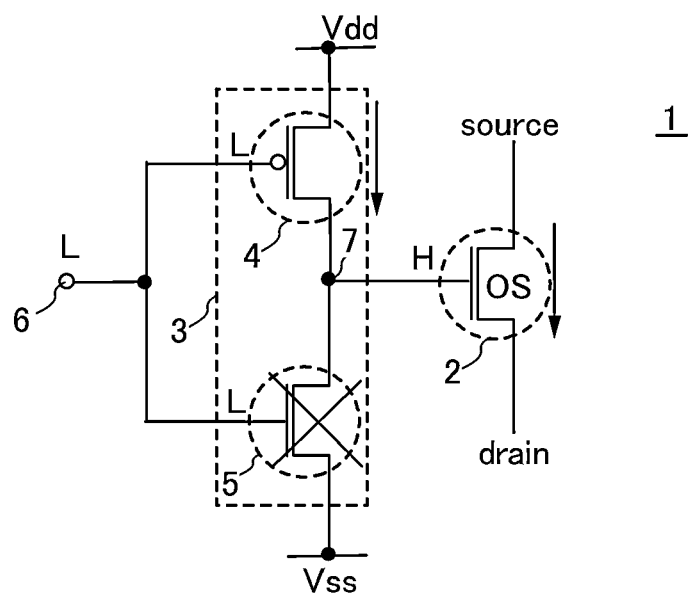

Alternatively, as shown in FIGS. 3A and 3B, an L voltage is input to the signal input portion 6 of the semiconductor device 1.

The L voltage is input to the gate of the p-channel Si transistor 4 in the inverter 3, so that the p-channel Si transistor 4 is turned on. Consequently, an H voltage is output to the signal output portion 7 of the inverter 3.

Thus, the H voltage is input to the gate of the OS transistor 2, so that the OS transistor 2 is turned on.

In that case, the n-channel Si transistor 5 in the inverter 3 is turned off because the L voltage is input to the gate of the n-channel Si transistor 5.

In this manner, the OS transistor 2 is turned on by inputting an L voltage to the signal input portion 6, and the OS transistor 2 is turned off by inputting an H voltage to the signal input portion 6. The OS transistor 2 can be thus driven like a p-channel transistor. In the OS transistor 2, the mobility is high and the off-leakage current is much smaller than that in a semiconductor such as silicon. That is, the semiconductor device 1 includes a pseudo p-channel transistor whose mobility is high and off-leakage current is small.

The mobility of the OS transistor 2 can be further increased by crystallizing the oxide semiconductor in the channel region. Further, the off-leakage current of the OS transistor 2 can be further decreased by removing impurities such as hydrogen in the oxide semiconductor. Description of these is given later.

Embodiment 2

Described in this embodiment is a semiconductor device including a first transistor, a second transistor, and an inverter, in which an output of the inverter is input to a gate of the first transistor, an input to the inverter is also input to a gate of the second transistor, channel regions of the first transistor and the second transistor include respective oxide semiconductor films containing In, Zn, or Sn, and each channel region of transistors included in the inverter contains silicon.

Figure 62A:
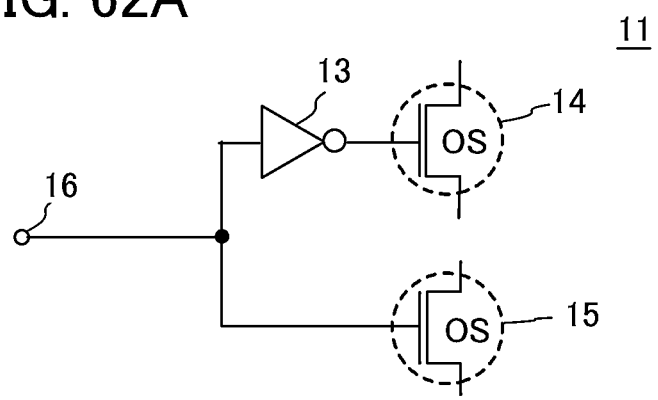
FIGS. 62A and 62B illustrate a semiconductor device in Embodiment 2.
Figure 62B:
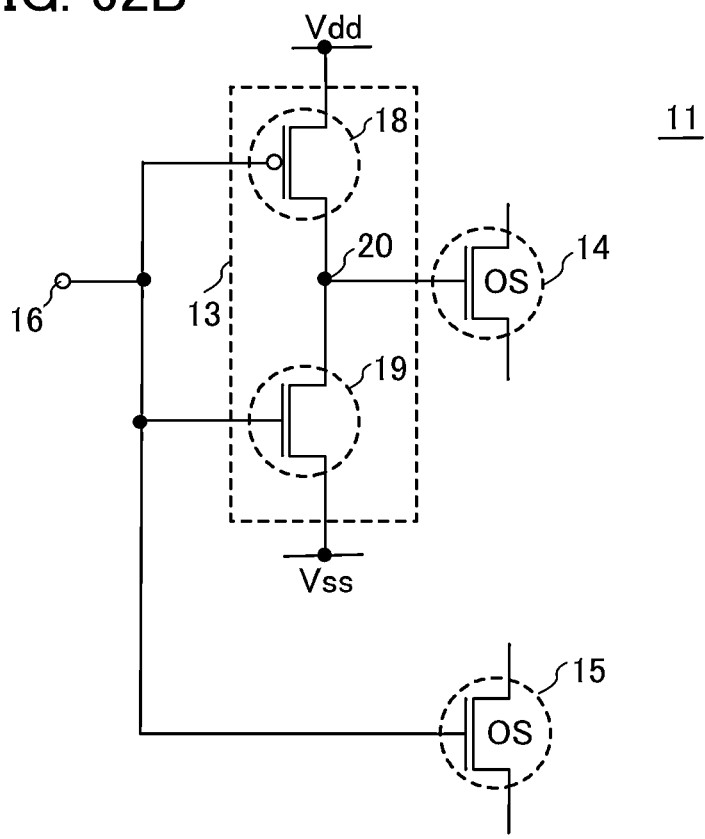

A semiconductor device 11 according to Embodiment 2 is shown in FIGS. 62A and 62B. The semiconductor device 11 includes a first transistor 14, a second transistor 15, and an inverter 13. Each of the first transistor 14 and the second transistor 15 is an OS transistor. The inverter 13 includes Si transistors.

Hereinafter, the first transistor 14 and the second transistor 15, which are OS transistors, are also referred to as a first OS transistor 14 and a second OS transistor 15, respectively.

A gate of the first OS transistor 14 is electrically connected to a signal output portion 20 of the inverter 13.

A gate of the second OS transistor 15 is electrically connected to a signal input portion 16.

The inverter 13 includes a p-channel Si transistor 18 and an n-channel Si transistor 19.

A gate of the p-channel Si transistor 18 is electrically connected to the signal input portion 16, one of a source and a drain of the p-channel Si transistor 18 is applied with Vdd, and the other of the source and the drain is electrically connected to the signal output portion 20.

A gate of the n-channel Si transistor 19 is electrically connected to the signal input portion 16, one of a source and a drain of the n-channel Si transistor 19 is applied with Vss, and the other of the source and the drain is electrically connected to the signal output portion 20.

An operation of the semiconductor device 11 is described below, using FIGS. 63A and 63B and FIGS. 64A and 64B.

Figure 63A:
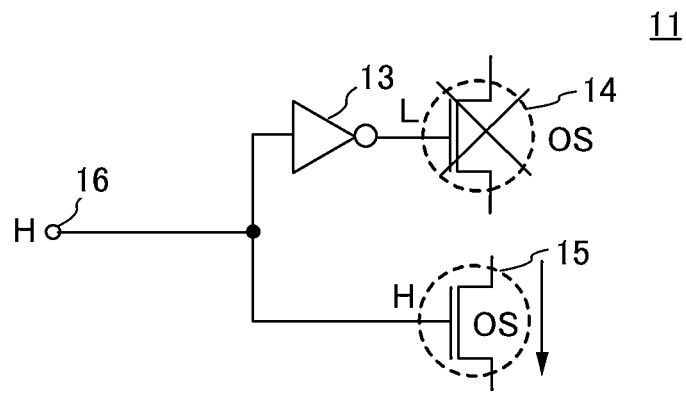
FIGS. 63A and 63B illustrate an operation of the semiconductor device in Embodiment 2.
Figure 63B:
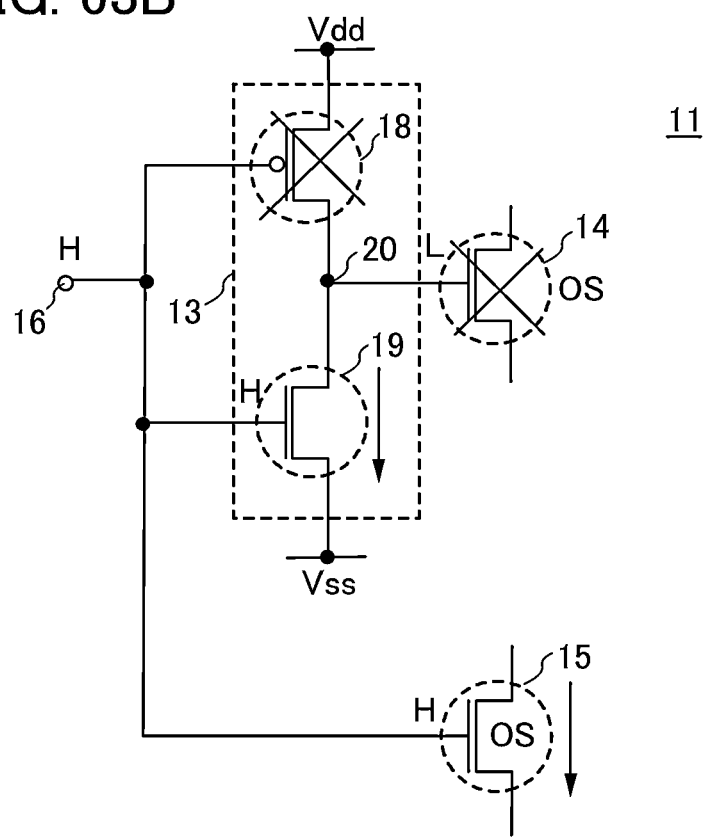

As shown in FIGS. 63A and 63B, an H voltage is input to the signal input portion 16 of the semiconductor device 11.

The H voltage is input to the gate of the p-channel Si transistor 18 in the inverter 13, so that the p-channel Si transistor 18 is turned off.

The H voltage is also input to the gate of the n-channel Si transistor 19 in the inverter 13, so that the n-channel Si transistor 19 is turned on. Consequently, an L voltage such as Vss is output to the signal output portion 20 of the inverter 3.

Thus, the L voltage is input to the gate of the first OS transistor 14, so that the first OS transistor 14 is turned off.

On the other hand, the H voltage is also input to the gate of the second OS transistor 15, so that the second OS transistor 15 is turned on.

Figure 64A:
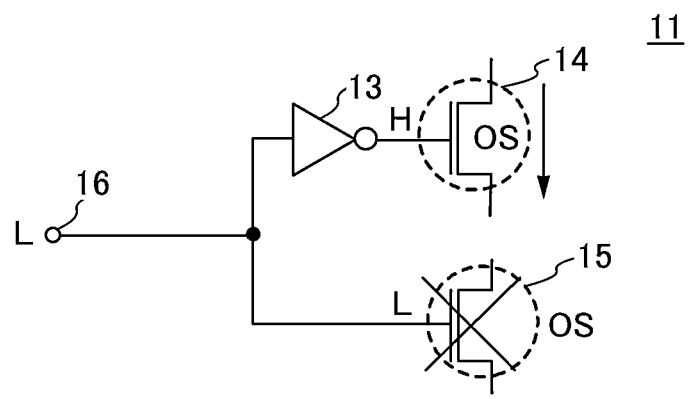
FIGS. 64A and 64B illustrate an operation of the semiconductor device in Embodiment 2.
Figure 64B:
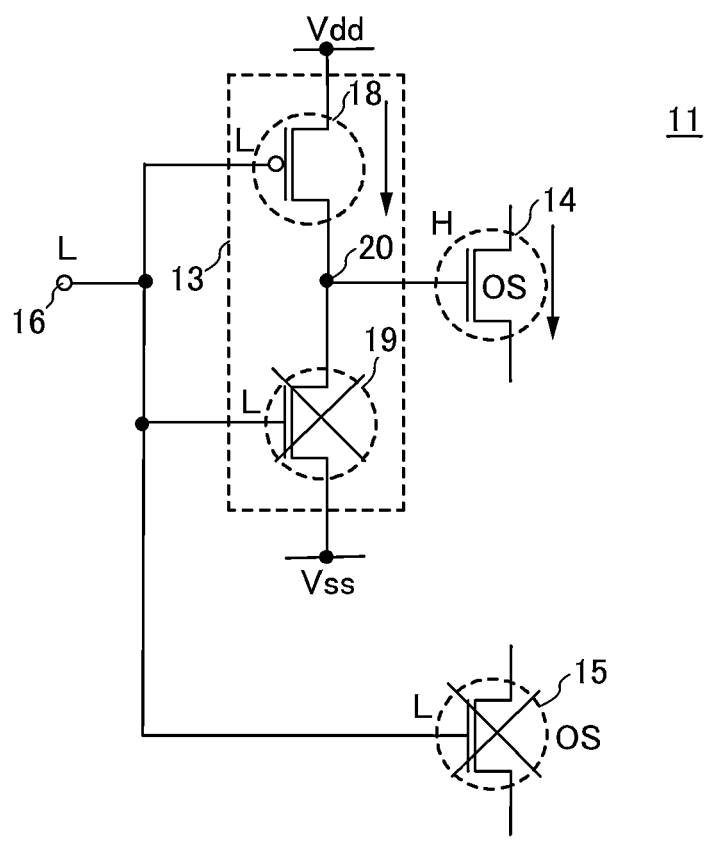

Alternatively, as shown in FIGS. 64A and 64B, an L voltage is input to the signal input portion 16 of the semiconductor device 11.

The L voltage is input to the gate of the p-channel Si transistor 18 in the inverter 13, so that the p-channel Si transistor 18 is turned on. Consequently, an H voltage such as Vdd is output to the signal output portion 20 of the inverter 13.

In that case, the n-channel Si transistor 19 in the inverter 13 is turned off because the L voltage is also input to the gate of the n-channel Si transistor 19.

Thus, the H voltage is input to the gate of the first OS transistor 14, so that the first OS transistor 14 is turned on.

On the other hand, the L voltage is also input to the gate of the second OS transistor 15, so that the second OS transistor 15 is turned off.

In this manner, the first OS transistor 14 is turned on and the second OS transistor 15 is turned off by inputting an L voltage to the signal input portion 16, and the first OS transistor 14 is turned off and the second OS transistor 15 is turned on by inputting an H voltage to the signal input portion 16. Thus, the first OS transistor 14 can be driven like a p-channel transistor, and the second OS transistor 15 can be driven like an n-channel transistor.

In each of the first OS transistor 14 and the second OS transistor 15, the mobility is high and the off-leakage current is much smaller than that in a semiconductor such as silicon. Therefore, the mobility of the semiconductor device 11 is high and the off-leakage current is small.

The semiconductor device 11 can function as an inverter or a buffer. An example of the case where the semiconductor device 11 functions as an inverter is described below. An example of the case where the semiconductor device 11 functions as a buffer is described in Embodiment 3.

Figure 4A:
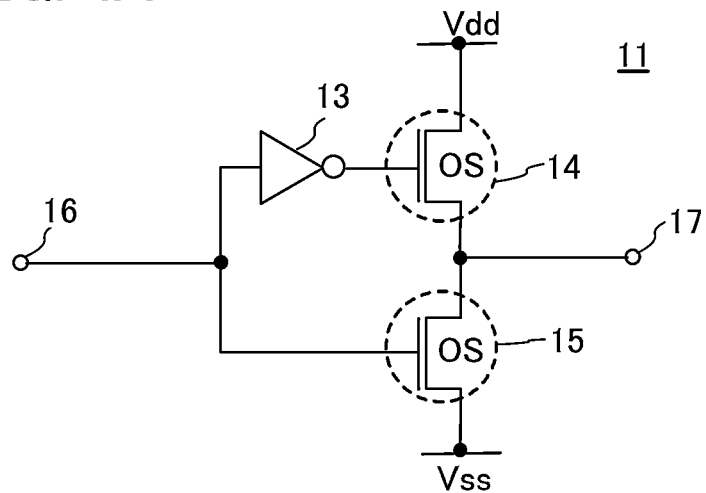
FIGS. 4A and 4B illustrate a semiconductor device in Embodiment 2.
Figure 4B:
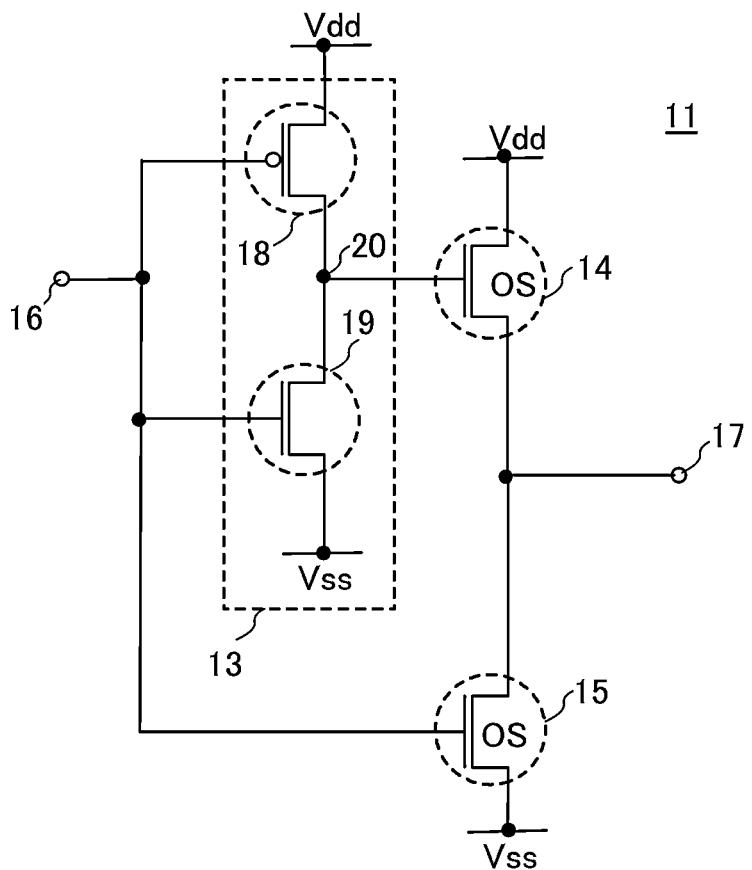

A semiconductor device 11 which functions as an inverter is shown in FIGS. 4A and 4B. The semiconductor device 11 includes a first transistor 14, a second transistor 15, and an inverter 13. Each of the first transistor 14 and the second transistor 15 is an OS transistor. The inverter 13 includes Si transistors.

Hereinafter, the first transistor 14 and the second transistor 15, which are OS transistors, are also referred to as a first OS transistor 14 and a second OS transistor 15, respectively.

A gate of the first OS transistor 14 is electrically connected to a signal output portion 20 of the inverter 13, one of a source and a drain of the first OS transistor 14 may be applied with Vdd, and the other of the source and the drain may be electrically connected to a signal output portion 17.

A gate of the second OS transistor 15 is electrically connected to a signal input portion 16, one of a source and a drain of the second OS transistor 15 may be applied with Vss, and the other of the source and the drain may be electrically connected to the other of the source and the drain of the first OS transistor 14 and the signal output portion 17.

The inverter 13 includes a p-channel Si transistor 18 and an n-channel Si transistor 19.

A gate of the p-channel Si transistor 18 is electrically connected to a signal input portion 16, one of a source and a drain of the p-channel Si transistor 18 is applied with Vdd, and the other of the source and the drain is electrically connected to a signal output portion 20. As for the voltage Vdd, Vdd applied to the one of the source and the drain of the p-channel Si transistor 18 is either equal to or different from Vdd applied to the one of the source and the drain of the first OS transistor 14.

A gate of the n-channel Si transistor 19 is electrically connected to the signal input portion 16, one of a source and a drain of the n-channel Si transistor 19 is applied with Vss, and the other of the source and the drain is electrically connected to the signal output portion 20. As for the voltage Vss, Vss applied to the one of the source and the drain of the n-channel Si transistor 19 is either equal to or different from Vss applied to the one of the source and the drain of the second OS transistor 15.

The semiconductor device 11 can function as an inverter. That is, an L voltage is output by inputting an H voltage to the semiconductor device 11, and an H voltage is output by inputting an L voltage to the semiconductor device 11. An operation of the semiconductor device 11 is described below, using FIGS. 5 and 6.

Figure 5:
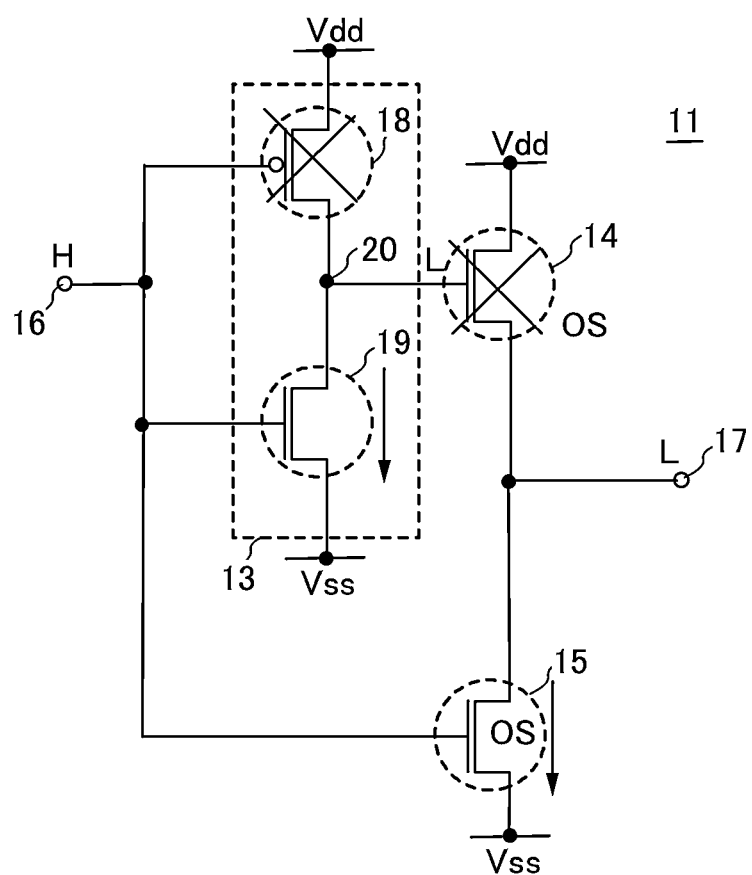
FIG. 5 illustrates an operation of the semiconductor device in Embodiment 2.

As shown in FIG. 5, an H voltage is input to the signal input portion 16 of the semiconductor device 11.

The H voltage is input to the gate of the p-channel Si transistor 18 in the inverter 13, so that the p-channel Si transistor 18 is turned off.

The H voltage is also input to the gate of the n-channel Si transistor 19 in the inverter 13, so that the n-channel Si transistor 19 is turned on. Consequently, an L voltage is output to the signal output portion 20 of the inverter 13.

Thus, the L voltage is input to the gate of the first OS transistor 14, so that the first OS transistor 14 is turned off.

On the other hand, the H voltage is also input to the gate of the second OS transistor 15, so that the second OS transistor 15 is turned on. Consequently, an L voltage such as Vss is output to the signal output portion 17.

Figure 6:
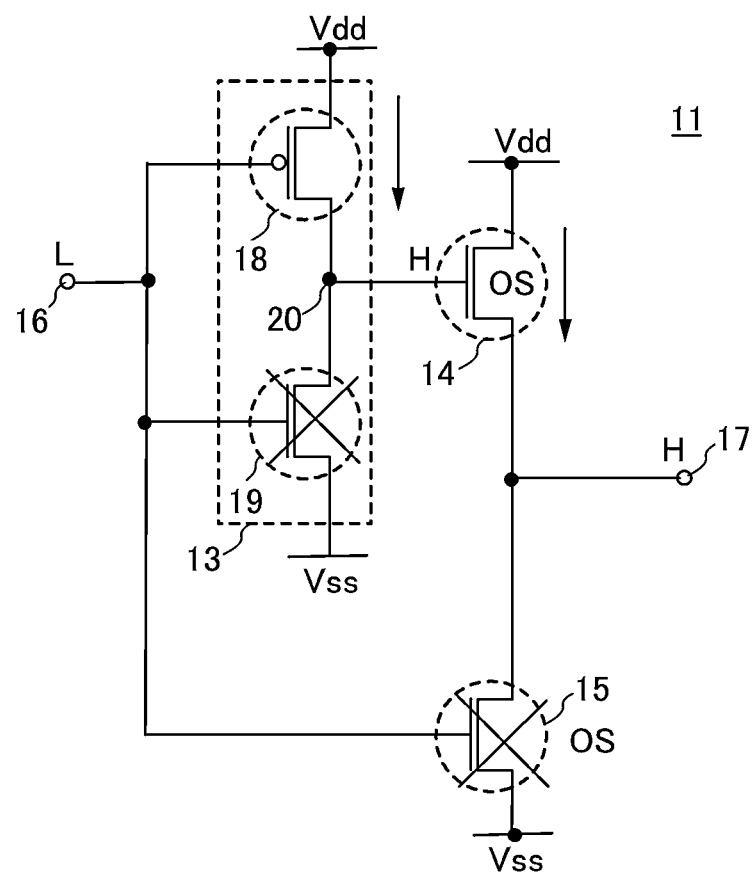
FIG. 6 illustrates an operation of the semiconductor device in Embodiment 2.

Alternatively, as shown in FIG. 6, an L voltage is input to the signal input portion 16 of the semiconductor device 11.

The L voltage is input to the gate of the p-channel Si transistor 18 in the inverter 13, so that the p-channel Si transistor 18 is turned on. Consequently, an H voltage is output to the signal output portion 20 of the inverter 13.

In that case, the n-channel Si transistor 19 in the inverter 13 is turned off because the L voltage is also input to the gate of the n-channel Si transistor 19.

Thus, the H voltage is input to the gate of the first OS transistor 14, so that the first OS transistor 14 is turned on. Consequently, an H voltage such as Vdd is output to the signal output portion 17.

On the other hand, the L voltage is also input to the gate of the second OS transistor 15, so that the second OS transistor 15 is turned off.

In this manner, an H voltage is output from the signal output portion 17 by inputting an L voltage to the signal input portion 16, and an L voltage is output from the signal output portion 17 by inputting an H voltage to the signal input portion 16. The semiconductor device 11 can thus function as an inverter.

Transistor included in a conventional inverter are Si transistors and the off-leakage current of the Si transistor is large. Likewise the off-leakage current of the inverter 13 is also large. Therefore, the potential of the signal output portion 20 leaks through the source and the drain of the p-channel Si transistor 18 and through the source and the drain of the n-channel Si transistor 19.

However, the off-leakage current of each of the first OS transistor 14 and the second OS transistor 15 is small because they are OS transistors. Therefore, the potential retention characteristics of the signal output portion 17 are better than those of the signal output portion 20. Accordingly, the retention characteristics of an output voltage are excellent in the semiconductor device of this embodiment.

The mobility of each of the first OS transistor 14 and the second OS transistor 15 can be further increased by crystallizing the oxide semiconductor in the channel region. Further, the off-leakage current of each of the first OS transistor 14 and the second OS transistor 15 can be further decreased by removing impurities such as hydrogen in the oxide semiconductor. Description of these is given later.

Embodiment 3

Described in this embodiment is a semiconductor device including a first transistor, a second transistor, and an inverter, in which an output of the inverter is input to a gate of the second transistor, an input to the inverter is also input to a gate of the first transistor, channel regions of the first transistor and the second transistor include respective oxide semiconductor films containing In, Zn, or Sn, and each channel region of transistors included in the inverter contains silicon.

Figure 7A:
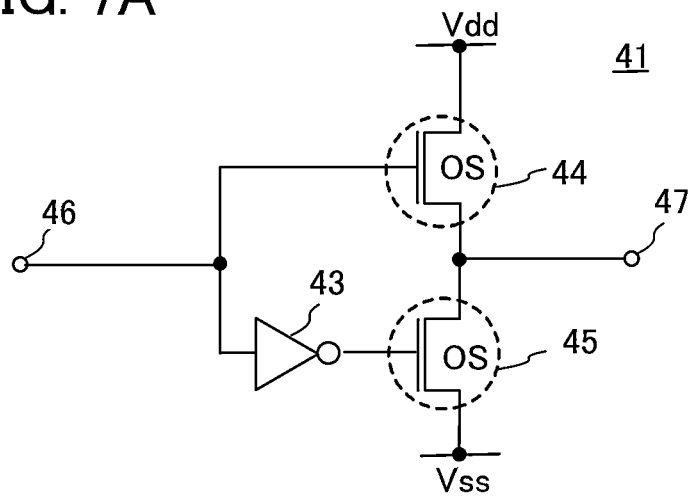
FIGS. 7A and 7B illustrate a semiconductor device in Embodiment 3.
Figure 7B:
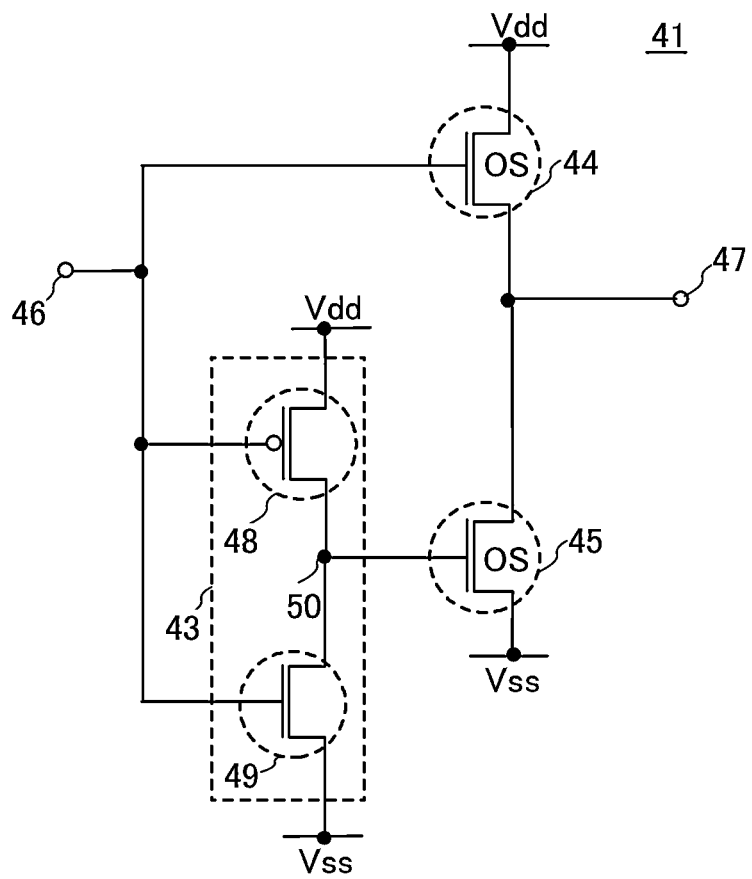

A semiconductor device 41 is shown in FIGS. 7A and 7B. The semiconductor device 41 is different from the semiconductor device 11 described in Embodiment 2 in that an output of an inverter 43 is electrically connected to a gate of a second OS transistor 45.

The semiconductor device 41 includes a first OS transistor 44, the second OS transistor 45, and the inverter 43. The inverter 43 includes Si transistors.

A gate of the first OS transistor 44 is electrically connected to a signal input portion 46, one of a source and a drain of the first OS transistor 44 is applied with Vdd, and the other of the source and the drain may be electrically connected to a signal output portion 47.

The gate of the second OS transistor 45 is electrically connected to a signal output portion 50 of the inverter 43, one of a source and a drain of the second OS transistor 45 is applied with Vss, and the other of the source and the drain may be electrically connected to the other of the source and the drain of the first OS transistor 44 and the signal output portion 47.

The inverter 43 includes a p-channel Si transistor 48 and an n-channel Si transistor 49.

A gate of the p-channel Si transistor 48 is electrically connected to the signal input portion 46, one of a source and a drain of the p-channel Si transistor 48 is applied with Vdd, and the other of the source and the drain is electrically connected to the signal output portion 50. As for the voltage Vdd, Vdd applied to the one of the source and the drain of the p-channel Si transistor 48 is either equal to or different from Vdd applied to the one of the source and the drain of the first OS transistor 44.

A gate of the n-channel Si transistor 49 is electrically connected to the signal input portion 46, one of a source and a drain of the n-channel Si transistor 49 is applied with Vss, and the other of the source and the drain is electrically connected to the signal output portion 50. As for the voltage Vss, Vss applied to the one of the source and the drain of the n-channel Si transistor 49 is either equal to or different from Vss applied to the one of the source and the drain of the second OS transistor 45.

The semiconductor device 41 functions as a buffer. That is, an H voltage is output by inputting an H voltage to the semiconductor device 41, and an L voltage is output by inputting an L voltage to the semiconductor device 41. An operation of the semiconductor device 41 is described below, using FIGS. 8 and 9.

Figure 8:
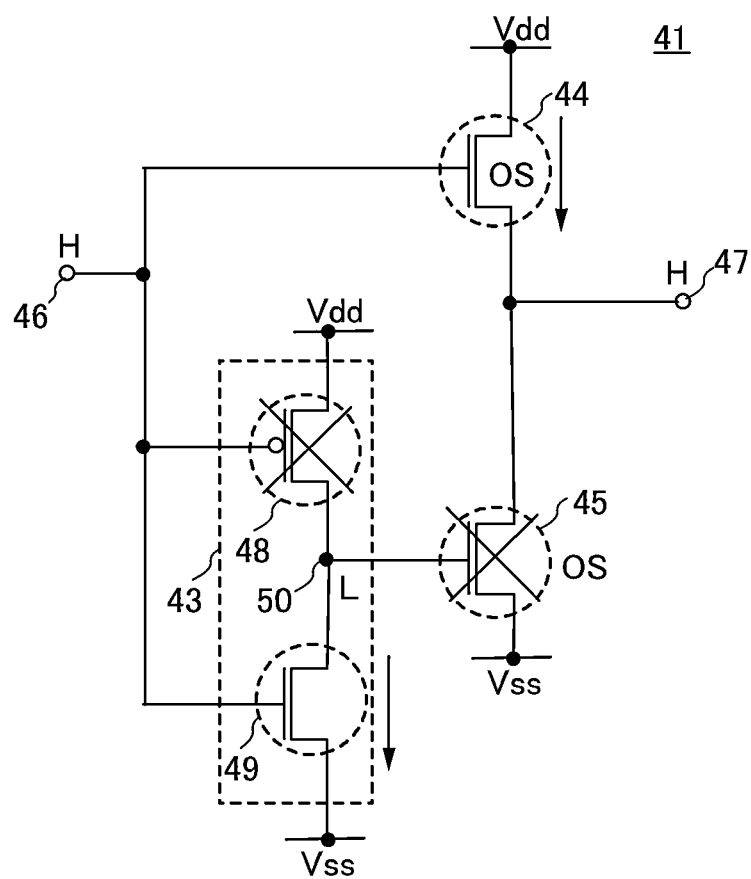
FIG. 8 illustrates an operation of the semiconductor device in Embodiment 3.

As shown in FIG. 8, an H voltage is input to the signal input portion 46 of the semiconductor device 41.

The H voltage is input to the gate of the p-channel Si transistor 48 in the inverter 43, so that the p-channel Si transistor 48 is turned off.

The H voltage is also input to the gate of the n-channel Si transistor 49 in the inverter 43, so that the n-channel Si transistor 49 is turned on. Consequently, an L voltage is output to the signal output portion 50 of the inverter 43.

Thus, the L voltage is input to the gate of the second OS transistor 45, so that the second OS transistor 45 is turned off.

On the other hand, the H voltage is also input to the gate of the first OS transistor 44, so that the first OS transistor 44 is turned on. Consequently, an H voltage is output to the signal output portion 47.

Figure 9:
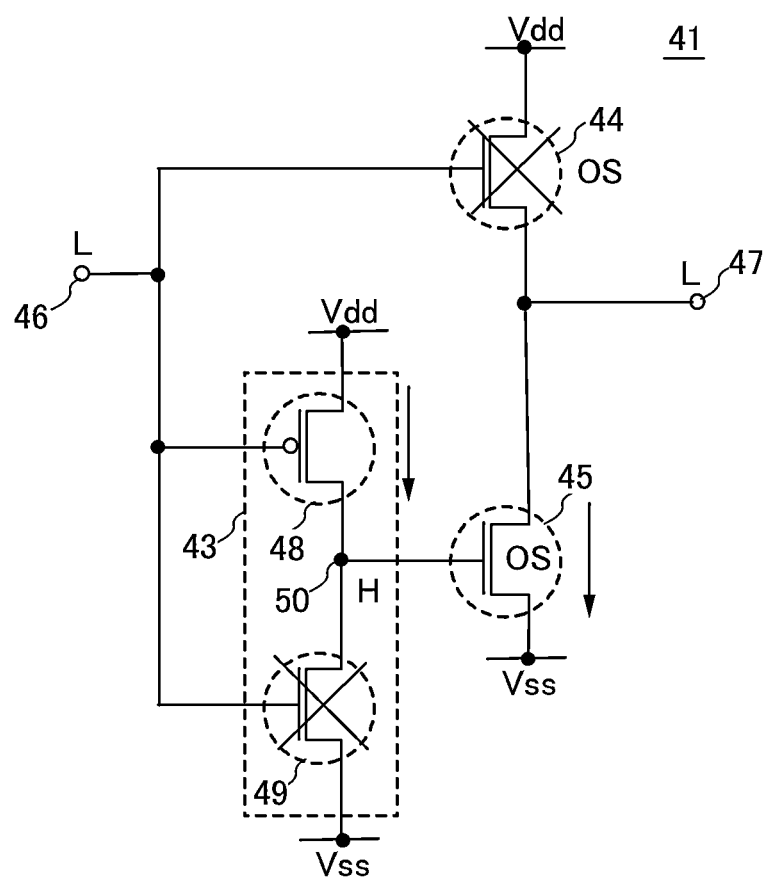
FIG. 9 illustrates an operation of the semiconductor device in Embodiment 3.

Alternatively, as shown in FIG. 9, an L voltage is input to the signal input portion 46 of the semiconductor device 41.

The L voltage is input to the gate of the p-channel Si transistor 48 in the inverter 43, so that the p-channel Si transistor 48 is turned on. Consequently, an H voltage is output to the signal output portion 50 of the inverter 43.

In that case, the n-channel Si transistor 49 in the inverter 43 is turned off because the L voltage is also input to the gate of the n-channel Si transistor 49.

Thus, the H voltage is input to the gate of the second OS transistor 45, so that the second OS transistor 45 is turned on. Consequently, an L voltage is output to the signal output portion 47.

On the other hand, the L voltage is also input to the gate of the first OS transistor 44, so that the first OS transistor 44 is turned off.

In this manner, an L voltage is output from the signal output portion 47 by inputting an L voltage to the signal input portion 46, and an H voltage is output from the signal output portion 47 by inputting an H voltage to the signal input portion 46. The semiconductor device 41 thus functions as a buffer.

Transistors included in a conventional inverter are Si transistors and the off-leakage current of the Si transistor is large. Likewise the off-leakage current of the inverter 43 is also large. Therefore, the potential of the signal output portion 50 leaks through the source and the drain of the p-channel Si transistor 48 and through the source and the drain of the n-channel Si transistor 49.

However, the off-leakage current of each of the first OS transistor 44 and the second OS transistor 45 is small because they are OS transistors. Therefore, the potential retention characteristics of the signal output portion 47 are better than those of the signal output portion 50. Accordingly, the retention characteristics of an output voltage are excellent in the semiconductor device of this embodiment.

The mobility of each of the first OS transistor 44 and the second OS transistor 45 can be further increased by crystallizing the oxide semiconductor in the channel region. Further, the off-leakage current of each of the first OS transistor 44 and the second OS transistor 45 can be further decreased by removing impurities such as hydrogen in the oxide semiconductor. Description of these is given later.

Embodiment 4

Described in this embodiment is a semiconductor device in which an inverter is provided before the signal input portion 16 of the semiconductor device 11 described in Embodiment 2. With the inverter provided, the semiconductor device can function as a buffer or an inverter.

Described in Embodiment 4 is a semiconductor device including a first transistor, a second transistor, a first inverter, and a second inverter, in which an output of the first inverter is input to a gate of the first transistor, an output of the second inverter is input not only to the first inverter but also to a gate of the second transistor, channel regions of the first transistor and the second transistor include respective oxide semiconductor films containing In, Zn, or Sn, and respective channel regions of transistors included in the first inverter and the second inverter contain silicon. The semiconductor device functions as a buffer.

Also described in Embodiment 4 is a semiconductor device including a first transistor, a second transistor, a first inverter, a second inverter, and a third inverter, in which an output of the first inverter is input to a gate of the first transistor, an output of the second inverter is input not only to the first inverter but also to a gate of the second transistor, an output of the third inverter is input to the second inverter, channel regions of the first transistor and the second transistor include respective oxide semiconductor films containing In, Zn, or Sn, and respective channel regions of transistors included in the first inverter, the second inverter, and the third inverter contain silicon. The semiconductor device functions as an inverter.

Figure 10:
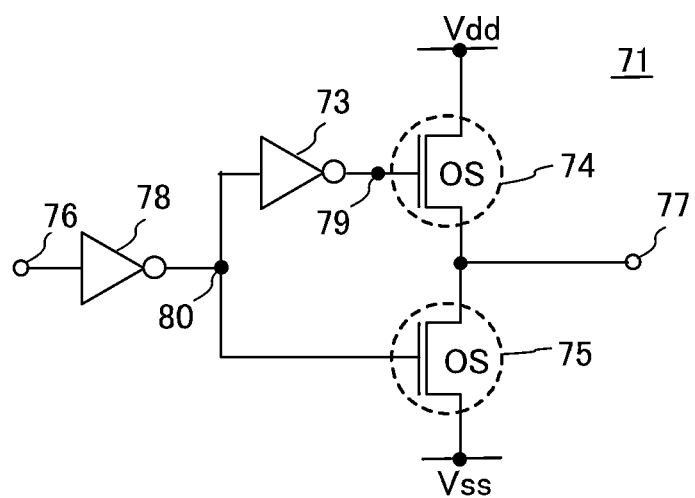
FIG. 10 illustrates a semiconductor device in Embodiment 4.

A semiconductor device 71 which functions as a buffer is shown in FIG. 10. The semiconductor device 71 includes a first OS transistor 74, a second OS transistor 75, a first inverter 73, and a second inverter 78. The first inverter 73 and the second inverter 78 include Si transistors.

A gate of the first OS transistor 74 is electrically connected to a signal output portion 79 of the first inverter 73, one of a source and a drain of the first OS transistor 74 is applied with Vdd, and the other of the source and the drain is electrically connected to a signal output portion 77.

A gate of the second OS transistor 75 is electrically connected to a signal input portion 80, one of a source and a drain of the second OS transistor 75 is applied with Vss, and the other of the source and the drain is electrically connected to the signal output portion 77.

As is in Embodiments 1 to 3, each of the first inverter 73 and the second inverter 78 includes a p-channel Si transistor and an n-channel Si transistor, though not shown. The p-channel Si transistors and the n-channel Si transistors are connected in a manner similar to any of Embodiments 1 to 3.

The semiconductor device 71 functions as a buffer. That is, an H voltage is output by inputting an H voltage to the semiconductor device 71, and an L voltage is output by inputting an L voltage to the semiconductor device 71. An operation of the semiconductor device 71 is described below, using FIGS. 11A and 11B.

Figure 11A:
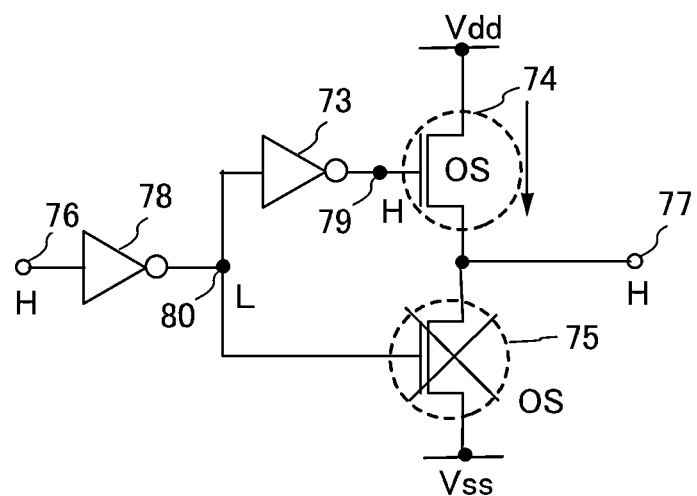
FIGS. 11A and 11B illustrate operations of the semiconductor device in Embodiment 4.

As shown in FIG. 11A, an H voltage is input to a signal input portion 76, so that an L voltage is output from the second inverter 78.

The L voltage is input to the first inverter 73 through the signal input portion 80, so that an H voltage is output. The H voltage is input to the gate of the first OS transistor 74, so that the first OS transistor 74 is turned on. Consequently, an H voltage is output to the signal output portion 77.

On the other hand, the L voltage is also input to the gate of the second OS transistor 75, so that the second OS transistor 75 is turned off.

Figure 11B:
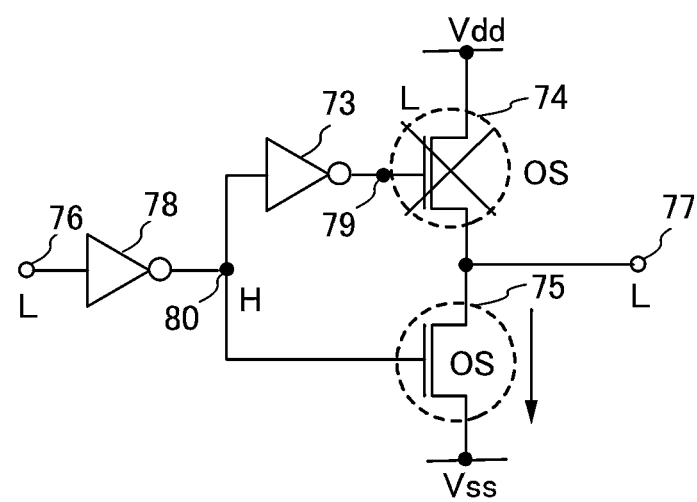

Alternatively, as shown in FIG. 11B, an L voltage is input to the signal input portion 76, so that an H voltage is output from the second inverter 78.

The H voltage is input to the first inverter 73 through the signal input portion 80, so that an L voltage is output. The L voltage is input to the gate of the first OS transistor 74, so that the first OS transistor 74 is turned off.

On the other hand, the H voltage is also input to the gate of the second OS transistor 75, so that the second OS transistor 75 is turned on. Consequently, an L voltage is output to the signal output portion 77.

In this manner, an H voltage is output from the signal output portion 77 by inputting an H voltage to the signal input portion 76, and an L voltage is output from the signal output portion 77 by inputting an L voltage to the signal input portion 76. The semiconductor device 71 thus functions as a buffer.

Figure 12:
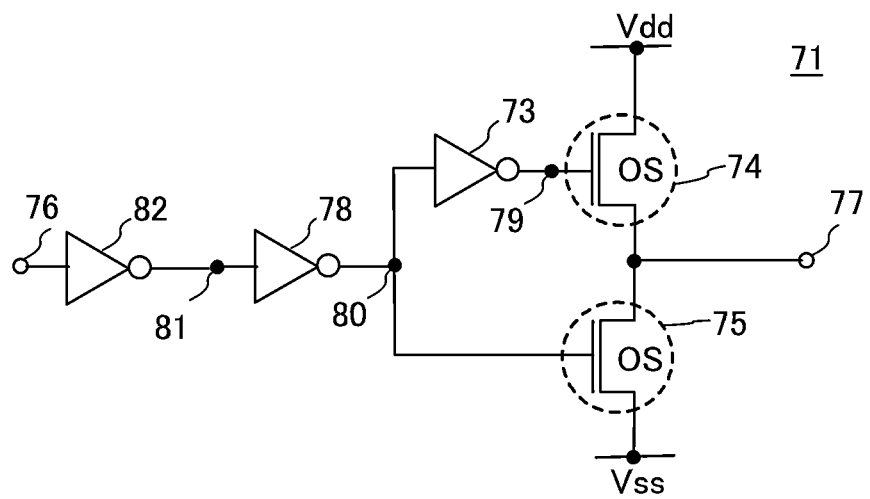
FIG. 12 illustrates a semiconductor device in Embodiment 4.

Next, a semiconductor device 71 which functions as an inverter is shown in FIG. 12. The semiconductor device 71 includes a first OS transistor 74, a second OS transistor 75, a first inverter 73, a second inverter 78, and a third inverter 82. The first inverter 73, the second inverter 78, and the third inverter 82 include Si transistors. In the semiconductor device 71 shown in FIG. 12, the third inverter 82 is added to the semiconductor device 71 shown in FIG. 10.

The structure and connection of the third inverter 82 are similar to those of any of the first inverter 73 and the second inverter 78.

The semiconductor device 71 functions as an inverter. That is, an L voltage is output by inputting an H voltage to the semiconductor device 71, and an H voltage is output by inputting an L voltage to the semiconductor device 71. An operation of the semiconductor device 71 is described below, using FIGS. 13A and 13B.

Figure 13A:
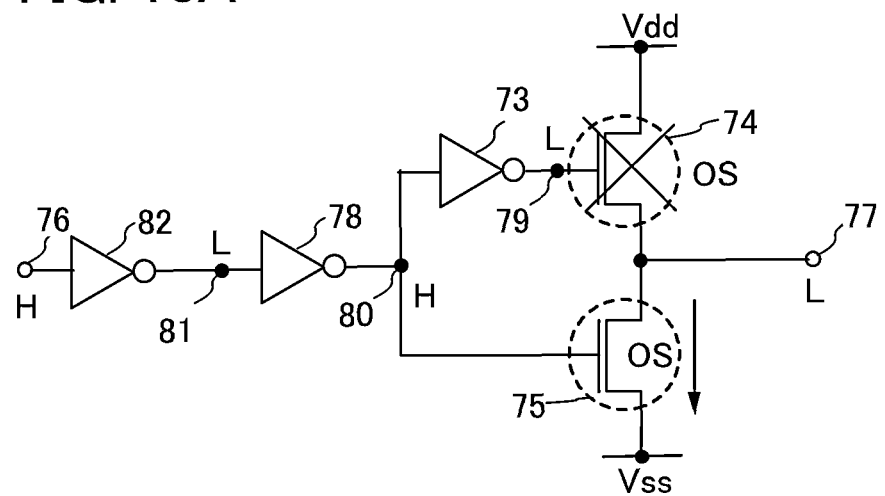
FIGS. 13A and 13B illustrate operations of the semiconductor device in Embodiment 4.

As shown in FIG. 13A, an H voltage is input to a signal input portion 76, so that an L voltage is output from the third inverter 82.

The L voltage is input to the second inverter 78 through a signal input portion 81, so that an H voltage is output.

The H voltage is input to the first inverter 73 through a signal input portion 80, so that an L voltage is output. The L voltage is input to a gate of the first OS transistor 74, so that the first OS transistor 74 is turned off.

On the other hand, the H voltage is also input to a gate of the second OS transistor 75, so that the second OS transistor 75 is turned on. Consequently, an L voltage is output to a signal output portion 77.

Figure 13B:
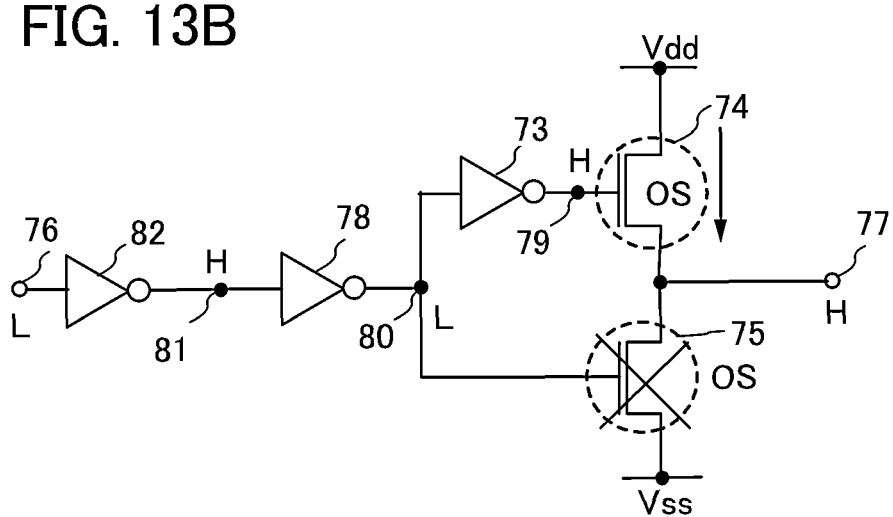

Alternatively, as shown in FIG. 13B, an L voltage is input to the signal input portion 76, so that an H voltage is output from the third inverter 82.

The H voltage is input to the second inverter 78 through the signal input portion 81, so that an L voltage is output from the second inverter 78.

The L voltage is input to the first inverter 73 through the signal input portion 80, so that an H voltage is output. The H voltage is input to the gate of the first OS transistor 74, so that the first OS transistor 74 is turned on. Consequently, an H voltage is output to the signal output portion 77.

On the other hand, the L voltage is also input to the gate of the second OS transistor 75, so that the second OS transistor 75 is turned off.

In this manner, an L voltage is output from the signal output portion 77 by inputting an H voltage to the signal input portion 76, and an H voltage is output from the signal output portion 77 by inputting an L voltage to the signal input portion 76. The semiconductor device 71 thus functions as an inverter.

Embodiment 5

Described in this embodiment is a semiconductor device in which an inverter is provided before the signal input portion 46 of the semiconductor device 41 described in Embodiment 3. With the inverter provided, the semiconductor device can function as a buffer or an inverter.

Described in Embodiment 5 is a semiconductor device including a first transistor, a second transistor, a first inverter, and a second inverter, in which an output of the first inverter is input to a gate of the second transistor, an output of the second inverter is input not only to the first inverter but also to a gate of the first transistor, channel regions of the first transistor and the second transistor include respective oxide semiconductor films containing In, Zn, or Sn, and respective channel regions of transistors included in the first inverter and the second inverter contain silicon. The semiconductor device functions as an inverter.

Also described in Embodiment 5 is a semiconductor device including a first transistor, a second transistor, a first inverter, a second inverter, and a third inverter, in which an output of the first inverter is input to a gate of the second transistor, an output of the second inverter is input not only to the first inverter but also to a gate of the first transistor, an output of the third inverter is input to the second inverter, channel regions of the first transistor and the second transistor include respective oxide semiconductor films containing In, Zn, or Sn, and respective channel regions of transistors included in the first inverter, the second inverter, and the third inverter contain silicon. The semiconductor device functions as a buffer.

Figure 14:
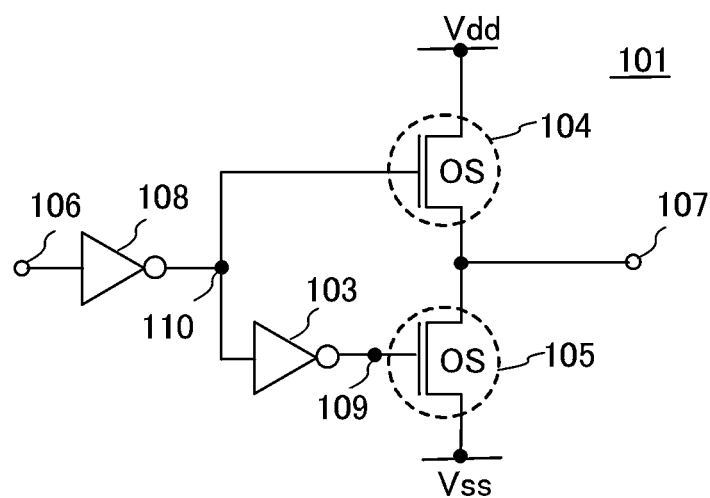
FIG. 14 illustrates a semiconductor device in Embodiment 5.

A semiconductor device 101 which functions as an inverter is shown in FIG. 14. The semiconductor device 101 includes a first OS transistor 104, a second OS transistor 105, a first inverter 103, and a second inverter 108. The first inverter 103 and the second inverter 108 include Si transistors.

The connection of the first OS transistor 104 and the second OS transistor 105, and the structures and connection of the first inverter 103 and the second inverter 108 are similar to those described in the above embodiment.

The semiconductor device 101 functions as an inverter. That is, an L voltage is output by inputting an H voltage to the semiconductor device 101, and an H voltage is output by inputting an L voltage to the semiconductor device 101. An operation of the semiconductor device 101 is described below, using FIGS. 15A and 15B.

Figure 15A:
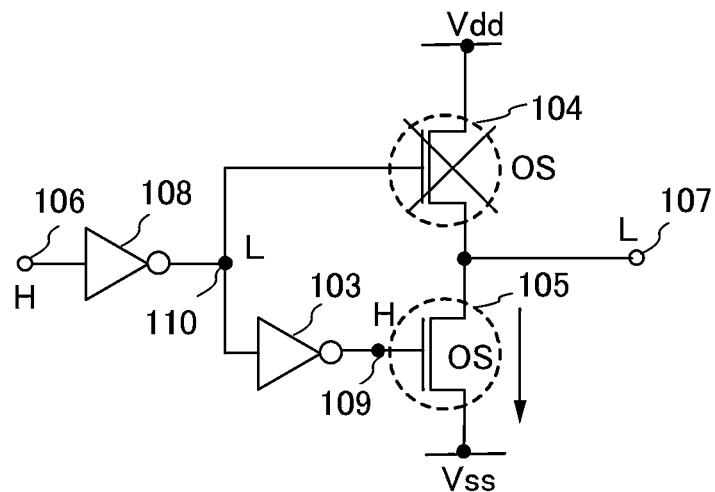
FIGS. 15A and 15B illustrate operations of the semiconductor device in Embodiment 5.

As shown in FIG. 15A, an H voltage is input to a signal input portion 106, so that an L voltage is output from the second inverter 108.

The L voltage is input to the first inverter 103 through a signal input portion 110, so that an H voltage is output. The H voltage is input to a gate of the second OS transistor 105, so that the second OS transistor 105 is turned on. Consequently, an L voltage is output to a signal output portion 107.

On the other hand, the L voltage is also input to a gate of the first OS transistor 104, so that the first OS transistor 104 is turned off.

Figure 15B:
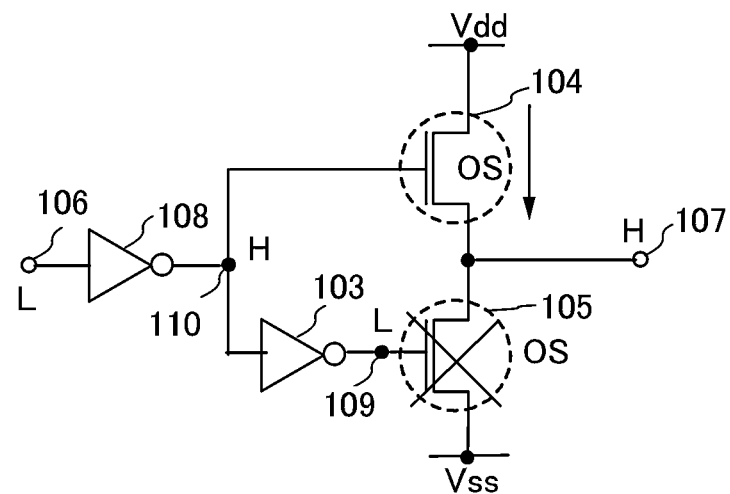

Alternatively, as shown in FIG. 15B, an L voltage is input to the signal input portion 106, so that an H voltage is output from the second inverter 108.

The H voltage is input to the first inverter 103 through the signal input portion 110, so that an L voltage is output. The L voltage is input to the gate of the second OS transistor 105, so that the second OS transistor 105 is turned off.

On the other hand, the H voltage is also input to the gate of the first OS transistor 104, so that the first OS transistor 104 is turned on. Consequently, an H voltage is output to the signal output portion 107.

In this manner, an L voltage is output from the signal output portion 107 by inputting an H voltage to the signal input portion 106, and an H voltage is output from the signal output portion 107 by inputting an L voltage to the signal input portion 106. The semiconductor device 101 thus functions as an inverter.

Figure 16:
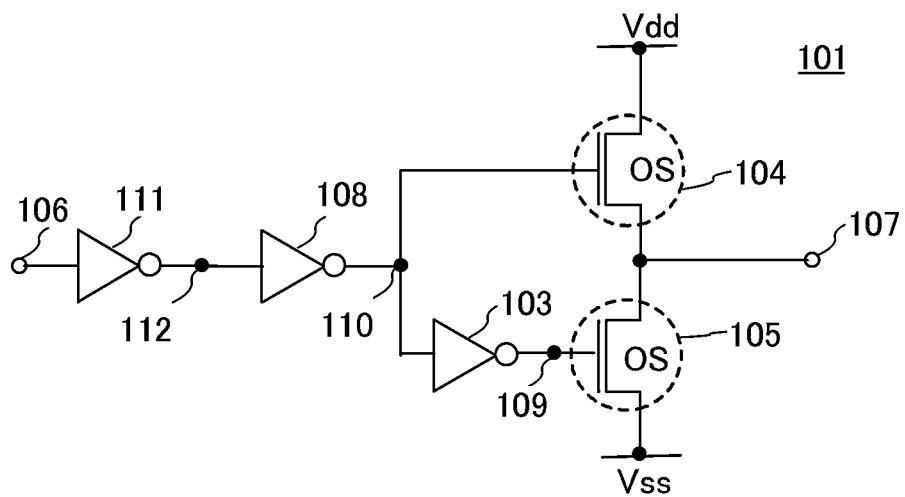
FIG. 16 illustrates a semiconductor device in Embodiment 5.

Next, a semiconductor device 101 which functions as a buffer is shown in FIG. 16. The semiconductor device 101 includes a first OS transistor 104, a second OS transistor 105, a first inverter 103, a second inverter 108, and a third inverter 111. The first inverter 103, the second inverter 108, and the third inverter 111 include Si transistors. In the semiconductor device 101 shown in FIG. 16, the third inverter 111 is added to the semiconductor device 101 shown in FIG. 14.

The structure and connection of the third inverter 111 are similar to those of any of the first inverter 103 and the second inverter 108.

The semiconductor device 101 functions as a buffer. That is, an H voltage is output by inputting an H voltage to the semiconductor device 101, and an L voltage is output by inputting an L voltage to the semiconductor device 101. An operation of the semiconductor device 101 is described below, using FIGS. 17A and 17B.

Figure 17A:
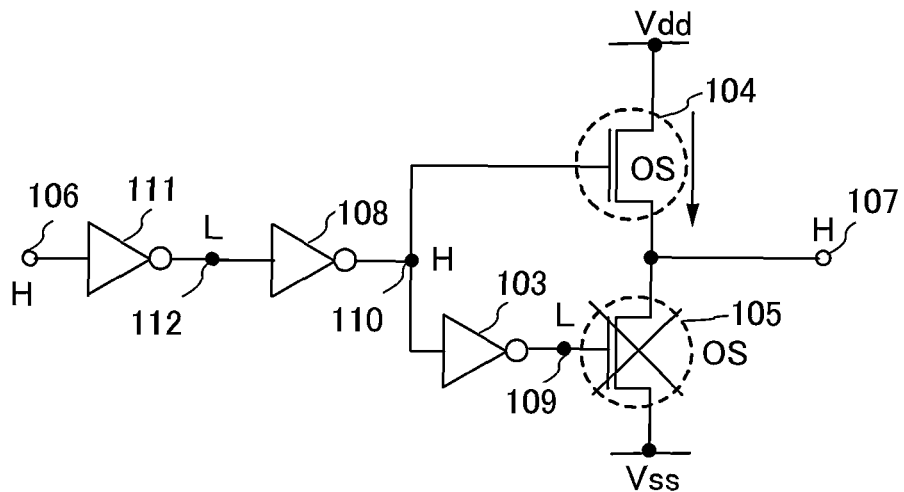
FIGS. 17A and 17B illustrate operations of the semiconductor device in Embodiment 5.

As shown in FIG. 17A, an H voltage is input to a signal input portion 106, so that an L voltage is output from the third inverter 111.

The L voltage is input to the second inverter 108 through a signal input portion 112, so that an H voltage is output.

The H voltage is input to the first inverter 103 through a signal input portion 110, so that an L voltage is output. The L voltage is input to a gate of the second OS transistor 105, so that the second OS transistor 105 is turned off.

On the other hand, the H voltage is also input to a gate of the first OS transistor 104, so that the first OS transistor 104 is turned on. Consequently, an H voltage is output to a signal output portion 107.

Figure 17B:
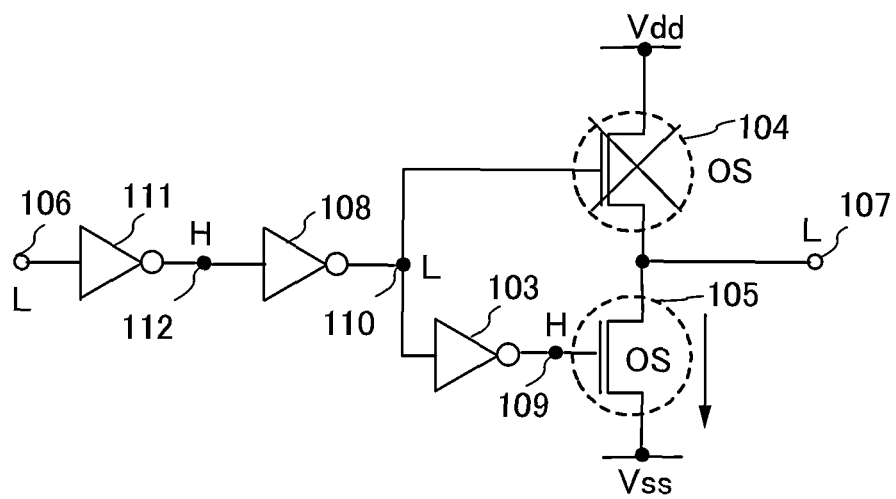

Alternatively, as shown in FIG. 17B, an L voltage is input to the signal input portion 106, so that an H voltage is output from the third inverter 111.

The H voltage is input to the second inverter 108 through the signal input portion 112, so that an L voltage is output from the second inverter 108.

The L voltage is input to the first inverter 103 through the signal input portion 110, so that an H voltage is output. The H voltage is input to the gate of the second OS transistor 105, so that the second OS transistor 105 is turned on. Consequently, an L voltage is output to the signal output portion 107.

On the other hand, the L voltage is also input to the gate of the first OS transistor 104, so that the first OS transistor 104 is turned off.

In this manner, an H voltage is output from the signal output portion 107 by inputting an H voltage to the signal input portion 106, and an L voltage is output from the signal output portion 107 by inputting an L voltage to the signal input portion 106. The semiconductor device 101 thus functions as a buffer.

Embodiment 6

Described in this embodiment is a semiconductor device in which a NAND gate is provided before the signal input portion 16 of the semiconductor device 11 described in Embodiment 2. With the NAND gate provided, the semiconductor device can function as an AND gate or a NAND gate.

Described in Embodiment 6 is a semiconductor device including a first transistor, a second transistor, an inverter, and a NAND gate, in which an output of the inverter is input to a gate of the first transistor, an output of the NAND gate is input not only to the inverter but also to a gate of the second transistor, channel regions of the first transistor and the second transistor include respective oxide semiconductor films containing In, Zn, or Sn, and respective channel regions of transistors included in the inverter and the NAND gate contain silicon. The semiconductor device functions as an AND gate.

Also described in Embodiment 6 is a semiconductor device including a first transistor, a second transistor, a first inverter, a second inverter, and a NAND gate, in which an output of the first inverter is input to a gate of the first transistor, an output of the second inverter is input not only to the first inverter but also to a gate of the second transistor, an output of the NAND gate is input to the second inverter, channel regions of the first transistor and the second transistor include respective oxide semiconductor films containing In, Zn, or Sn, and respective channel regions of transistors included in the first inverter, the second inverter, and the NAND gate contain silicon. The semiconductor device functions as a NAND gate.

Figure 18A:
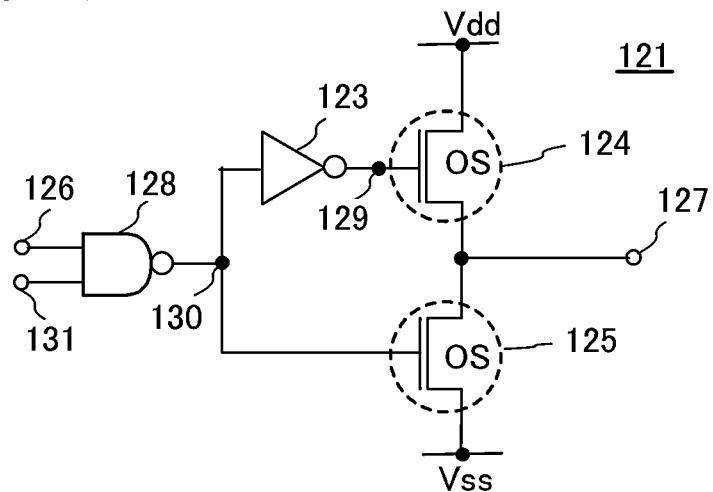
FIGS. 18A and 18B illustrate a semiconductor device in Embodiment 6.

A semiconductor device 121 which functions as an AND gate is shown in FIG. 18A. The semiconductor device 121 includes a first OS transistor 124, a second OS transistor 125, an inverter 123, and a NAND gate 128. The inverter 123 and the NAND gate 128 include Si transistors.

The connection of the first OS transistor 124 and the second OS transistor 125, and the structure and connection of the inverter 123 are similar to those described in Embodiment 2.

Figure 18B:
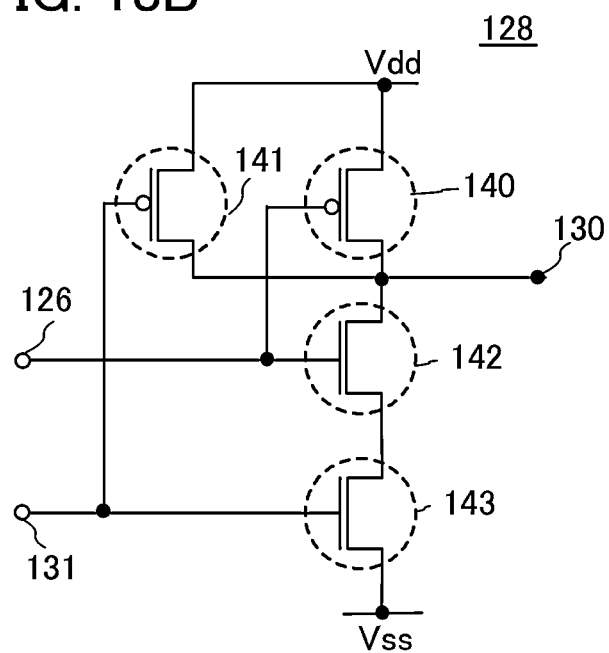

A known structure can be applied to the NAND gate 128. An example of the NAND gate 128 is shown in FIG. 18B, in which the NAND gate 128 includes p-channel Si transistors 140 and 141 and n-channel transistors 142 and 143.

The semiconductor device 121 functions as an AND gate. That is, an H voltage is output by inputting an H voltage to both of signal input portions 126 and 131, and an L voltage is output in other cases. An operation of the semiconductor device 121 is described below, using FIGS. 19A and 19B.

Figure 19A:
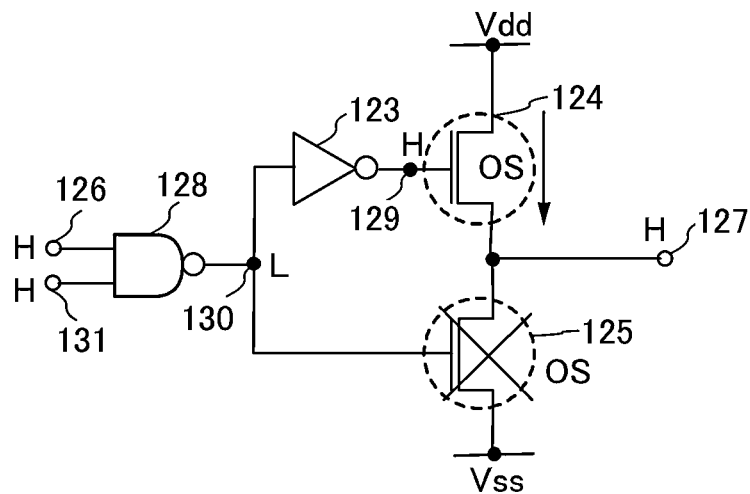
FIGS. 19A and 19B illustrate operations of the semiconductor device in Embodiment 6.

As shown in FIG. 19A, an H voltage is input to the signal input portion 126 and an H voltage is input to the signal input portion 131, so that an L voltage is output from the NAND gate 128.

The L voltage is input to the inverter 123 through a signal input portion 130, so that an H voltage is output. The H voltage is input to a gate of the first OS transistor 124, so that the first OS transistor 124 is turned on. Consequently, an H voltage is output to a signal output portion 127.

On the other hand, the L voltage is also input to a gate of the second OS transistor 125, so that the second OS transistor 125 is turned off.

Figure 19B:
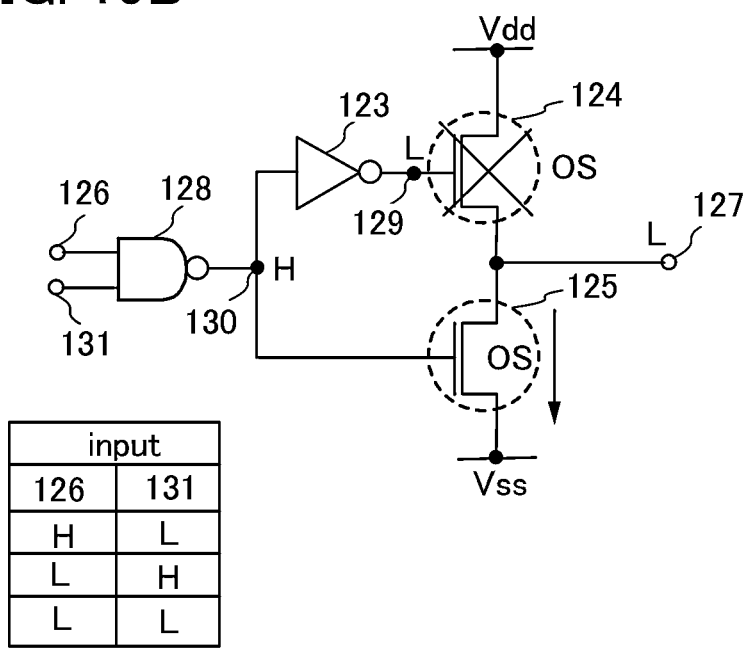

Alternatively, as shown in FIG. 19B, voltages are input to the signal input portions 126 and 131, so that an H voltage is output from the NAND gate 128.

The H voltage is input to the inverter 123 through the signal input portion 130, so that an L voltage is output. The L voltage is input to the gate of the first OS transistor 124, so that the first OS transistor 124 is turned off.

On the other hand, the H voltage is also input to the gate of the second OS transistor 125, so that the second OS transistor 125 is turned on. Consequently, an L voltage is output to the signal output portion 127.

In this manner, an H voltage is output by inputting an H voltage to both of the signal input portions 126 and 131, and an L voltage is output in other cases. The semiconductor device 121 thus functions as an AND gate.

Figure 20:
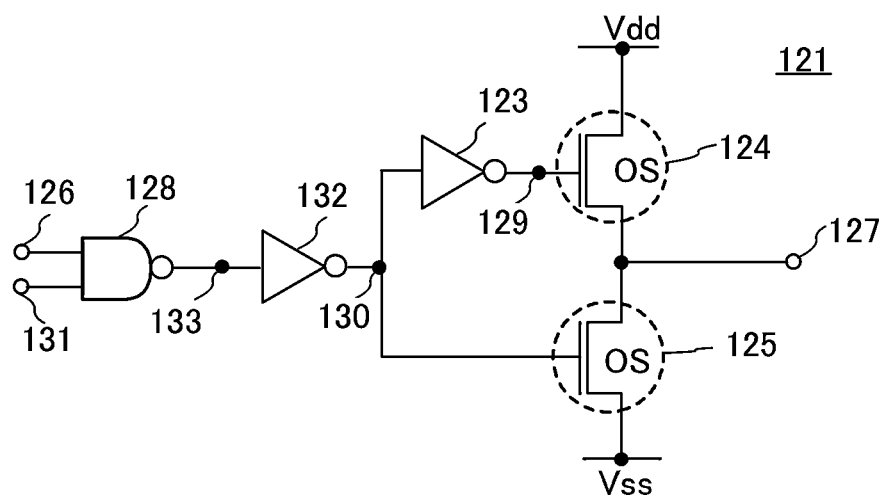
FIG. 20 illustrates a semiconductor device in Embodiment 6.

Next, a semiconductor device 121 which functions as a NAND gate is shown in FIG. 20. The semiconductor device 121 includes a first OS transistor 124, a second OS transistor 125, a first inverter 123, a second inverter 132, and a NAND gate 128. The first inverter 123, the second inverter 132, and the NAND gate 128 include Si transistors. In the semiconductor device 121 shown in FIG. 20, the second inverter 132 is added to the semiconductor device 121 shown in FIGS. 18A and 18B.

The semiconductor device 121 functions as a NAND gate. That is, an L voltage is output by inputting an H voltage to both of signal input portions 126 and 131, and an H voltage is output in other cases. An operation of the semiconductor device 121 is described below, using FIGS. 21A and 21B.

Figure 21A:
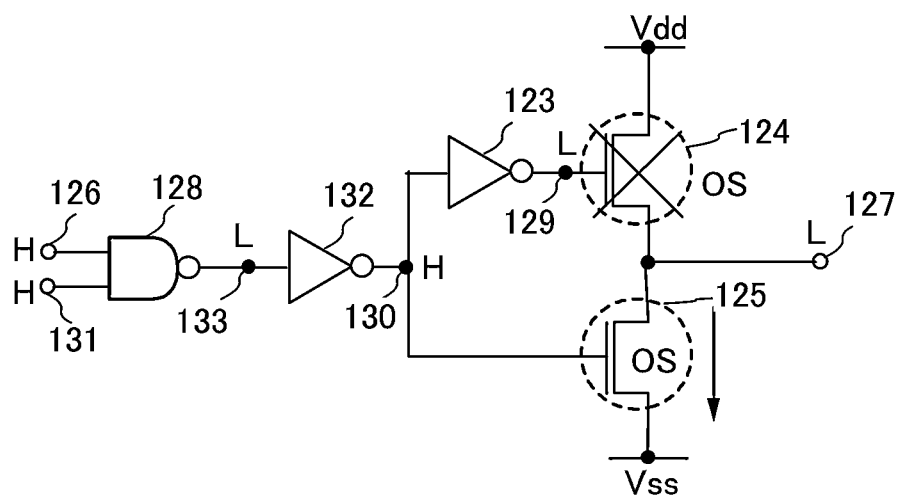
FIGS. 21A and 21B illustrate operations of the semiconductor device in Embodiment 6.

As shown in FIG. 21A, an H voltage is input to the signal input portion 126 and an H voltage is input to the signal input portion 131, so that an L voltage is output from the NAND gate 128.

The L voltage is input to the second inverter 132 through a signal input portion 133, so that an H voltage is output.

The H voltage is input to the first inverter 123 through a signal input portion 130, so that an L voltage is output. The L voltage is input to a gate of the first OS transistor 124, so that the first OS transistor 124 is turned off.

On the other hand, the H voltage is also input to a gate of the second OS transistor 125, so that the second OS transistor 125 is turned on. Consequently, an L voltage is output to a signal output portion 127.

Figure 21B:
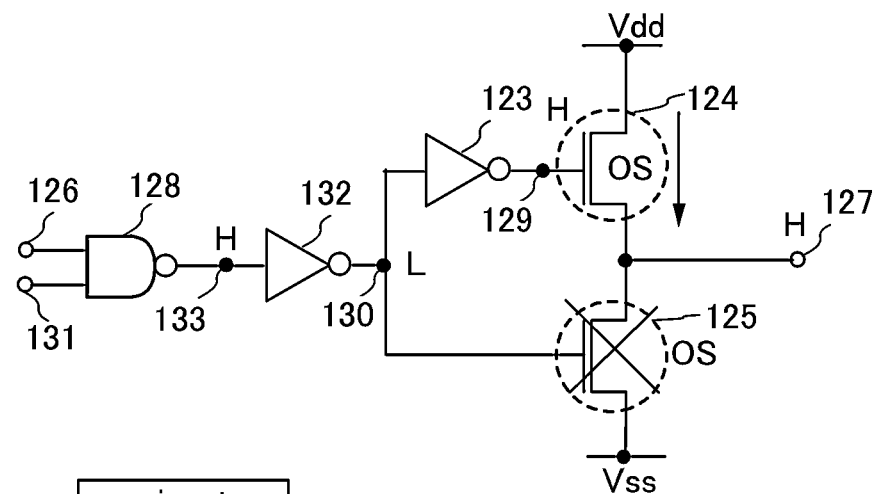

Alternatively, as shown in FIG. 21B, voltages are input to the signal input portions 126 and 131, so that an H voltage is output from the NAND gate 128.

The H voltage is input to the second inverter 132 through the signal input portion 133, so that an L voltage is output.

The L voltage is input to the first inverter 123 through the signal input portion 130, so that an H voltage is output. The H voltage is input to the gate of the first OS transistor 124, so that the first OS transistor 124 is turned on. Consequently, an H voltage is output to the signal output portion 127.

On the other hand, the L voltage is also input to the gate of the second OS transistor 125, so that the second OS transistor 125 is turned off.

In this manner, an L voltage is output by inputting an H voltage to both of the signal input portions 126 and 131, and an H voltage is output in other cases. The semiconductor device 121 thus functions as a NAND gate.

Embodiment 7

Described in this embodiment is a semiconductor device in which a NAND gate is provided before the signal input portion 46 of the semiconductor device 41 described in Embodiment 3. With the NAND gate provided, the semiconductor device can function as a NAND gate or an AND gate.

Described in Embodiment 7 is a semiconductor device including a first transistor, a second transistor, an inverter, and a NAND gate, in which an output of the inverter is input to a gate of the second transistor, an output of the NAND gate is input not only to the inverter but also to a gate of the first transistor, channel regions of the first transistor and the second transistor include respective oxide semiconductor films containing In, Zn, or Sn, and respective channel regions of transistors included in the inverter and the NAND gate contain silicon. The semiconductor device functions as a NAND gate.

Also described in Embodiment 7 is a semiconductor device including a first transistor, a second transistor, a first inverter, a second inverter, and a NAND gate, in which an output of the first inverter is input to a gate of the second transistor, an output of the second inverter is input not only to the first inverter but also to a gate of the first transistor, an output of the NAND gate is input to the second inverter, channel regions of the first transistor and the second transistor include respective oxide semiconductor films containing In, Zn, or Sn, and respective channel regions of transistors included in the first inverter, the second inverter, and the NAND gate contain silicon. The semiconductor device functions as an AND gate.

Figure 22:
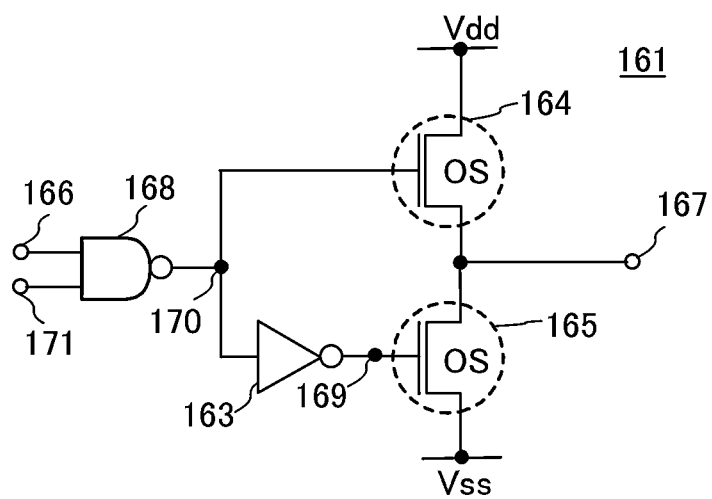
FIG. 22 illustrates a semiconductor device in Embodiment 7.

A semiconductor device 161 which functions as a NAND gate is shown in FIG. 22. The semiconductor device 161 includes a first OS transistor 164, a second OS transistor 165, an inverter 163, and a NAND gate 168. The inverter 163 and the NAND gate 168 include Si transistors.

The connection of the first OS transistor 164 and the second OS transistor 165, and the structure and connection of the inverter 163 are similar to those described in Embodiment 3. The structure of the NAND gate 168 is similar to that described in Embodiment 6.

The semiconductor device 161 functions as a NAND gate. That is, an L voltage is output by inputting an H voltage to both of signal input portions 166 and 171, and an H voltage is output in other cases. An operation of the semiconductor device 161 is described below, using FIGS. 23A and 23B.

Figure 23A:
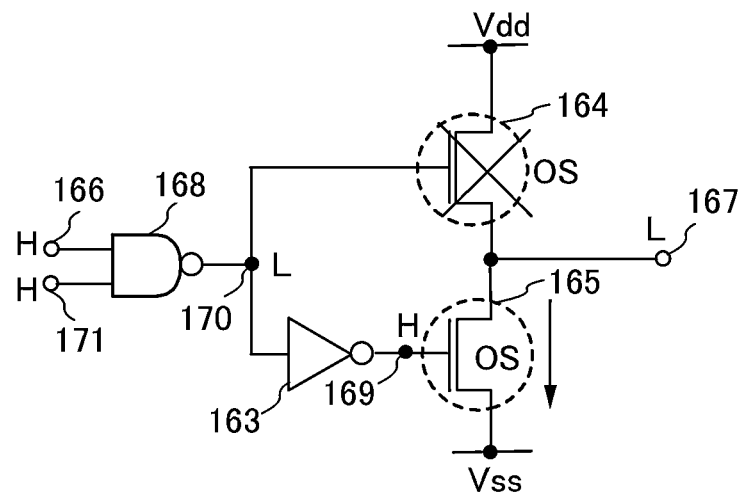
FIGS. 23A and 23B illustrate operations of the semiconductor device in Embodiment 7.

As shown in FIG. 23A, an H voltage is input to the signal input portion 166 and an H voltage is input to the signal input portion 171, so that an L voltage is output from the NAND gate 168.

The L voltage is input to the inverter 163 through a signal input portion 170, so that an H voltage is output. The H voltage is input to a gate of the second OS transistor 165, so that the second OS transistor 165 is turned on. Consequently, an L voltage is output to a signal output portion 167.

On the other hand, the L voltage is also input to a gate of the first OS transistor 164, so that the first OS transistor 164 is turned off.

Figure 23B:
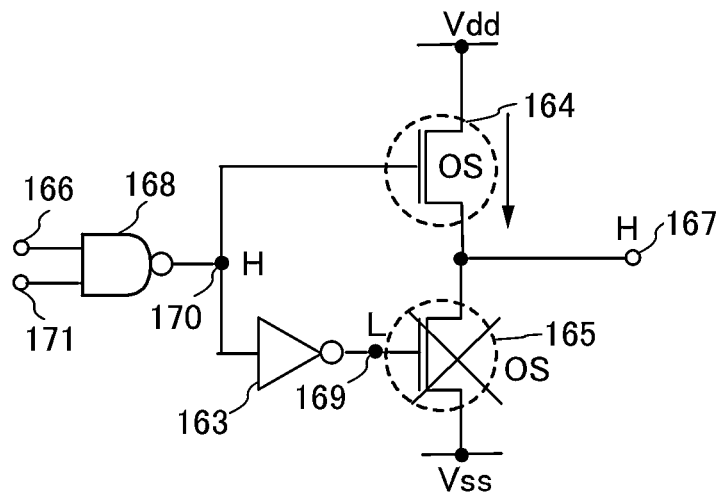

Alternatively, as shown in FIG. 23B, voltages are input to the signal input portions 166 and 171, so that an H voltage is output from the NAND gate 168.

The H voltage is input to the inverter 163 through the signal input portion 170, so that an L voltage is output. The L voltage is input to the gate of the second OS transistor 165, so that the second OS transistor 165 is turned off.

On the other hand, the H voltage is also input to the gate of the first OS transistor 164, so that the first OS transistor 164 is turned on. Consequently, an H voltage is output to the signal output portion 167.

In this manner, an L voltage is output by inputting an H voltage to both of the signal input portions 166 and 171, and an H voltage is output in other cases. The semiconductor device 161 thus functions as a NAND gate.

Figure 24:
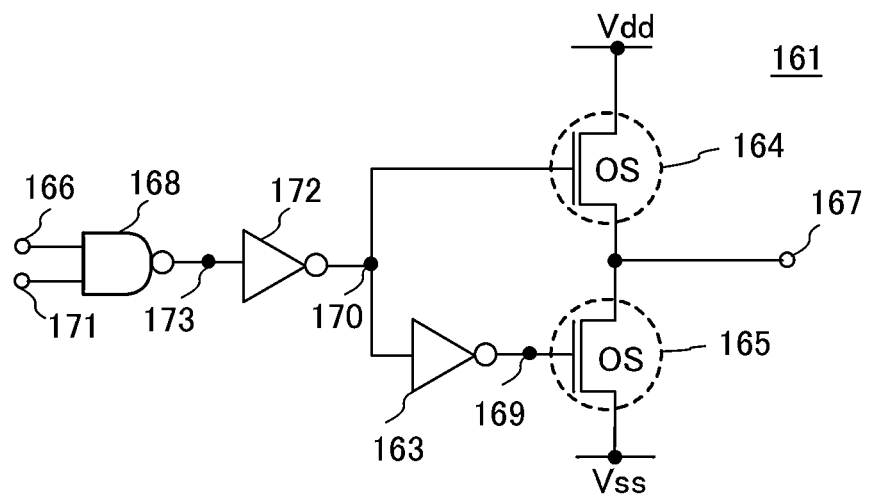
FIG. 24 illustrates a semiconductor device in Embodiment 7.

Next, a semiconductor device 161 which functions as an AND gate is shown in FIG. 24. The semiconductor device 161 includes a first OS transistor 164, a second OS transistor 165, a first inverter 163, a second inverter 172, and a NAND gate 168. The first inverter 163, the second inverter 172, and the NAND gate 168 include Si transistors. In the semiconductor device 161 shown in FIG. 24, the second inverter 172 is added to the semiconductor device 161 shown in FIG. 22.

The semiconductor device 161 functions as an AND gate. That is, an H voltage is output by inputting an H voltage to both of signal input portions 166 and 171, and an L voltage is output in other cases. An operation of the semiconductor device 161 is described below, using FIGS. 25A and 25B.

Figure 25A:
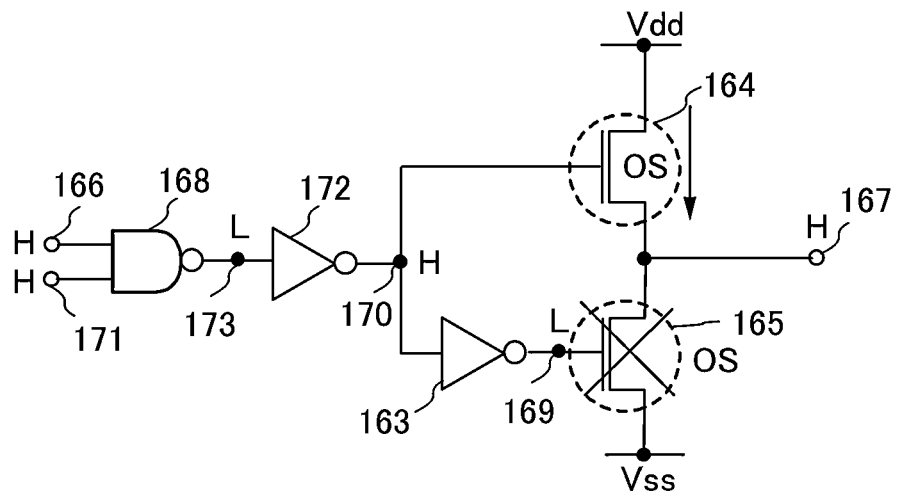
FIGS. 25A and 25B illustrate operations of the semiconductor device in Embodiment 7.

As shown in FIG. 25A, an H voltage is input to the signal input portion 166 and an H voltage is input to the signal input portion 171, so that an L voltage is output from the NAND gate 168.

The L voltage is input to the second inverter 172 through a signal input portion 173, so that an H voltage is output.

The H voltage is input to the first inverter 163 through a signal input portion 170, so that an L voltage is output. The L voltage is input to a gate of the second OS transistor 165, so that the second OS transistor 165 is turned off.

On the other hand, the H voltage is also input to a gate of the first OS transistor 164, so that the first OS transistor 164 is turned on. Consequently, an H voltage is output to a signal output portion 167.

Figure 25B:
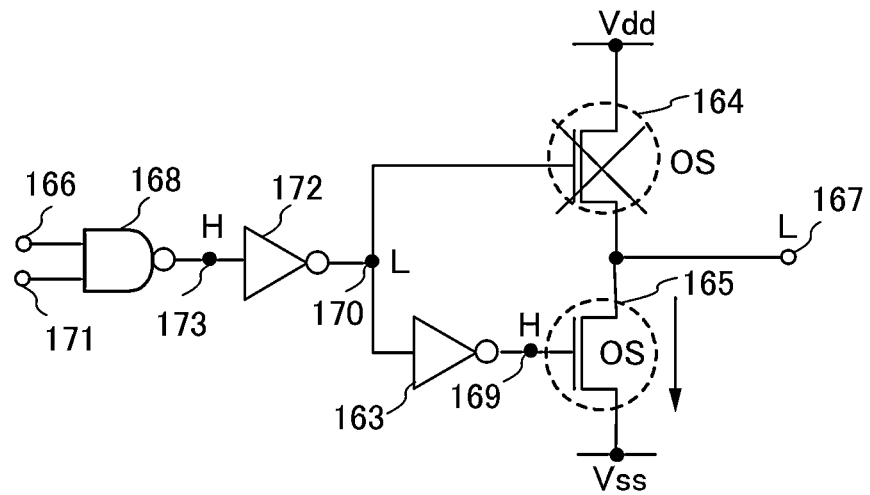

Alternatively, as shown in FIG. 25B, voltages are input to the signal input portions 166 and 171, so that an H voltage is output from the NAND gate 168.

The H voltage is input to the second inverter 178 through the signal input portion 173, so that an L voltage is output.

The L voltage is input to the first inverter 163 through the signal input portion 170, so that an H voltage is output. The H voltage is input to the gate of the second OS transistor 165, so that the second OS transistor 165 is turned on. Consequently, an L voltage is output to the signal output portion 167.

On the other hand, the L voltage is also input to the gate of the first OS transistor 164, so that the first OS transistor 164 is turned off.

In this manner, an H voltage is output by inputting an H voltage to both of the signal input portions 166 and 171, and an L voltage is output in other cases. The semiconductor device 161 thus functions as an AND gate.

Embodiment 8

Described in this embodiment is a semiconductor device in which a NOR gate is provided before the signal input portion 16 of the semiconductor device 11 described in Embodiment 2. With the NOR gate provided, the semiconductor device can function as an OR gate or a NOR gate.

Described in Embodiment 8 is a semiconductor device including a first transistor, a second transistor, an inverter, and a NOR gate, in which an output of the inverter is input to a gate of the first transistor, an output of the NOR gate is input not only to the inverter but also to a gate of the second transistor, channel regions of the first transistor and the second transistor include respective oxide semiconductor films containing In, Zn, or Sn, and respective channel regions of transistors included in the inverter and the NOR gate contain silicon. The semiconductor device functions as an OR gate.

Also described in Embodiment 8 is a semiconductor device including a first transistor, a second transistor, a first inverter, a second inverter, and a NOR gate, in which an output of the first inverter is input to a gate of the first transistor, an output of the second inverter is input not only to the first inverter but also to a gate of the second transistor, an output of the NOR gate is input to the second inverter, channel regions of the first transistor and the second transistor include respective oxide semiconductor films containing In, Zn, or Sn, and respective channel regions of transistors included in the first inverter, the second inverter, and the NOR gate contain silicon. The semiconductor device functions as a NOR gate.

Figure 26A:
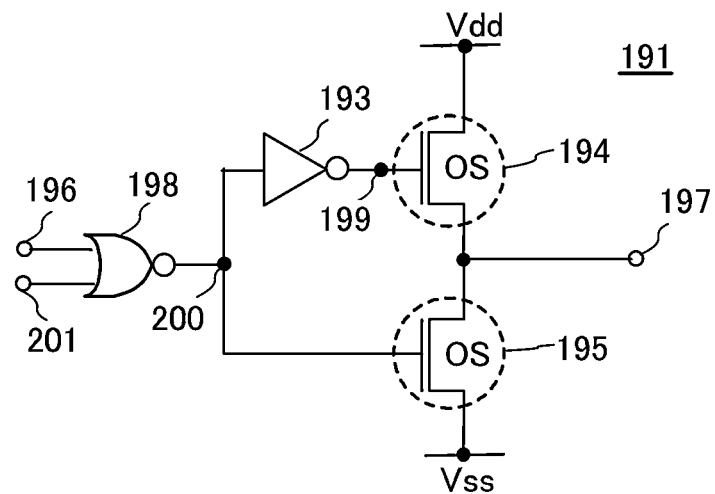
FIGS. 26A and 26B illustrate a semiconductor device in Embodiment 8.

A semiconductor device 191 which functions as an OR gate is shown in FIG. 26A. The semiconductor device 191 includes a first OS transistor 194, a second OS transistor 195, an inverter 193, and a NOR gate 198. The inverter 193 and the NOR gate 198 include Si transistors.

The connection of the first OS transistor 194 and the second OS transistor 195, and the structure and connection of the inverter 193 are similar to those described in Embodiment 2.

Figure 26B:
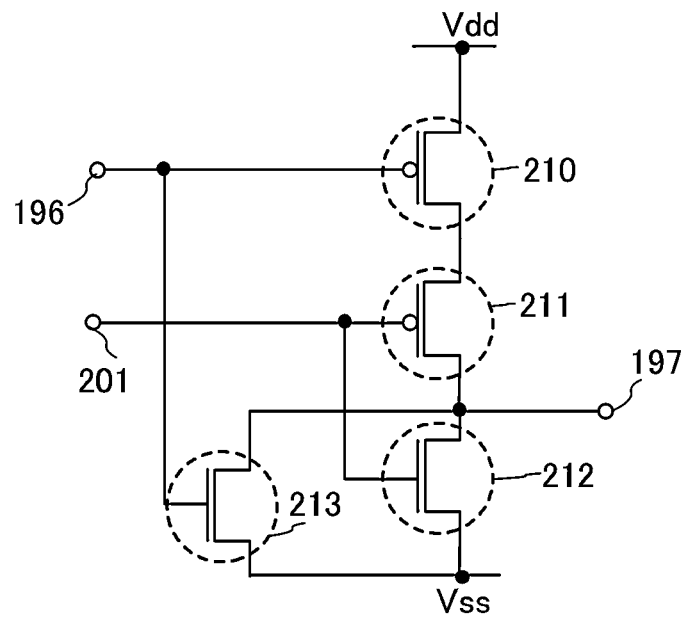

A known structure can be applied to the NOR gate 198. An example of the NOR gate 198 is shown in FIG. 26B, in which the NOR gate 198 includes p-channel Si transistors 210 and 211 and n-channel transistors 212 and 213.

The semiconductor device 191 functions as an OR gate. That is, an L voltage is output by inputting an L voltage to both of signal input portions 196 and 201, and an H voltage is output in other cases. An operation of the semiconductor device 191 is described below, using FIGS. 27A and 27B.

Figure 27A:
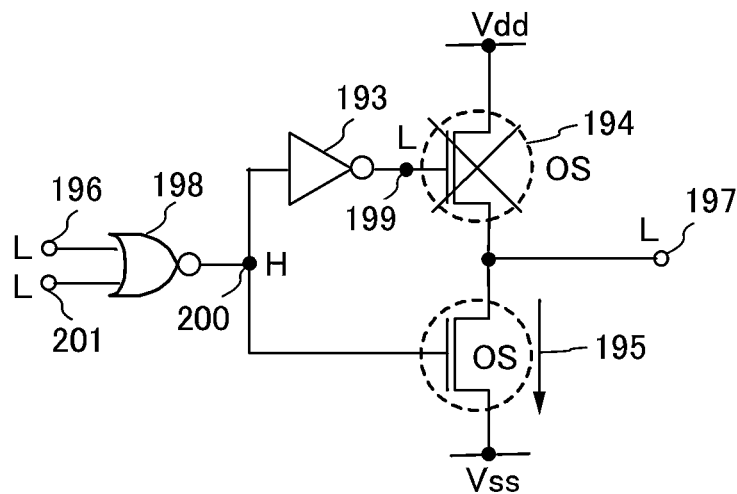
FIGS. 27A and 27B illustrate operations of the semiconductor device in Embodiment 8.

As shown in FIG. 27A, an L voltage is input to the signal input portion 196 and an L voltage is input to the signal input portion 201, so that an H voltage is output from the NOR gate 198.

The H voltage is input to the inverter 193 through a signal input portion 200, so that an L voltage is output. The L voltage is input to a gate of the first OS transistor 194, so that the first OS transistor 194 is turned off.

On the other hand, the H voltage is also input to a gate of the second OS transistor 195, so that the second OS transistor 195 is turned on. Consequently, an L voltage is output to a signal output portion 197.

Figure 27B:
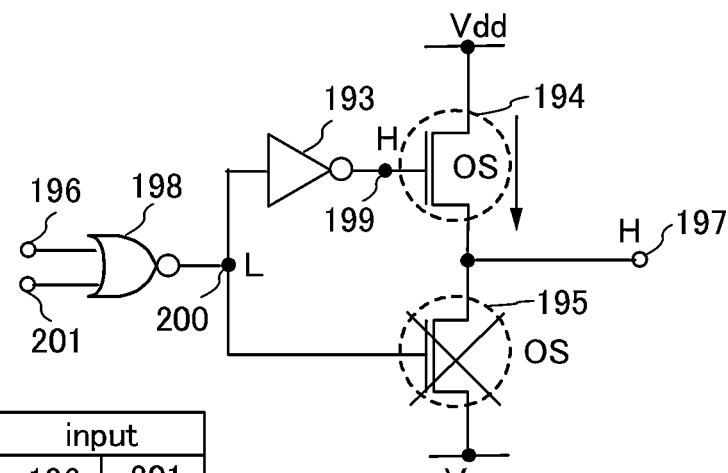

Alternatively, as shown in FIG. 27B, voltages are input to the signal input portions 196 and 201, so that an L voltage is output from the NOR gate 198.

The L voltage is input to the inverter 193 through the signal input portion 200, so that an H voltage is output. The H voltage is input to the gate of the first OS transistor 194, so that the first OS transistor 194 is turned on. Consequently, an H voltage is output to the signal output portion 197.

On the other hand, the L voltage is also input to the gate of the second OS transistor 195, so that the second OS transistor 195 is turned off.

In this manner, an L voltage is output by inputting an L voltage to both of the signal input portions 196 and 201, and an H voltage is output in other cases. The semiconductor device 191 thus functions as an OR gate.

Figure 28:
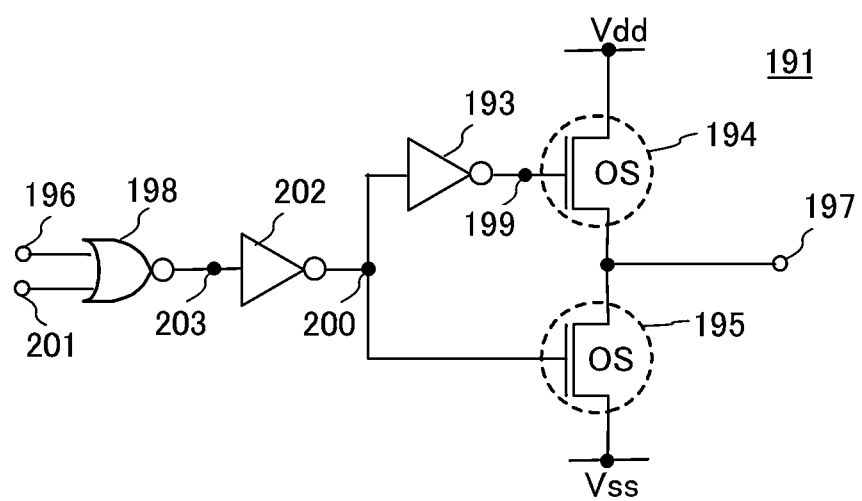
FIG. 28 illustrates a semiconductor device in Embodiment 8.

Next, a semiconductor device 191 which functions as a NOR gate is shown in FIG. 28. The semiconductor device 191 includes a first OS transistor 194, a second OS transistor 195, a first inverter 193, a second inverter 202, and a NOR gate 198. The first inverter 193, the second inverter 202, and the NOR gate 198 include Si transistors. In the semiconductor device 191 shown in FIG. 28, the second inverter 202 is added to the semiconductor device 191 shown in FIGS. 26A and 26B.

The semiconductor device 191 functions as a NOR gate. That is, an H voltage is output by inputting an L voltage to both of signal input portions 196 and 201, and an L voltage is output in other cases. An operation of the semiconductor device 191 is described below, using FIGS. 29A and 29B.

Figure 29A:
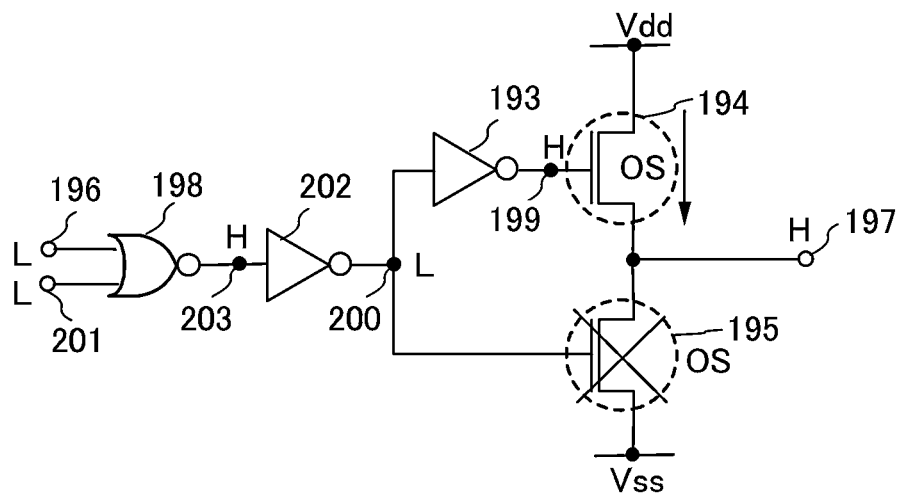
FIGS. 29A and 29B illustrate operations of the semiconductor device in Embodiment 8.

As shown in FIG. 29A, an L voltage is input to the signal input portion 196 and an L voltage is input to the signal input portion 201, so that an H voltage is output from the NOR gate 198.

The H voltage is input to the second inverter 202 through a signal input portion 203, so that an L voltage is output.

The L voltage is input to the first inverter 193 through a signal input portion 200, so that an H voltage is output. The H voltage is input to a gate of the first OS transistor 194, so that the first OS transistor 194 is turned on. Consequently, an H voltage is output to a signal output portion 197.

On the other hand, the L voltage is also input to a gate of the second OS transistor 195, so that the second OS transistor 195 is turned off.

Figure 29B:
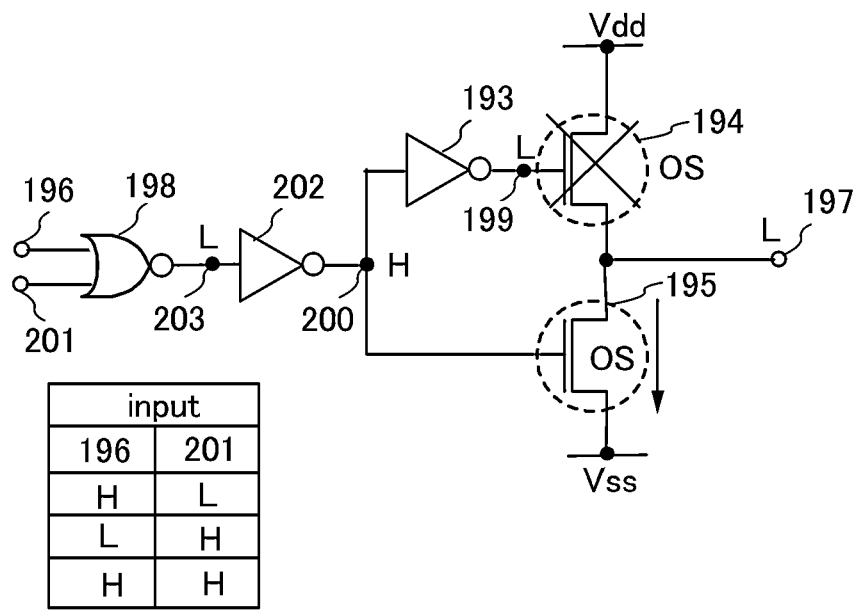

Alternatively, as shown in FIG. 29B, voltages are input to the signal input portions 196 and 201, so that an L voltage is output from the NOR gate 198.

The L voltage is input to the second inverter 202 through the signal input portion 203, so that an H voltage is output.

The H voltage is input to the first inverter 193 through the signal input portion 200, so that an L voltage is output. The L voltage is input to the gate of the first OS transistor 194, so that the first OS transistor 194 is turned off.

On the other hand, the H voltage is also input to the gate of the second OS transistor 195, so that the second OS transistor 195 is turned on. Consequently, an L voltage is output to the signal output portion 197.

In this manner, an H voltage is output by inputting an L voltage to both of the signal input portions 196 and 201, and an L voltage is output in other cases. The semiconductor device 191 thus functions as a NOR gate.

Embodiment 9

Described in this embodiment is a semiconductor device in which a NOR gate is provided before the signal input portion 46 of the semiconductor device 41 described in Embodiment 3. With the NOR gate provided, the semiconductor device can function as a NOR gate or an OR gate.

Described in Embodiment 9 is a semiconductor device including a first transistor, a second transistor, an inverter, and a NOR gate, in which an output of the inverter is input to a gate of the second transistor, an output of the NOR gate is input not only to the inverter but also to a gate of the first transistor, channel regions of the first transistor and the second transistor include respective oxide semiconductor films containing In, Zn, or Sn, and respective channel regions of transistors included in the inverter and the NOR gate contain silicon. The semiconductor device functions as a NOR gate.

Also described in Embodiment 9 is a semiconductor device including a first transistor, a second transistor, a first inverter, a second inverter, and a NOR gate, in which an output of the first inverter is input to a gate of the second transistor, an output of the second inverter is input not only to the first inverter but also to a gate of the first transistor, an output of the NOR gate is input to the second inverter, channel regions of the first transistor and the second transistor include respective oxide semiconductor films containing In, Zn, or Sn, and respective channel regions of transistors included in the first inverter, the second inverter, and the NOR gate contain silicon. The semiconductor device functions as an OR gate.

Figure 30:
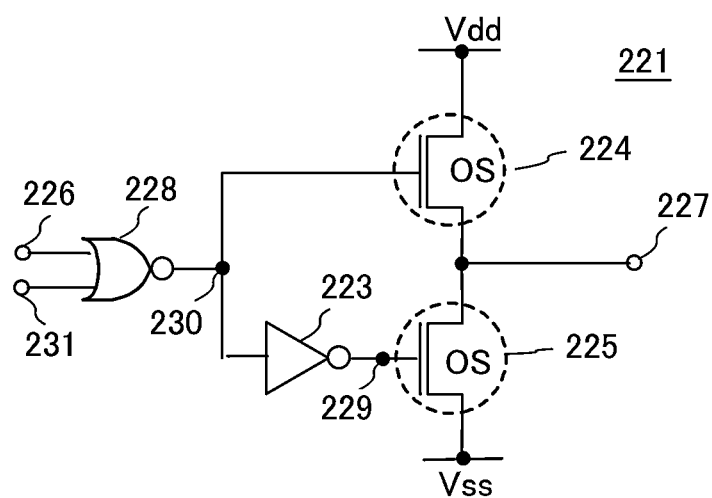
FIG. 30 illustrates a semiconductor device in Embodiment 9.

A semiconductor device 221 which functions as a NOR gate is shown in FIG. 30. The semiconductor device 221 includes a first OS transistor 224, a second OS transistor 225, an inverter 223, and a NOR gate 228. The inverter 223 and the NOR gate 228 include Si transistors.

The connection of the first OS transistor 224 and the second OS transistor 225, and the structure and connection of the inverter 223 are similar to those described in Embodiment 3. The structure of the NOR gate 228 is similar to that described in Embodiment 8.

The semiconductor device 221 functions as a NOR gate. That is, an H voltage is output by inputting an L voltage to both of signal input portions 226 and 231, and an L voltage is output in other cases. An operation of the semiconductor device 221 is described below, using FIGS. 31A and 31B.

Figure 31A:
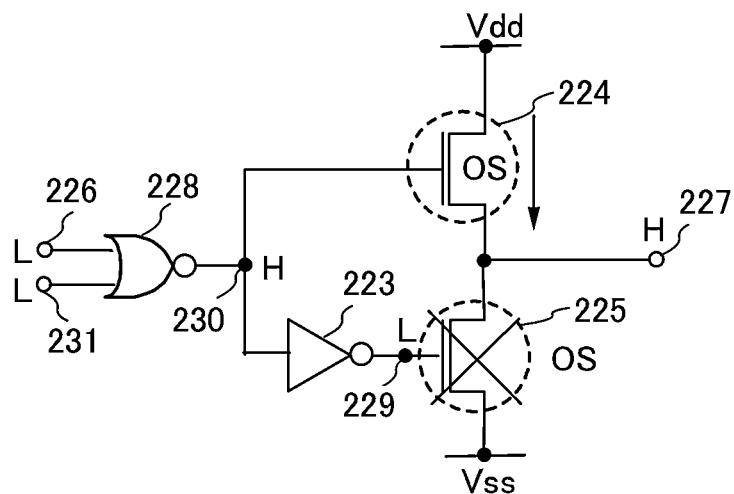
FIGS. 31A and 31B illustrate operations of the semiconductor device in Embodiment 9.

As shown in FIG. 31A, an L voltage is input to the signal input portion 226 and an L voltage is input to the signal input portion 231, so that an H voltage is output from the NOR gate 228.

The H voltage is input to the inverter 223 through a signal input portion 230, so that an L voltage is output. The L voltage is input to a gate of the second OS transistor 225, so that the second OS transistor 225 is turned off.

On the other hand, the H voltage is also input to a gate of the first OS transistor 224, so that the first OS transistor 224 is turned on. Consequently, an H voltage is output to a signal output portion 227.

Figure 31B:
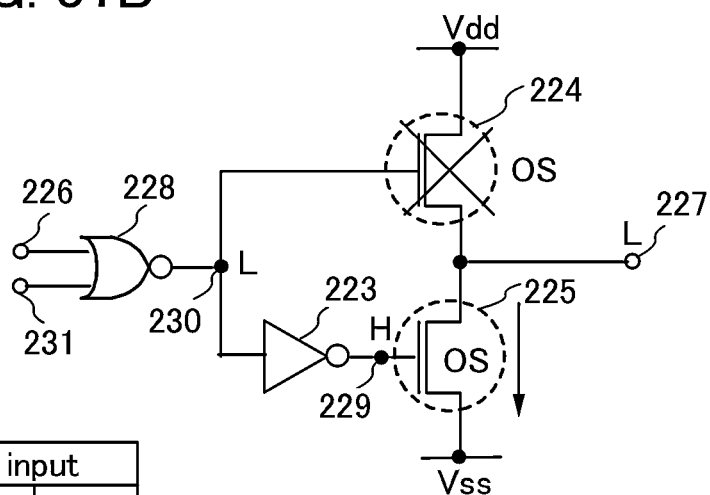

Alternatively, as shown in FIG. 31B, voltages are input to the signal input portions 226 and 231, so that an L voltage is output from the NOR gate 228.

The L voltage is input to the inverter 223 through the signal input portion 230, so that an H voltage is output. The H voltage is input to the gate of the second OS transistor 225, so that the second OS transistor 225 is turned on. Consequently, an L voltage is output to the signal output portion 227.

On the other hand, the L voltage is also input to the gate of the first OS transistor 224, so that the first OS transistor 224 is turned off.

In this manner, an H voltage is output by inputting an L voltage to both of the signal input portions 266 and 231, and an L voltage is output in other cases. The semiconductor device 221 thus functions as a NOR gate.

Figure 32:
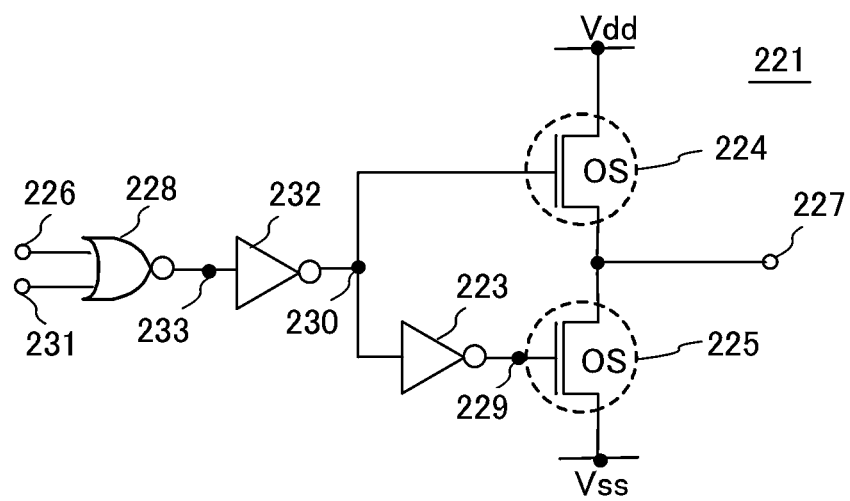
FIG. 32 illustrates a semiconductor device in Embodiment 9.

Next, a semiconductor device 221 which functions as an OR gate is shown in FIG. 32. The semiconductor device 221 includes a first OS transistor 224, a second OS transistor 225, a first inverter 223, a second inverter 232, and a NOR gate 228. The first inverter 223, the second inverter 232, and the NOR gate 228 include Si transistors. In the semiconductor device 221 shown in FIG. 32, the second inverter 232 is added to the semiconductor device 221 shown in FIG. 30.

The semiconductor device 221 functions as an OR gate. That is, an L voltage is output by inputting an L voltage to both of signal input portions 266 and 231, and an H voltage is output in other cases. An operation of the semiconductor device 221 is described below, using FIGS. 33A and 33B.

Figure 33A:
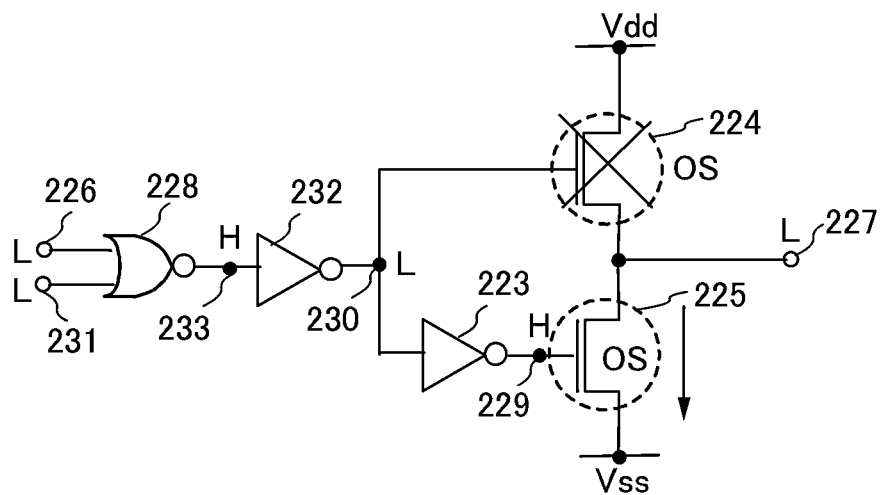
FIGS. 33A and 33B illustrate operations of the semiconductor device in Embodiment 9.

As shown in FIG. 33A, an L voltage is input to the signal input portion 226 and an L voltage is input to the signal input portion 231, so that an H voltage is output from the NOR gate 228.

The H voltage is input to the second inverter 232 through a signal input portion 233, so that an L voltage is output.

The L voltage is input to the first inverter 223 through a signal input portion 230, so that an H voltage is output. The H voltage is input to a gate of the second OS transistor 225, so that the second OS transistor 225 is turned on. Consequently, an L voltage is output to the signal output portion 227.

On the other hand, the L voltage is also input to a gate of the first OS transistor 224, so that the first OS transistor 224 is turned off.

Figure 33B:
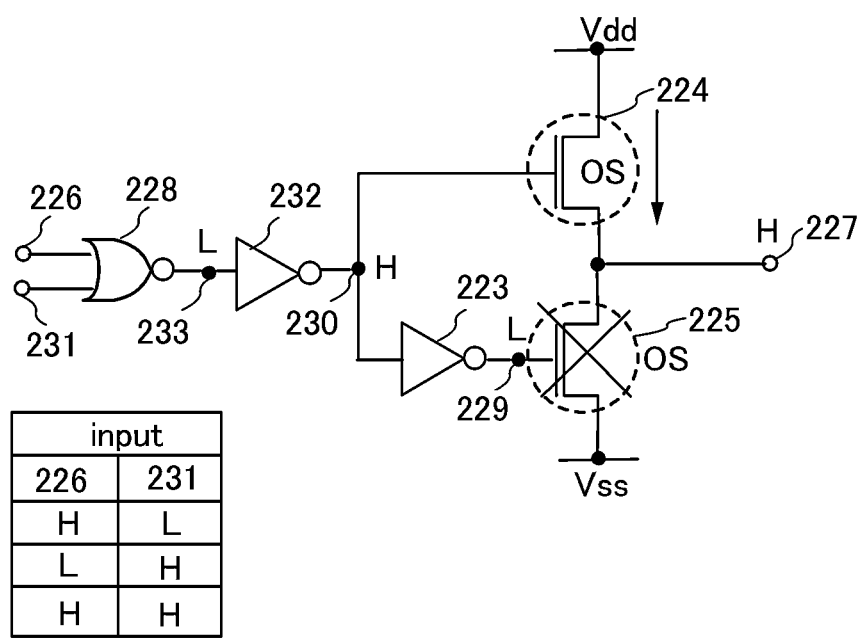

Alternatively, as shown in FIG. 33B, voltages are input to the signal input portions 226 and 231, so that an L voltage is output from the NOR gate 228.

The L voltage is input to the second inverter 232 through the signal input portion 233, so that an H voltage is output.

The H voltage is input to the first inverter 223 through the signal input portion 230, so that an L voltage is output. The L voltage is input to the gate of the second OS transistor 225, so that the second OS transistor 225 is turned off.

On the other hand, the H voltage is also input to the gate of the first OS transistor 224, so that the first OS transistor 224 is turned on. Consequently, an H voltage is output to the signal output portion 227.

In this manner, an L voltage is output by inputting an L voltage to both of the signal input portions 226 and 231, and an H voltage is output in other cases. The semiconductor device 221 thus functions as an OR gate.

Embodiment 10

Described in Embodiment 10 is an RS flip-flop (hereinafter also referred to as an RS-FF). The RS-FF is formed using the semiconductor device 221 shown in FIG. 30, the semiconductor device 191 shown in FIGS. 26A and 26B, or the semiconductor device 191 shown in FIG. 28.

Figure 34:
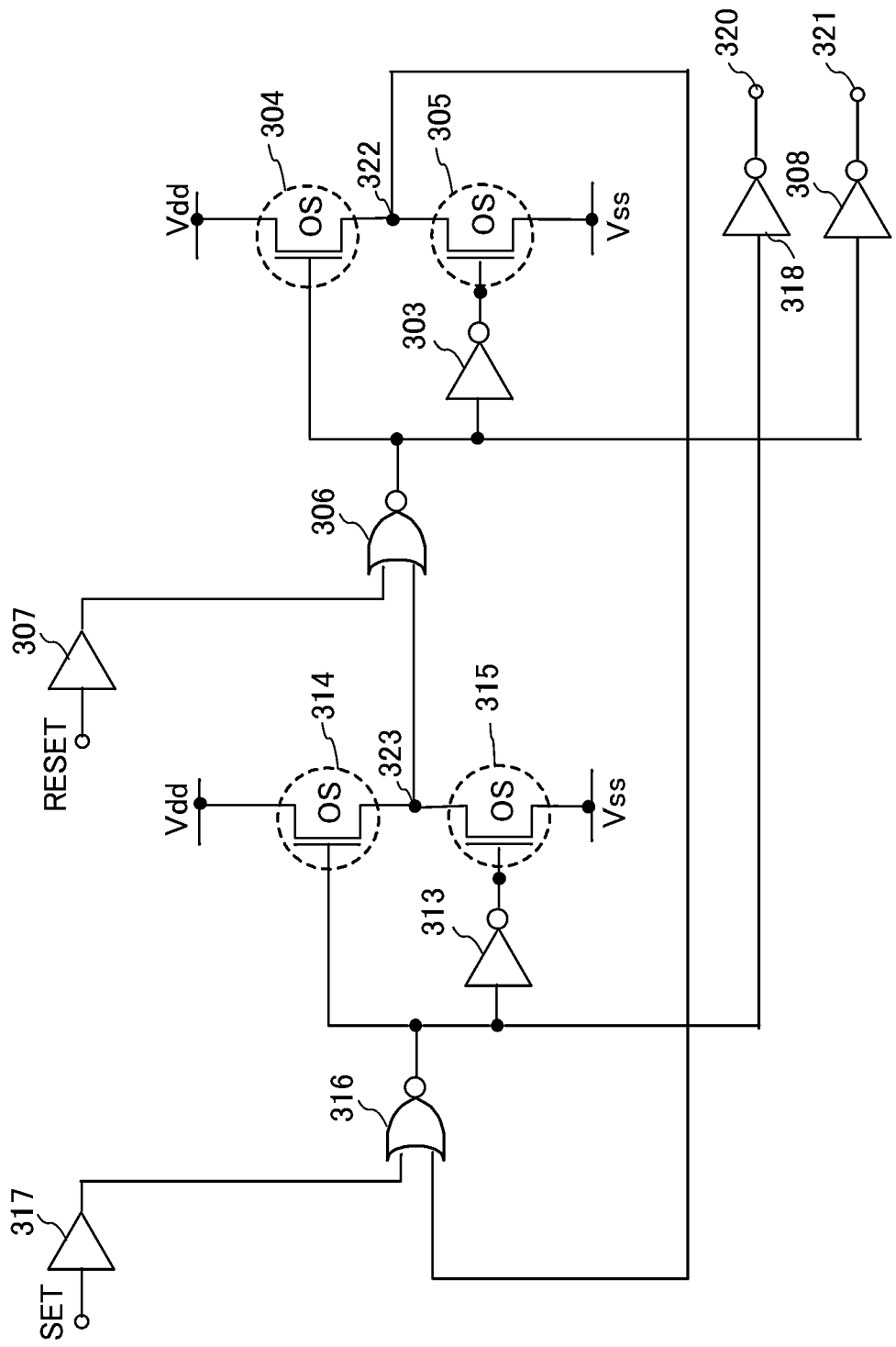
FIG. 34 illustrates an RS-FF in Embodiment 10.

FIG. 34 illustrates an RS-FF 301 using the semiconductor device 221 (FIG. 30). The RS-FF 301 includes at least a first OS transistor 304, a second OS transistor 305, a first inverter 303, a first NOR gate 306, a third OS transistor 314, a fourth OS transistor 315, a second inverter 313, and a second NOR gate 316.

The first inverter 303 and the first NOR gate 306 include Si transistors. The second inverter 313 and the second NOR gate 316 include Si transistors.

The connection of the first OS transistor 304 and the second OS transistor 305, the connection of the third OS transistor 314 and the fourth OS transistor 315, the structures and connection of the first inverter 303 and the first NOR gate 306, and the structures and connection of the second inverter 313 and the second NOR gate 316 are similar to those described in the above-described embodiment.

A SET signal is input to the second NOR gate 316, and a RESET signal is input to the first NOR gate 306.

Signals of the RS-FF 301 are output from signal output portions 320 and 321.

Buffers 307 and 317 and inverters 308 and 318 are provided as needed.

In the RS-FF 301 in which the OS transistors whose off-leakage current is small are provided, the potential retention characteristics of each of a node 322 and a node 323 are excellent. Accordingly, an RS-FF whose retention characteristics are excellent can be provided.

Figure 35:
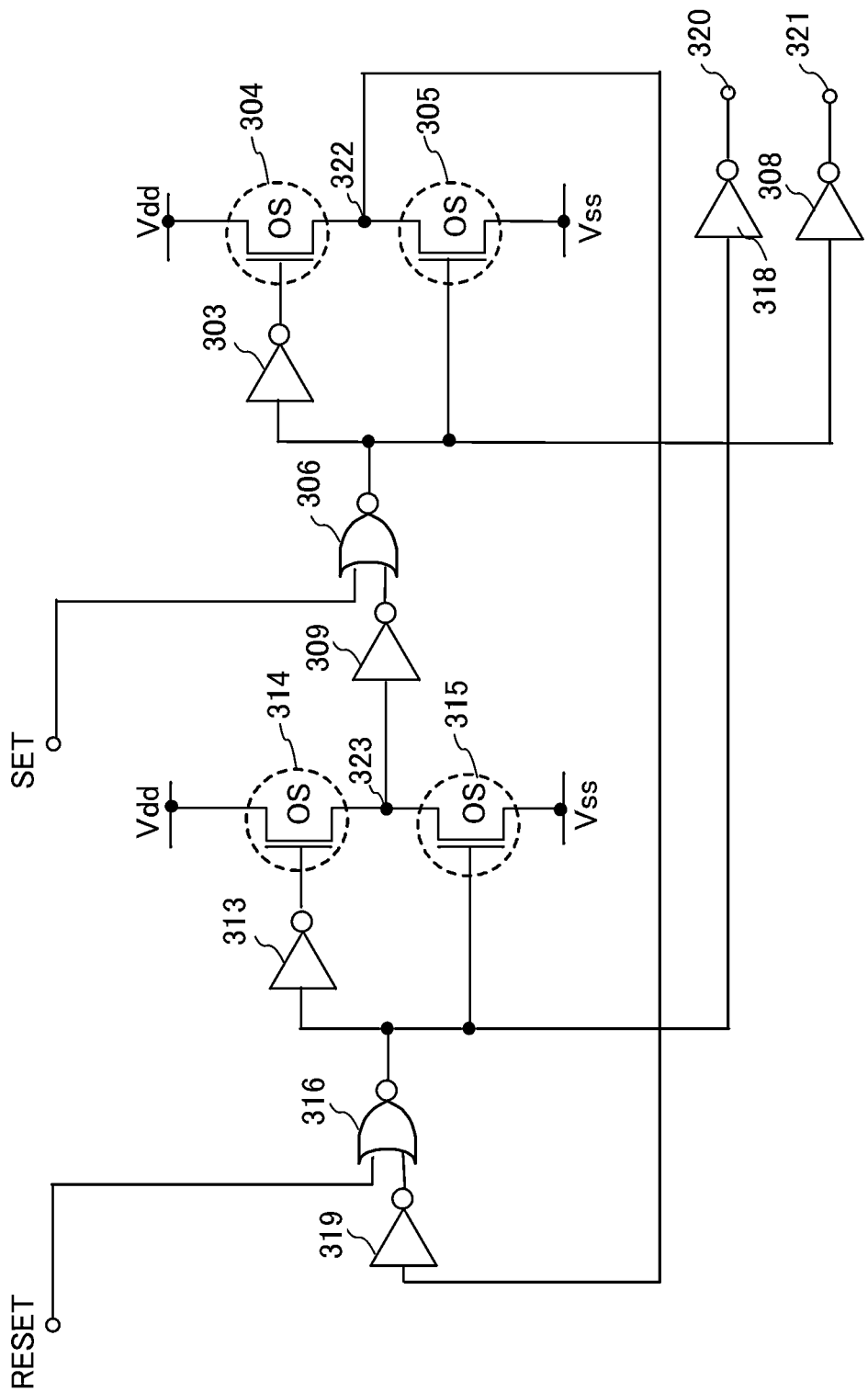
FIG. 35 illustrates an RS-FF in Embodiment 10.

Next, FIG. 35 illustrates an RS-FF 301 using the semiconductor device 191 (FIGS. 26A and 26B). The RS-FF 301 includes at least a first OS transistor 304, a second OS transistor 305, a first inverter 303, a first NOR gate 306, a third inverter 309, a third OS transistor 314, a fourth OS transistor 315, a second inverter 313, a second NOR gate 316, and a fourth inverter 319.

The first inverter 303, the first NOR gate 306, and the third inverter 309 include Si transistors. The second inverter 313, the second NOR gate 316, and the fourth inverter 319 include Si transistors.

The connection of the first OS transistor 304 and the second OS transistor 305, the connection of the third OS transistor 314 and the fourth OS transistor 315, the structures and connection of the first inverter 303, the first NOR gate 306, and the third inverter 309, and the structures and connection of the second inverter 313, the second NOR gate 316, and the fourth inverter 319 are similar to those described in the above-described embodiment.

A RESET signal is input to the second NOR gate 316, and a SET signal is input to the first NOR gate 306.

Signals of the RS-FF 301 are output from signal output portions 320 and 321.

Inverters 308 and 318 are provided as needed.

In the RS-FF 301 in which the OS transistors whose off-leakage current is small are provided, the potential retention characteristics of each of a node 322 and a node 323 are excellent. Accordingly, an RS-FF whose retention characteristics are excellent can be provided.

Figure 36:
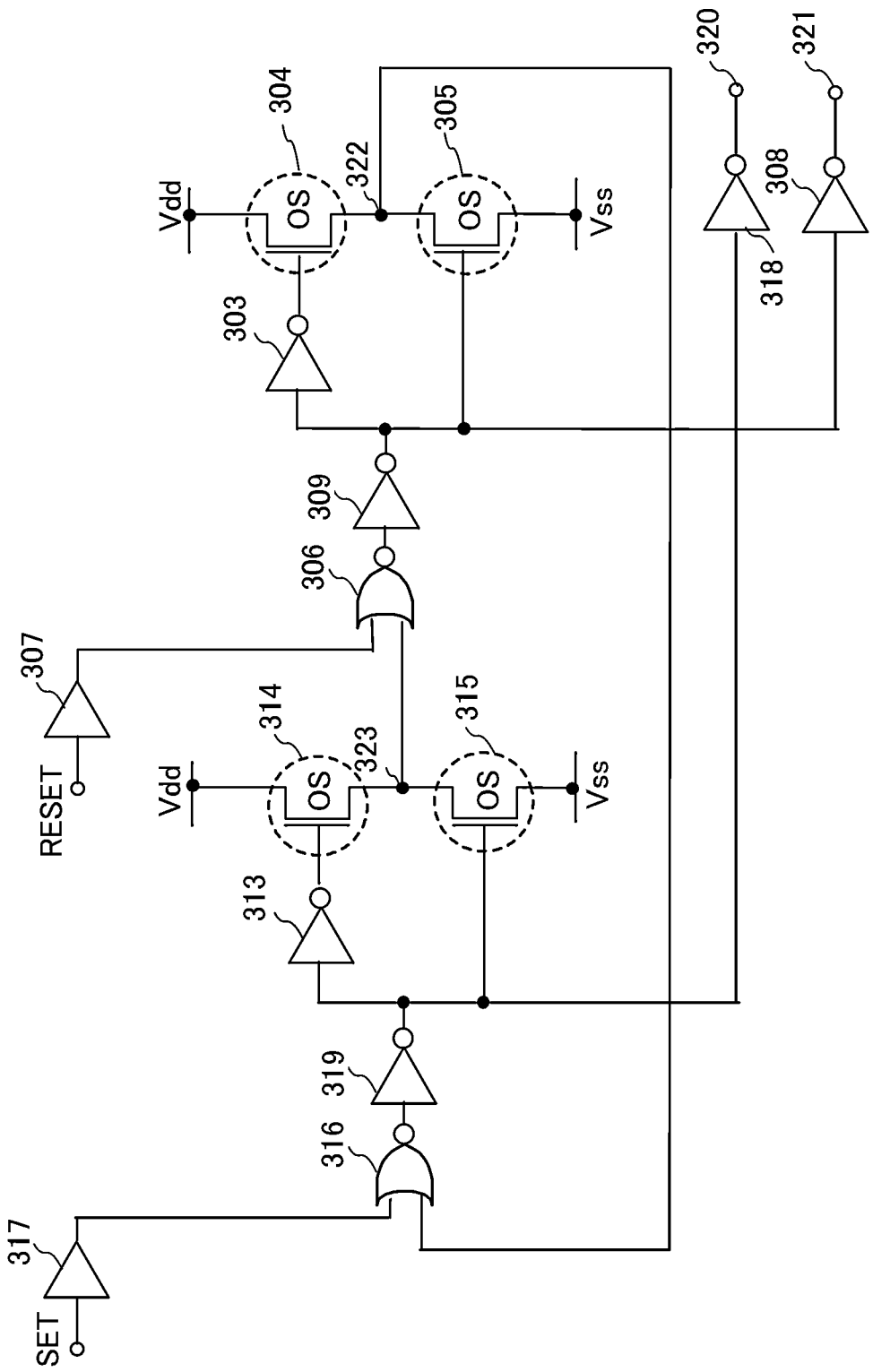
FIG. 36 illustrates an RS-FF in Embodiment 10.

Next, FIG. 36 illustrates an RS-FF 301 using the semiconductor device 191 (FIG. 28). The RS-FF 301 includes at least a first OS transistor 304, a second OS transistor 305, a first inverter 303, a third inverter 309, a first NOR gate 306, a third OS transistor 314, a fourth OS transistor 315, a second inverter 313, a fourth inverter 319, and a second NOR gate 316.

The first inverter 303, the third inverter 309, and the first NOR gate 306 include Si transistors. The second inverter 313, the fourth inverter 319, and the second NOR gate 316 include Si transistors.

The connection of the first OS transistor 304 and the second OS transistor 305, the connection of the third OS transistor 314 and the fourth OS transistor 315, the structures and connection of the first inverter 303, the third inverter 309, and the first NOR gate 306, and the structures and connection of the second inverter 313, the fourth inverter 319, and the second NOR gate 316 are similar to those described in the above-described embodiment.

A SET signal is input to the second NOR gate 316, and a RESET signal is input to the first NOR gate 306.

Signals of the RS-FF 301 are output from signal output portions 320 and 321.

Buffers 307 and 317 and inverters 308 and 318 are provided as needed.

In the RS-FF 301 in which the OS transistors whose off-leakage current is small are provided, the potential retention characteristics of each of a node 322 and a node 323 are excellent. Accordingly, an RS-FF whose retention characteristics are excellent can be provided.

Embodiment 11

Described in Embodiment 11 is a D flip-flop (hereinafter also referred to as a D-FF) using the RS-FF described in Embodiment 10.

Figure 37:
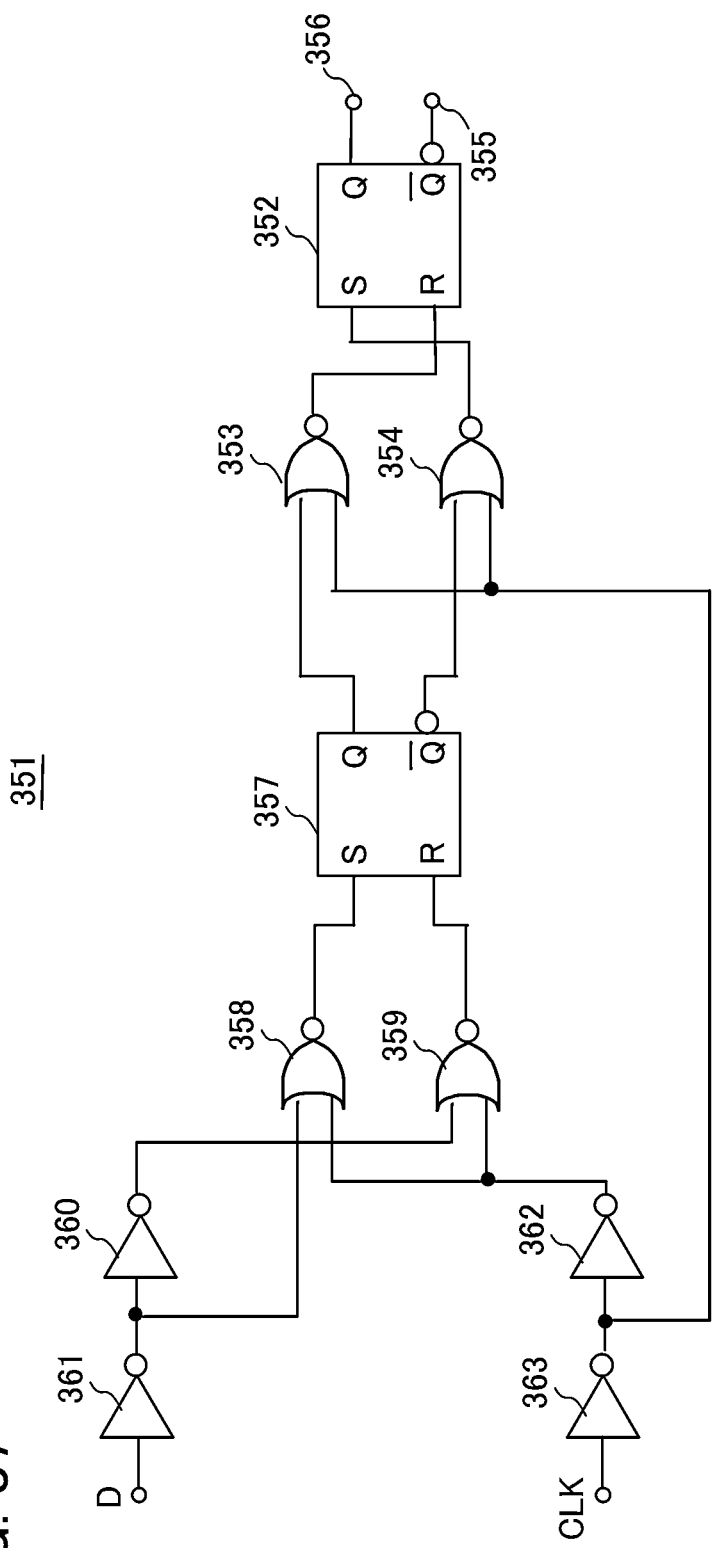
FIG. 37 illustrates a D-FF in Embodiment 11.

As shown in FIG. 37, a D-FF 351 includes at least a first RS-FF 352, a first NOR gate 353, a second NOR gate 354, a second RS-FF 357, a third NOR gate 358, a fourth NOR gate 359, a first inverter 360, a second inverter 361, a third inverter 362, and a fourth inverter 363.

The RS-FF 301 described in Embodiment 10 can be used for one or both of the first RS-FF 352 and the second RS-FF 357. The first NOR gate 353, the second NOR gate 354, the third NOR gate 358, the fourth NOR gate 359, the first inverter 360, the second inverter 361, the third inverter 362, and the fourth inverter 363 include Si transistors.

The structures and connection of the first NOR gate 353, the second NOR gate 354, the third NOR gate 358, the fourth NOR gate 359, the first inverter 360, the second inverter 361, the third inverter 362, and the fourth inverter 363 are similar to those described in the above-described embodiment.

A D signal is input to the second inverter 361, and a CLK signal is input to the fourth inverter 363.

Signals of the D-FF 351 are output from signal output portions 355 and 356.

In one or both of the first RS-FF 352 and the second RS-FF 357 in which the OS transistors whose off-leakage current is small are provided; accordingly, a D-FF whose retention characteristics are excellent can be provided.

Embodiment 12

A manufacturing method of a semiconductor device is described. In this embodiment, a method for forming the transistor 2 and the inverter 3 shown in FIGS. 1A and 1B is described. Formation of the p-channel Si transistor 4 in the inverter 3 is described in this embodiment; the n-channel Si transistor 5 can also be formed as well by adding an n-type impurity element instead of a p-type impurity element.

Figure 38A:
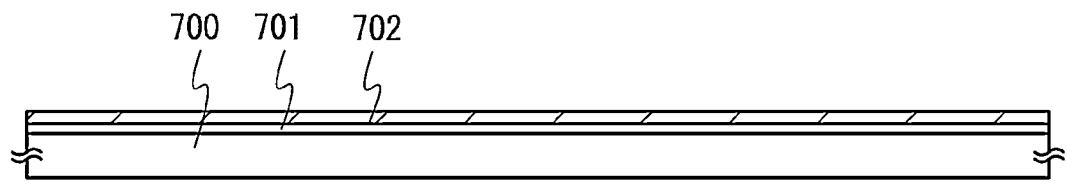
FIGS. 38A to 38D illustrate a manufacturing method of a semiconductor device in Embodiment 12.

First, as shown in FIG. 38A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment performed later. For example, a glass substrate formed by a fusion process or a float process, a quartz substrate, a semiconductor substrate, a ceramic substrate, or the like can be used as the substrate 700. In the case where the temperature of the heat treatment performed later is high, a glass substrate whose strain point is higher than or equal to 730° C. is preferably used.

In this embodiment, the p-channel Si transistor 4 is formed taking the case where the semiconductor film 702 is single crystal silicon as an example.

A specific example of a method for forming the single crystal semiconductor film 702 is briefly described. First, an ion beam made of ions which are accelerated by an electric field enters a bond substrate which is a single crystal semiconductor substrate, whereby a fragile layer which is fragile because of disorder of the crystal structure is formed in a region at a certain depth from a top surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. The attachment is performed as follow: the bond substrate and the substrate 700 overlap with each other, and then, a pressure of about 1 to 500 N/cm$^2$, preferably 11 to 20 N/cm$^2$ is applied partly to the bond substrate and the substrate 700. Upon application of the pressure, bonding between the bond substrate and the insulating film 701 starts from the part, and extending over the entire surface where the bond substrate and the insulating film 701 are in close contact with each other. Next, heat treatment is performed thereon, whereby minute voids that exist in the fragile layer are combined to increase the volume of the minute voids. Accordingly, a single crystal semiconductor film which is part of the bond substrate is separated from the bond substrate in the fragile layer. The heat treatment is performed at a temperature below the strain point of the substrate 700. Then, the single crystal semiconductor film is processed into a desired shape by etching or the like, so that the semiconductor film 702 can be formed.

To control the threshold voltage, an impurity element imparting p-type conductivity, such as boron, aluminum, or gallium, or an impurity element imparting n-type conductivity, such as phosphorus or arsenic, may be added to the semiconductor film 702. The impurity element for controlling the threshold voltage may be added to the semiconductor film before etching of the semiconductor film to have a predetermined shape or may be added to the semiconductor film 702 after etching of the semiconductor film to have a predetermined shape. Alternatively, the impurity element for controlling the threshold voltage may be added to the bond substrate. Alternatively, an impurity element may be added to the bond substrate in order to roughly control the threshold voltage, and an impurity element may also be added to the semiconductor film before etching of the semiconductor film to have a predetermined shape or the semiconductor film 702 after the etching of the semiconductor film to have a predetermined shape in order to finely control the threshold voltage.

Although the example in which a single crystal semiconductor film is used is described in this embodiment, embodiments of the present invention are not limited to this structure. For example, a bulk semiconductor substrate that is isolated per element by shallow trench isolation (STI) or the like may be used. For example, a polycrystalline, microcrystalline, or amorphous semiconductor film which is formed over the insulating film 701 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case of using a heat-resistant substrate such as a quartz substrate, it is possible to combine any of the following crystallization methods: a thermal crystallization method using an electrically heated oven, a lamp heating crystallization method using infrared light, a crystallization method using a catalytic element, and a high-temperature heating method at about 950° C.

Figure 38B:
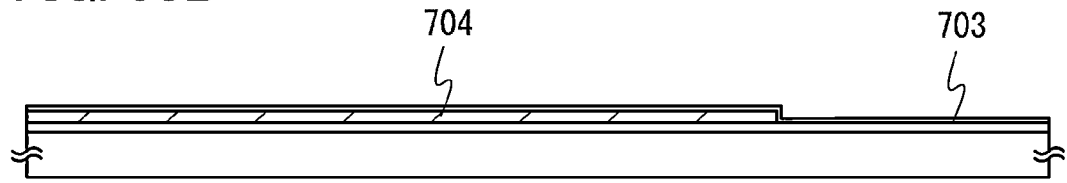

Next, as shown in FIG. 38B, a semiconductor layer 704 is formed of the semiconductor film 702. Then, a gate insulating film 703 is formed over the semiconductor layer 704. A semiconductor layer for the n-channel Si transistor 5 may be formed in addition to the semiconductor layer 704.

The gate insulating film 703 can be formed of a single layer or a stack of layers of films including silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$, (x>0, y>0, z>0)), or the like by a plasma-enhanced CVD method, a sputtering method, or the like.

In this specification, an oxynitride denotes a substance containing a higher quantity of oxygen than nitrogen in composition, and a nitride oxide denotes a substance containing a higher quantity of nitrogen than oxygen in composition.

The thickness of the gate insulating film 703 may be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma-enhanced CVD method.

Figure 38C:
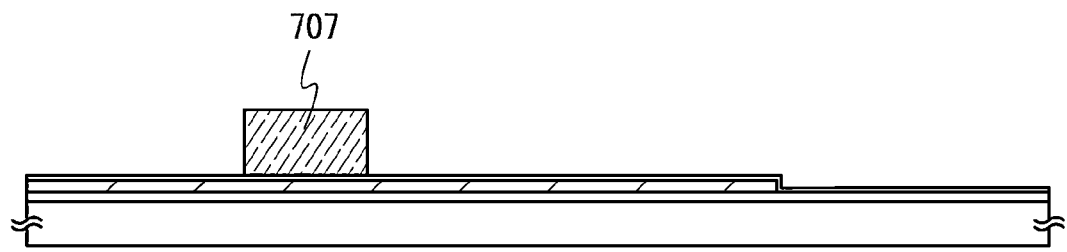

Next, a gate electrode 707 is formed as shown in FIG. 38C.

To form the gate electrode 707, a conductive film is formed and then is processed into a predetermined shape. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. Moreover, an alloy containing the above-described metal as its main component or a compound containing the above-described metal may be used. Alternatively, a semiconductor of polycrystalline silicon or the like doped with an impurity element such as phosphorus which imparts conductivity to a semiconductor film may be used.

Although the gate electrode 707 is formed of a single-layer conductive film in this embodiment, this embodiment is not limited to this structure. The gate electrode 707 may be formed of a plurality of stacked conductive films.

As a combination of two conductive films, tantalum nitride or tantalum can be used for the first conductive film and tungsten can be used for the second conductive film. Other examples of the combination of two conductive films include the combination of tungsten nitride and tungsten, the combination of molybdenum nitride and molybdenum, the combination of aluminum and tantalum, and the combination of aluminum and titanium. As for a two-layer constructive film using tungsten or tantalum nitride, which features high heat resistance, heat treatment for thermal activation can be performed thereon. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of using a three-layer structure consisting of three conductive films, a stacked structure of a molybdenum film, an aluminum film, and a molybdenum film is preferably used.

A light-transmitting oxide conductive film of indium oxide, an alloy of indium oxide and tin oxide, an alloy of indium oxide and zinc oxide, zinc oxide, zinc aluminum oxide, zinc aluminum oxynitride, zinc gallium oxide, or the like can be used to form the gate electrode 707.

The gate electrode 707 may be selectively formed by a droplet discharge method without using a mask. The droplet discharge method refers to a method for forming a pattern by discharge or ejection of a droplet containing a predetermined composition from a minute orifice, and includes an inkjet method in its category.

For the gate electrode 707, the conductive film can be etched into a tapered shape by an inductively coupled plasma (ICP) etching method in which the etching condition (e.g., the amount of electric power applied to a coil-shaped electrode layer, the amount of electric power applied to an electrode layer on the substrate side, and the electrode temperature on the substrate side) is controlled as appropriate. In addition, angles and the like of the tapered shape may also be controlled by a shape of a mask. As an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 38D:
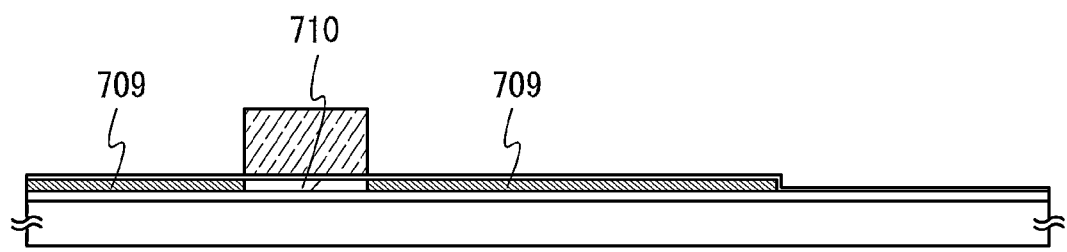

Next, as shown in FIG. 38D, an impurity element imparting one conductivity type is added to the semiconductor layer 704 with the gate electrode 707 as a mask, so that a channel formation region 710 overlapping with the gate electrode 707, and a pair of impurity regions 709 between which the channel formation region 710 is provided are formed in the semiconductor layer 704.

In this embodiment, the case where an impurity element imparting p-type conductivity (e.g., boron) is added to the semiconductor layer 704 is taken as an example. For a n-channel Si transistor, an impurity element imparting n-type conductivity (e.g., phosphorus) is added instead.

Figure 39A:
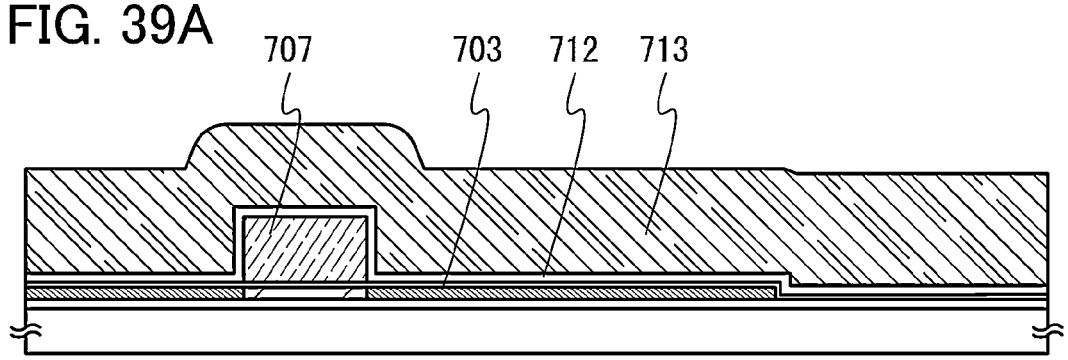
FIGS. 39A to 39C illustrate a manufacturing method of the semiconductor device in Embodiment 12.

Next, as shown in FIG. 39A, insulating films 712 and 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. A porous insulating film using such a material may also be employed as the insulating films 712 and 713. Since the porous insulating film has lower dielectric constant than a dense insulating film, parasitic capacitance due to electrodes or wirings can be further reduced.

In this embodiment, the case where silicon oxynitride is used for the insulating film 712 and silicon nitride oxide is used for the insulating film 713 is described as an example. Although this embodiment describes the case where the insulating films 712 and 713 are formed over the gate electrode 707 as an example, either a single insulating film or a stack of three or more insulating films may be formed over the gate electrode 707 in embodiments of the present invention.

Figure 39B:
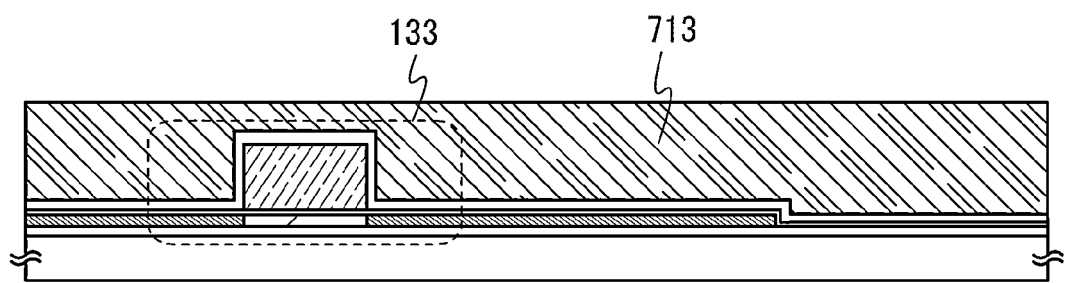

Next, as shown in FIG. 39B, the insulating film 713 is subjected to chemical mechanical polishing (CMP) or etching, so that a top surface of the insulating film 713 is planarized. To improve the characteristics of the transistor 2 which is formed later, it is preferable that the top surface of the insulating film 713 be as flat as possible.

Through the above-described process, the p-channel Si transistor 4 can be formed.

Figure 39C:
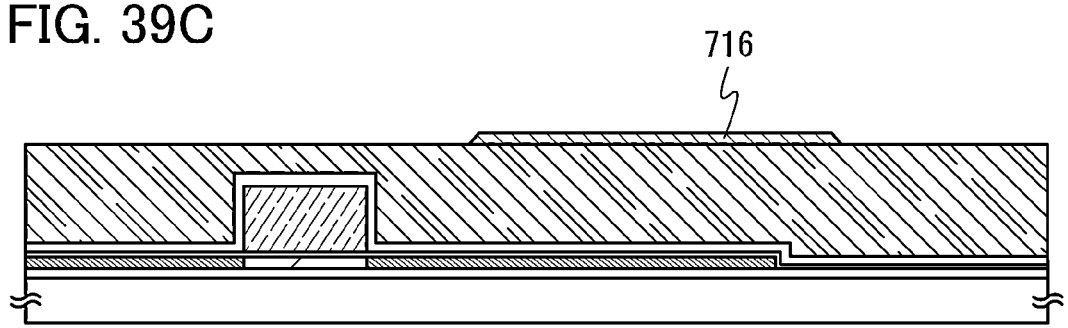

Next, a method for forming the OS transistor 2 is described. First, as shown in FIG. 39C, an oxide semiconductor film 716 is formed over the insulating film 713.

An oxide semiconductor to be used preferably contains at least indium (In), zinc (Zn), or tin (Sn). In particular, In and Zn are preferably contained. As a stabilizer for reducing variation in electric characteristics of a transistor using the oxide semiconductor, gallium (Ga) is preferably further contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, as the oxide semiconductor, any of the following can be used: an indium oxide; a tin oxide; a zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, the In—Ga—Zn-based oxide means an oxide containing In, Ga, and Zn as its main component and there is no particular limitation on the ratio of In:Ga:Zn. The In—Ga—Zn-based oxide may further include a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1, 2:2:1, 4:2:3, 3:1:2, 1:1:2, 2:1:3, or 3:1:4, or any of oxides whose composition is in the neighborhood of the above compositions can be used. Alternatively, an In—Sn—Zn-based oxide with an atomic ratio of In:Sn:Zn=1:1:1, 2:1:3, 1:2:2, 2:1:5, or 20:40:35, or any of oxides whose composition is in the neighborhood of the above compositions can be used.

However, without limitation to the materials given above, a material with an appropriate composition may be used depending on requisite semiconductor characteristics (e.g., mobility, threshold voltage, and variation). To provide requisite semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily with an In—Sn—Zn-based oxide. However, mobility can be increased by reducing the defect density in a bulk also with an In—Ga—Zn-based oxide.

For example, the "composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C(A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease; therefore, interface scattering of a transistor formed with the amorphous oxide semiconductor can be reduced, so that relatively high mobility can be obtained with relative ease.

In an oxide semiconductor having crystallinity, defects in the bulk can be more reduced, and mobility higher than that of the amorphous oxide semiconductor can be obtained by improving the surface flatness. To improve the surface flatness, the oxide semiconductor is preferably formed on a flat surface. Specifically, the oxide semiconductor may be formed on a surface with the average surface roughness (Ra) of less than or equal to 1 nm, preferably less than or equal to 0.3 nm, further preferably less than or equal to 0.1 nm.

The average surface roughness Ra is obtained by three-dimension expansion of center line average roughness that is defined by JIS B 0601 so as to be applied to a plane, and can be expressed as an "average value of the absolute values of deviations from a reference surface to a specific surface" and is defined by the formula below.

$$Ra = \frac{1}{S_0}\int_{y_1}^{y_2}\int_{x_1}^{x_2} |f(x,y) - Z_0| dx dy \qquad \text{[Formula 1]}$$

In the above formula, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents the average height of the measurement surface. The average surface roughness Ra can be measured with an atomic force microscope (AFM).

Further, it is preferable that the oxide semiconductor film 716 be highly purified (be made to be i-type or substantially i-type) by reduction of impurities such as moisture or hydrogen, which serve as electron donors (donors). This is because current generated in a state where a channel is not formed in the oxide semiconductor film 716 can be reduced.

Specifically, the concentration of hydrogen in the highly purified oxide semiconductor film 716 according to secondary ion mass spectrometry (SIMS) is less than or equal to $5 \times 10^{19}/cm^3$, preferably less than or equal to $5 \times 10^{18}/cm^3$, further preferably less than or equal to $5 \times 10^{17}/cm^3$, still further preferably less than or equal to $1 \times 10^{16}/cm^3$. The carrier density of the oxide semiconductor film according to Hall effect measurement is less than $1 \times 10^{14}/cm^3$, preferably less than $1 \times 10^{12}/cm^3$, further preferably less than $1 \times 10^{11}/cm^3$.

The analysis of the concentration of hydrogen in the oxide semiconductor film is described here. The hydrogen concentration of a semiconductor layer is measured by secondary ion mass spectrometry. It is known that it is difficult, in principle, to obtain correct data in the proximity of a top surface of a sample or in the proximity of an interface between stacked layers formed of different materials by SIMS. Thus, in the case where the distribution of the concentration of hydrogen in the layer in a thickness direction is analyzed by SIMS, an average value in a region of the layer in which the value is not greatly changed and substantially the same value can be obtained is adopted as the hydrogen concentration. Further, in the case where the thickness of the layer is small, a region where almost the same value can be obtained cannot be found in some cases due to the influence of the concentration of hydrogen in the adjacent layer. In that case, the maximum value or the minimum value of the hydrogen concentration in the region of the layer is adopted as the hydrogen concentration of the layer. Further, in the case where a mountain-shaped peak having the maximum value or a valley-shaped peak having the minimum value do not exist in the region of the layer, the value at the inflection point is adopted as the hydrogen concentration.

The oxide semiconductor film 716 can be formed by processing an oxide semiconductor film formed over the insulating film 713 into an appropriate shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor as a target. The oxide semiconductor film can be formed by a sputtering method in a rare gas (e.g., argon) atmosphere, an oxygen atmosphere, or a mixed atmosphere of a rare gas (e.g., argon) and oxygen.

When the oxide semiconductor film 716 is formed by a sputtering method, it is important to reduce water and hydrogen in the chamber as much as possible, in addition to the hydrogen concentration of the target. Specifically, for example, it is effective to perform baking of the chamber before deposition of the oxide semiconductor film, to reduce the concentration of water and hydrogen in a gas introduced into the chamber, and to prevent the counter flow in an evacuation system for exhausting a gas from the chamber.

The oxide semiconductor film 716 may also be formed by an evaporation method, a PCVD method, a PLD method, an ALD method, an MBE method, or the like instead of a sputtering method.

Before the oxide semiconductor film 716 is deposited by a sputtering method, dust on the top surface of the insulating film 713 may be removed by reverse sputtering in which an argon gas is introduced and plasma is generated. The reverse sputtering is a method in which voltage is applied to a substrate side, not to a target side, under an argon atmosphere by using an RF power supply and plasma is generated in the vicinity of the substrate to modify a top surface. Instead of the argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

In order that the oxide semiconductor film contains as little hydrogen, few hydroxyl groups, and little moisture as possible, impurities adsorbed on the substrate 700, such as moisture or hydrogen, may be eliminated and removed by preheating the substrate 700 provided with the elements up to and including the insulating films 712 and 713, in a preheating chamber of a sputtering apparatus as a pretreatment for film deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. This preheating treatment can be skipped. This preheating may be similarly performed on the substrate 700 provided with the elements up to and including a conductive layer 719 and a conductive layer 720 provided before deposition of a gate insulating film 721 in a later step.

The oxide semiconductor film 716 is preferably deposited by a sputtering method in an oxygen gas atmosphere at a substrate heating temperature in the range of 100° C. to 600° C., preferably 150° C. to 550° C., and further preferably 200° C. to 500° C. The thickness of the oxide semiconductor film 716 is greater than or equal to 1 nm and less than or equal to 40 nm, preferably greater than or equal to 3 nm and less than or equal to 20 nm. The higher the substrate heating temperature in the deposition is, the lower the impurity concentration of the oxide semiconductor film 716 is, and the more the atomic arrangement in the oxide semiconductor film 716 is ordered, and the higher the film density is, so that a polycrystal or CAAC (described later) is more likely to be formed. Further, a polycrystal or CAAC is also more likely to be formed by film deposition in an oxygen gas atmosphere because an unnecessary atom such as a rare gas does not enter the film. However, a mixed gas atmosphere of an oxygen gas and a rare gas may be used, in which case, the percentage of the oxygen gas is higher than or equal to 30 vol. %, preferably higher than or equal to 50 vol. %, further preferably higher than or equal to 80 vol. %. Thinner the oxide semiconductor film 716 is, less the short channel effect of the transistor is. However, when the oxide semiconductor film is too thin, the effect of interface scattering is intensified, which may lead to a reduction in field-effect mobility.

In the case of depositing an In—Ga—Zn—O-based material as the oxide semiconductor film 716 by a sputtering method, it is preferable to use an In—Ga—Zn—O target having an atomic ratio of In:Ga:Zn=1:1:1, 4:2:3, 3:1:2, 1:1:2, 2:1:3, or 3:1:4. With the In—Ga—Zn—O target having the above-described atomic ratio, a polycrystal or CAAC is more likely to be formed as the oxide semiconductor film 716.

In the case of depositing an In—Sn—Zn—O-based material as the oxide semiconductor film 716 by a sputtering method, it is preferable to use an In—Sn—Zn—O target having an atomic ratio of In:Sn:Zn=1:1:1, 2:1:3, 1:2:2, or 20:45:35. With the In—Sn—Zn—O target having the above-described atomic ratio, a polycrystal or CAAC is more likely to be formed as the oxide semiconductor film 716.

To remove moisture remaining in the process chamber, an entrapment vacuum pump is preferably used. For example, a cryopump, an ion pump, or a titanium sublimation pump is preferably used. As an evacuation unit, a turbo pump provided with a cold trap may be used. In the treatment chamber which is evacuated with the cryopump, for example, a hydrogen atom, a compound containing a hydrogen atom, such as water ($H_2O$), (further preferably, also a compound containing a carbon atom), and the like are removed, whereby the impurity concentration in the oxide semiconductor film deposited in the treatment chamber can be reduced.

As one example of the deposition condition, the following can be adopted: the distance between the substrate and the target is 100 mm, the pressure is 0.6 Pa, the direct-current (DC) power is 0.5 kW, and the atmosphere is an oxygen atmosphere (the proportion of the oxygen flow rate is 100%). A pulsed direct-current (DC) power supply is preferably used because dust generated in deposition can be reduced and the film thickness can be made uniform.

Further, by suppressing the leakage rate of the treatment chamber of the sputtering apparatus to be less than or equal to $1\times10^{-10}$ Pa·m$^3$/second, entry of impurities such as an alkali metal or hydride into the oxide semiconductor film in the deposition by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

Further, by using a target whose purity is greater than or equal to 99.99%, entering of alkali metal, hydrogen atoms, hydrogen molecules, water, hydroxyl groups, hydride, or the like to the oxide semiconductor film can be reduced. In addition, with such a target, the concentration of alkali metal such as lithium, sodium, or potassium can be reduced in the oxide semiconductor film.

An oxide semiconductor film formed by sputtering or the like contains moisture or hydrogen (including a hydroxyl group) as an impurity in some cases. Moisture or hydrogen is likely to form donor levels and is thus an impurity in the oxide semiconductor. In one embodiment of the present invention, in order to reduce impurities such as moisture or hydrogen in the oxide semiconductor film (for dehydration or dehydrogenation), the oxide semiconductor film 716 is subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less according to a dew point meter in a cavity ring down laser spectroscopy (CRDS) method).

By performing the heat treatment on the oxide semiconductor film 716, moisture or hydrogen in the oxide semiconductor film 716 can be released. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for 3 to 6 minutes. An RTA method used for the heat treatment enables dehydration or dehydrogenation in a short time; thus, treatment can be performed even at a temperature higher than the strain point of a glass substrate.

In this embodiment, an electrical furnace that is one of heat treatment apparatuses is used.

The heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment with a high-temperature gas. As the gas, an inert gas which does not react with an object by heat treatment, such as nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), further preferably greater than or equal to 7 N (99.99999%) (i.e., the impurity concentration is preferably less than or equal to 1 ppm, further preferably less than or equal to 0.1 ppm).

The heat treatment is preferably performed in such a manner that heat treatment is performed in a reduced pressure atmosphere or an inert atmosphere, and then the atmosphere is switched to an oxidation atmosphere with the temperature maintained, and heat treatment is further performed. When the heat treatment is performed in a reduced pressure atmosphere or an inert atmosphere, the impurity concentration in the oxide semiconductor film 716 can be reduced; however, oxygen vacancies are caused. By the heat treatment in the oxidation atmosphere, the oxygen vacancies can be repaired.

It has been pointed out that an oxide semiconductor is insensitive to impurities, there is no problem when a considerable amount of metal impurities is contained in the film, and even soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). Such consideration is not appropriate. Alkali metal is not a constituent element of an oxide semiconductor, and therefore, is an impurity. Likewise, alkaline earth metal is an impurity in the case where alkaline earth metal is not a constituent element of an oxide semiconductor. Alkali metal, in particular, Na becomes Na$^+$ by diffusion into an insulating film in contact with the oxide semiconductor layer when the insulating film is an oxide. Further, in the oxide semiconductor layer, Na cuts or enters a bond between metal and oxygen which are constituent elements of the oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics and variation in characteristics of the transistor due to the impurity become remarkable when the concentration of hydrogen in the oxide semiconductor layer is extremely low. Thus, when the concentration of hydrogen in the oxide semiconductor layer is less than or equal to $1\times10^{18}$ atoms/cm$^3$, preferably less than or equal to $1\times10^{17}$ atoms/cm$^3$, it is preferable that the concentration of the impurity be low. Specifically, the measurement value of the Na concentration by secondary ion mass spectrometry is preferably less than or equal to $5\times10^{16}$/cm$^3$, further preferably less than or equal to $1\times10^{16}/cm^3$, still further preferably less than or equal to $1\times10^{15}/cm^3$. Further, the measurement value of the Li concentration is preferably less than or equal to $5\times10^{15}/cm^3$, further preferably less than or equal to $1\times10^{15}/cm^3$. Further, the measurement value of the K concentration is preferably less than or equal to $5\times10^{15}/cm^3$, further preferably less than or equal to $1\times10^{15}/cm^3$.

Through the above steps, the concentration of hydrogen in the oxide semiconductor film 716 can be reduced and the oxide semiconductor film can be highly purified. Accordingly, the oxide semiconductor layer can be stable. In addition, heat treatment at a temperature of lower than or equal to the glass transition temperature makes it possible to form an oxide semiconductor film with a wide band gap in which carrier density is extremely low. Therefore, the transistor can be manufactured using a large-sized substrate, so that the productivity can be increased. In addition, by using the oxide semiconductor film in which the hydrogen concentration is reduced and the purity is improved, it is possible to manufacture a transistor whose withstand voltage is high and off-state current is extremely small. Accordingly, the field-effect mobility of the transistor can be increased to be close to an ideal field-effect mobility which is described later. The above heat treatment can be performed at any time after the oxide semiconductor film is formed.

The oxide semiconductor film is either amorphous or have crystallinity. For the oxide semiconductor film having crystallinity, a crystalline oxide semiconductor including a crystal with c-axis alignment (also referred to as c-axis aligned crystal (CAAC)), which has a triangular or hexagonal atomic arrangement when seen from the direction of an a-b plane, a top surface, or an interface of the film, may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis): this is preferable because an effect of increasing reliability of a transistor can be obtained.

In CAAC, metal atoms and oxygen atoms are bonded in an orderly manner in comparison with an amorphous oxide semiconductor. That is to say, in the case where an oxide semiconductor is amorphous, the coordination numbers might vary between metal atoms, whereas the coordination numbers of metal atoms are almost the same as each other in CAAC. Therefore, microscopic defects of oxygen can be reduced and instability and moving of charge that are due to attachment and detachment of hydrogen atoms (including hydrogen ions) or alkali metal atoms can be reduced.

Accordingly, a transistor is formed using an oxide semiconductor film including CAAC, whereby the amount of shift of the threshold voltage of the transistor, which is generated by light irradiation or a bias-temperature (BT) stress test performed on the transistor, can be reduced. Accordingly, a transistor having stable electric characteristics can be provided.

Here, the CAAC is described in detail. In a broad sense, a CAAC oxide means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC oxide is neither just single crystal nor just amorphous. Further, although the CAAC oxide includes a crystallized portion (crystalline portion), a boundary between one crystalline portion and another crystalline portion is not clear in some cases.

Nitrogen may be substituted for part of oxygen that is a constituent element of the CAAC. The c-axes of individual crystalline portions included in the CAAC may be aligned in one direction (e.g., a direction perpendicular to a surface of a substrate over which the CAAC is formed or a top surface of the CAAC). Further or alternatively, the normals of the a-b planes of the individual crystalline portions included in the CAAC may be aligned in one direction (e.g., the direction perpendicular to the surface of the substrate over which the CAAC is formed or the top surface of the CAAC).

The CAAC becomes a conductor, a semiconductor, or an insulator depending on its composition or the like. The CAAC transmits or does not transmit visible light depending on its composition or the like.

As an example of such CAAC, there is crystal which is formed into a film shape and has a triangular or hexagonal atomic arrangement when observed from the direction perpendicular to a top surface of the film or a surface of a supporting substrate, and in which metal atoms are arranged in a layered manner or metal atoms and oxygen atoms (or nitrogen atoms) are arranged in a layered manner when a cross section of the film is observed.

Example of a crystal structure of the CAAC are described in detail with reference to FIGS. 40A to 40E, FIGS. 41A to 41C, and FIGS. 42A to 42C. In FIGS. 40A to 40E, FIGS. 41A to 41C, and FIGS. 42A to 42C, the vertical direction corresponds to a c-axis direction and a plane perpendicular to the c-axis direction corresponds to an a-b plane, unless otherwise specified. The terms "upper half" and "lower half" refer to an upper half above the a-b plane and a lower half below the a-b plane (an upper half and a lower half with respect to the a-b plane), respectively. Further, in FIGS. 40A to 40E, O surrounded by a circle represents a tetracoordinate O atom, and O surrounded by a double circle represents a tricoordinate O atom.

Figure 40A:
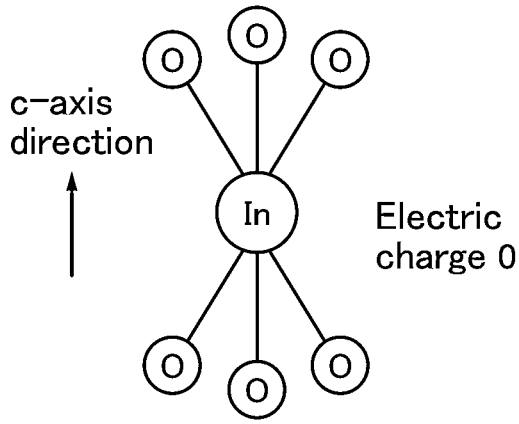
FIGS. 40A to 40E illustrate crystal structures of oxide semiconductors.

FIG. 40A illustrates a structure including one hexacoordinate In atom and six tetracoordinate oxygen (hereinafter referred to as tetracoordinate O) atoms proximate to the In atom. Here, a structure including only oxygen atoms proximate to one metal atom is referred to as a small group. The structure in FIG. 40A is actually an octahedral structure, but is illustrated as a planar structure for simplicity. Note that three tetracoordinate O atoms exist in each of an upper half and a lower half in FIG. 40A. Electric charge of the small group illustrated in FIG. 40A is 0.

Figure 40D:
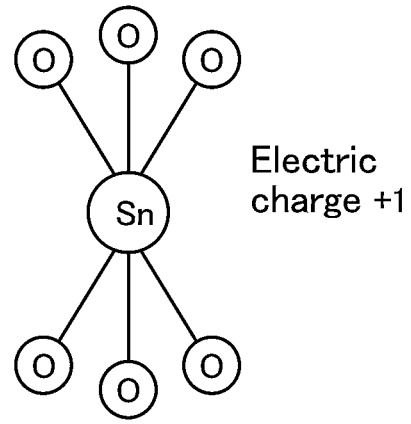
Figure 40B:
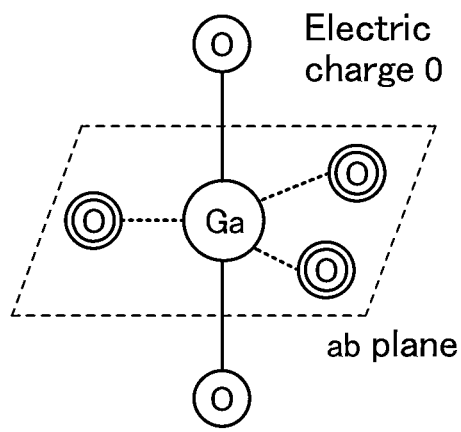

FIG. 40B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 40B. The structure illustrated in FIG. 40B can also be applied to an In atom which can have five ligands. Electric charge of the small group illustrated in FIG. 40B is 0.

Figure 40E:
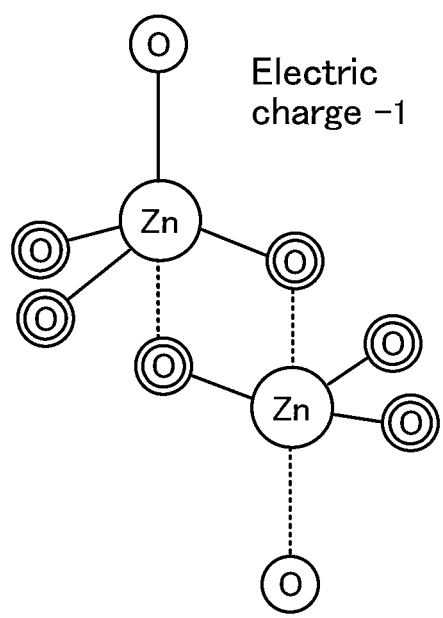
Figure 40C:
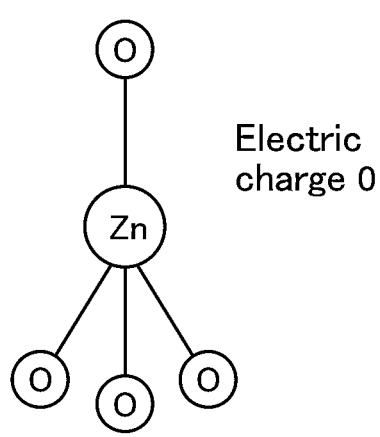

FIG. 40C illustrates a structure including one tetracoordinate Zn atom and four tetracoordinate O atoms proximate to the Zn atom. In FIG. 40C, one tetracoordinate O atom exists in an upper half and three tetracoordinate O atoms exist in a lower half. Alternatively, three tetracoordinate O atom may exist in the upper half and one tetracoordinate O may exist in the lower half in FIG. 40C. Electric charge of the small group illustrated in FIG. 40C is 0.

FIG. 40D illustrates a structure including one hexacoordinate Sn atom and six tetracoordinate O atoms proximate to the Sn atom. In FIG. 40D, three tetracoordinate O atoms exist in each of an upper half and a lower half. Electric charge of the small group illustrated in FIG. 40D is +1.

FIG. 40E illustrates a small group including two Zn atoms. In FIG. 40E, one tetracoordinate O atom exists in each of an upper half and a lower half. Electric charge of the small group illustrated in FIG. 40E is −1.

Here, a plurality of small groups is collectively called a medium group, and a plurality of medium groups is collectively called a large group (also referred to as a unit cell).

A rule of bonding between the small groups is described below. In FIG. 40A, the three O atoms in the upper half with respect to the In atom each have three proximate In atoms in the downward direction, and the three O atoms in the lower half each have three proximate In atoms in the upward direction. In FIG. 40B, the one O atom in the upper half with respect to the Ga atom has one proximate Ga atom in the downward direction, and the one O atom in the lower half has one proximate Ga atom in the upward direction. In FIG. 40C, the one O atom in the upper half with respect to the Zn atom has one proximate Zn atom in the downward direction, and the three O atoms in the lower half each have three proximate Zn atoms in the upward direction. Similarly, the number of the tetracoordinate O atoms above the metal atom is equal to the number of the metal atoms proximate to and below each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to either one of the pentacoordinate metal (Ga or In) atom and the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 41A illustrates a model of a medium group for a layered structure of an In—Sn—Zn—O system. FIG. 41B illustrates a large group consisting of three medium groups. FIG. 41C illustrates an atomic arrangement when the layered structure in FIG. 41B is observed from the c-axis direction.

In FIG. 41A, for simplicity, a tricoordinate O atom is omitted and the number of tetracoordinate O atoms is shown. For example, three tetracoordinate O atoms existing in each of an upper half and a lower half with respect to a Sn atom are denoted by circled 3. Similarly, in FIG. 41A, one tetracoordinate O atom existing in each of an upper half and a lower half with respect to an In atom is denoted by circled 1. FIG. 41A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group for the layered structure of the In—Sn—Zn—O system in FIG. 41A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 40E can be given. For example, with one small group including two Zn atoms, electric charge of one small group including a Sn atom can be cancelled, resulting in a total electric charge of the layered structure of 0.

Specifically, the large group illustrated in FIG. 41B is repeated, forming an In—Sn—Zn—O-based crystal ($In_2SnZn_3O_8$). The layered structure of the resulting In—Sn—Zn—O system can be expressed as a composition formula, $In_2SnZn_2O_7(ZnO)_m$ (m is 0 or a natural number).

The above-described rule also applies to the following oxides: an In—Sn—Ga—Zn-based oxide which is an oxide of four metal elements; an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, which is an oxide of three metal elements; an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide which is an oxide of two metal elements; an In-based oxide, a Sn-based oxide, or a Zn-based oxide, which is an oxide of single metal element; and the like.

For example, FIG. 42A illustrates a model of a medium group for a layered structure of an In—Ga—Zn—O system.

In the medium group for the layered structure of the In—Ga—Zn—O system in FIG. 42A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 42B illustrates a large group consisting of three medium groups. FIG. 42C illustrates an atomic arrangement in the case where the layered structure in FIG. 42B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group consisting of a combination of such small groups is always 0.

To form the layered structure of the In—Ga—Zn—O system, a large group can also be formed using a medium group in which the arrangement of the In atom, the Ga atom, and the Zn atom is different from that in FIG. 42A as well as the medium group illustrated in FIG. 42A.

Specifically, the large group illustrated in FIG. 42B is repeated, forming an In—Ga—Zn—O-based crystal. The layered structure of the resulting In—Ga—Zn—O system can be expressed as a composition formula, $InGaO_3(ZnO)_n$ (n is a natural number).

Figure 65A:
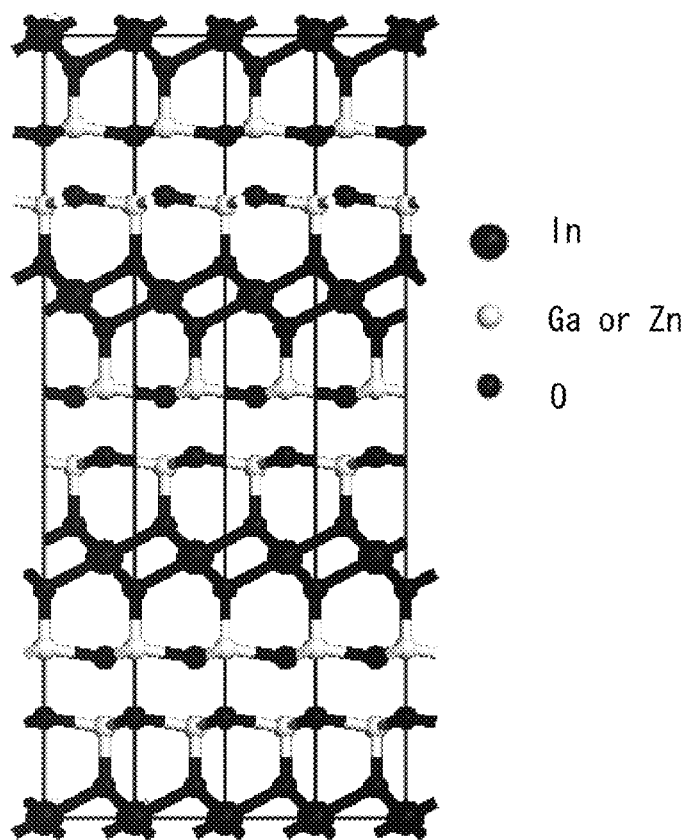
FIGS. 65A and 65B illustrate crystal structures of oxide semiconductors.

In the case where n=1 ($InGaZnO_4$), a crystal structure illustrated in FIG. 65A can be formed, for example. In the crystal structure in FIG. 65A, since a Ga atom and an In atom each have five ligands as described in FIG. 40B, Ga can be replaced with In in the structure.

Figure 65B:
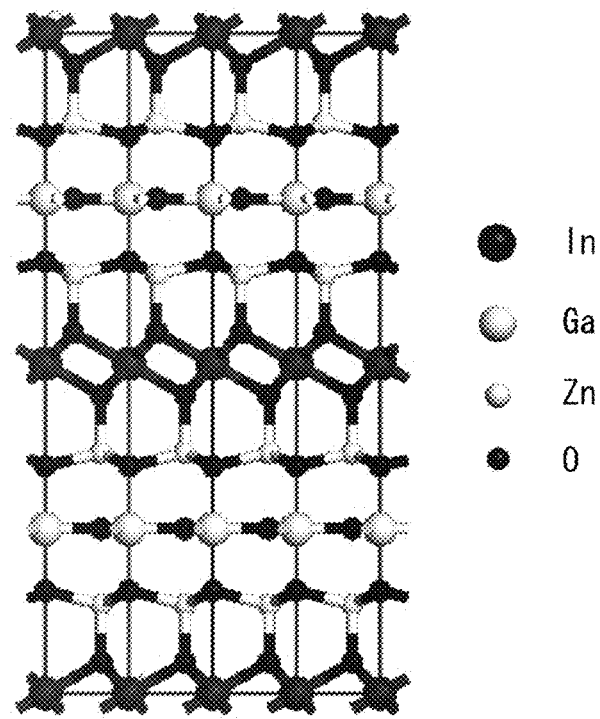

In the case where n=2 ($InGaZn_2O_5$), a crystal structure illustrated in FIG. 65B can be formed, for example. In the crystal structure in FIG. 65B, since a Ga atom and an In atom each have five ligands as described in FIG. 40B, Ga can be replaced with In in the structure.

An oxide semiconductor film including CAAC (hereinafter also referred to as a CAAC film) can be formed by a sputtering method. In the case where the CAAC film is formed by a sputtering method, the proportion of an oxygen gas in an atmosphere is preferably high. For a sputtering method in a mixed gas atmosphere of argon and oxygen, for example, the proportion of oxygen gas is preferably set to be 30% or higher, further preferably 40% or higher. This is because oxygen is supplied from the atmosphere to promote crystallization of the CAAC.

Further, in the case where the CAAC film is formed by a sputtering method, a substrate over which the CAAC film is formed is preferably heated to 150° C. or higher, further preferably heated to 170° C. or higher. This is because the higher the substrate temperature, the more the crystallization of the CAAC is promoted.

Further, after heat treatment is performed on the CAAC film in a nitrogen atmosphere or in vacuum, heat treatment is preferably performed in an oxygen atmosphere or a mixed gas of oxygen and another gas. This is because oxygen vacancies generated by the former heat treatment can be repaired by supply of oxygen from the atmosphere in the latter heat treatment.

Further, it is preferable that a film surface on which the CAAC film is formed (a deposition surface) be flat. This is because since the c-axis about perpendicular to the deposition surface exists in the CAAC film, roughness in the deposition surface induces generation of grain boundaries in the CAAC film. Thus, planarization treatment such as chemical mechanical polishing (CMP) is preferably performed on the deposition surface before the CAAC film is formed. The average roughness of the deposition surface is preferably 0.5 nm or less, further preferably 0.3 nm or less.

The oxide semiconductor film formed in the above-described manner is etched, thereby forming the oxide semiconductor layer 716 to have an island shape. The etching for forming the island-shaped oxide semiconductor film 716 to have an island shape may be dry etching, wet etching, or both dry etching and wet etching. As an etching gas used for the dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. To etch the film to have an appropriate shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor film 716 to have an island shape may be formed by an inkjet method. Formation of the resist mask by an inkjet method needs no photomask; thus, manufacturing cost can be reduced.

It is preferable that reverse sputtering be performed before a conductive film is formed in the next step so that resist residues and the like that attach onto the top surfaces of the oxide semiconductor film 716 and the insulating film 713 are removed.

Figure 43A:
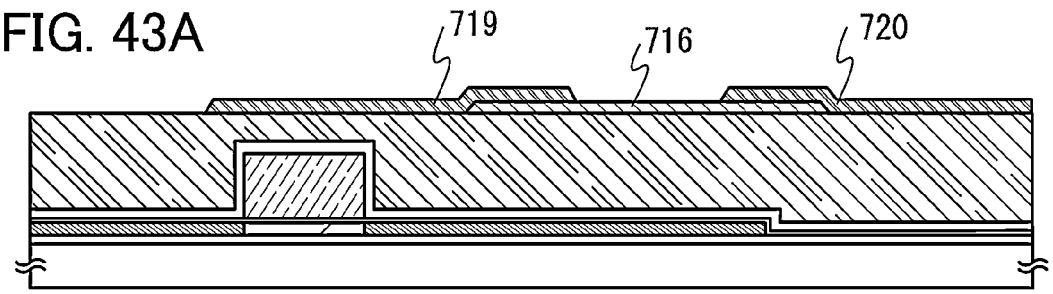
FIGS. 43A to 43D illustrate a manufacturing method of a semiconductor device.

Next, as shown in FIG. 43A, the conductive layer 719 which is in contact with the oxide semiconductor film 716, and the conductive layer 720 which is in contact with the oxide semiconductor film 716 are formed. The conductive layer 719 and the conductive layer 720 function as a source and drain electrodes.

Specifically, the conductive layers 719 and 720 can be formed in such a manner that a conductive film is formed by a sputtering method or a vacuum vapor deposition method and then processed into an appropriate shape.

For the conductive film for forming the conductive layers 719 and 720, any of the following materials can be used: an element selected from aluminum, chromium, copper, tantalum, titanium, molybdenum, or tungsten; an alloy including any of these elements; an alloy film including the above elements in combination; and the like. A structure may also be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film forming as the conductive layers 719 and 720 may have a single-layer structure or a stacked-layer structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Thus, by a staked-layer structure in which a conductive film including a Cu—Mg—Al alloy, a Mo—Ti alloy, Ti, or Mo is used for a lower layer and a conductive film including Cu is used for an upper layer for the conductive layers 719 and 720, the adhesion between an insulating film which is an oxide film and the conductive layers 719 and 720 can be increased.

For the conductive film forming the conductive layers 719 and 720, a conductive metal oxide may be used. As the conductive metal oxide, indium oxide, tin oxide, zinc oxide, an alloy of indium oxide and tin oxide, an alloy of indium oxide and zinc oxide, or the conductive metal oxide material containing silicon or silicon oxide can be used.

In the case where heat treatment is performed after formation of the conductive film, the conductive film preferably has heat resistance high enough to withstand the heat treatment.

Note that each material and etching conditions are adjusted as appropriate so that the oxide semiconductor film 716 is not removed as much as possible by etching of the conductive film. Depending on the etching conditions, an exposed portion of the oxide semiconductor film 716 may be partly etched, so that a groove (depression portion) may be formed.

In this embodiment, a titanium film is used for the conductive film. Therefore, wet etching can be selectively performed on the conductive film with a solution (ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

To reduce the number of photomasks and steps in a photolithography process, etching may be performed with the use of a resist mask formed using a multi-tone mask which is a light-exposure mask through which light is transmitted so as to have a plurality of intensities. The resist mask formed using a multi-tone mask has a plurality of thicknesses and can be changed in shape by etching; thus, the resist mask can be used in a plurality of etching steps for processing the film into different patterns. Therefore, a resist mask corresponding to at least two kinds or more of different patterns can be formed by one multi-tone mask. Thus, the number of light-exposure masks can be reduced and the number of photolithography steps can be reduced accordingly, whereby a manufacturing process can be simplified.

Further, an oxide conductive film functioning as a source and drain regions may be provided between the oxide semiconductor film 716 and the conductive films 719 and 720 functioning as a source and drain electrodes. A material of the oxide conductive film preferably contains zinc oxide as its component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive layers 719 and 720 may be performed concurrently.

With provision of the oxide conductive film functioning as a source and drain regions, resistance between the oxide semiconductor film 716 and the conductive films 719 and 720 can be lowered, which enables high speed operation of the transistor. In addition, with provision of the oxide conductive film functioning as a source and drain regions, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may also be performed using a mixture gas of oxygen and argon.

Figure 43B:
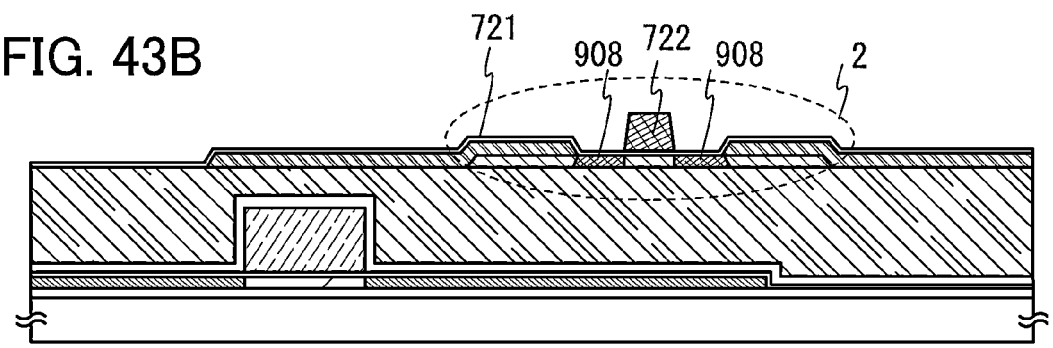

After the plasma treatment, as shown in FIG. 43B, a gate insulating film 721 is formed to cover the conductive layers 719 and 720 and the oxide semiconductor film 716. Then, a gate electrode 722 is formed over the gate insulating film 721 so as to overlap with the oxide semiconductor film 716.

Then, a dopant imparting n-type conductivity is added to the oxide semiconductor film 716 with the use of the gate electrode 722 as a mask, so that a pair of high-concentration regions 908 is formed. A region of the oxide semiconductor film 716 which overlaps with the gate electrode 722 with the gate insulating film 721 provided therebetween is a channel formation region. The oxide semiconductor film 716 includes the channel formation region between the pair of high-concentration regions 908. The dopant for forming the high-concentration regions 908 can be added by an ion implantation method. A rare gas such as helium, argon, and xenon; an atom belonging to Group 5, such as nitrogen, phosphorus, arsenic, and antimony; or the like can be used as the dopant. For example, when nitrogen is used as the dopant, it is preferable that the nitrogen atom concentration in the high-concentration regions 908 is greater than or equal to $5 \times 10^{19}/cm^3$ and less than or equal to $1 \times 10^{22}/cm^3$. The high-concentration region 908 to which the dopant imparting n-type conductivity is added has higher conductivity than other region in the oxide semiconductor film 716. Thus, with provision of the pair of high-concentration regions 908 in the oxide semiconductor film 716, resistance between the source and drain electrodes (the conductive layer 719 and the conductive layer 720) can be lowered.

By lowering the resistance between the source and drain electrodes (the conductive layer 719 and the conductive layer 720), high on-state current and high-speed operation can be secured even when the transistor 2 is miniaturized. Miniaturization of the transistor 2 leads to a reduction in size of the semiconductor device 1.

When an In—Ga—Zn—O-based oxide semiconductor is used for the oxide semiconductor film 716, heat treatment may be performed for about 1 hour at a temperature in the range of higher than or equal to 300° C. and lower than or equal to 600° C. after the addition of nitrogen, so that the oxide semiconductor in the high-concentration regions 908 has a wurtzite crystal structure. Owing to the wurtzite crystal structure of the oxide semiconductor in the high-concentration regions 908, the conductivity of the high-concentration regions 908 can be further increased and the resistance between the source and drain electrodes (the conductive layers 719 and 720) can be decreased. In order to effectively lower the resistance between the source and drain electrodes (the conductive layer 719 and the conductive layer 720) by forming an oxide semiconductor with a wurtzite crystal structure, it is preferable that the concentration of nitrogen atoms in the high-concentration region 908 be greater than or equal to $1\times10^{20}/cm^3$ and less than or equal to 7 at. % in the case where nitrogen is used as the dopant. However, even when the nitrogen atom concentration is less than the above-described lower limit, the oxide semiconductor having a wurtzite crystal structure can be obtained in some cases.

The gate insulating film 721 can be formed using a material and a stacked-layer structure which are similar to those of the gate insulating film 703. The gate insulating film 721 preferably contains impurities such as moisture or hydrogen as little as possible, and the gate insulating film 721 may be formed of a single-layer insulating film or a plurality of insulating films stacked. If hydrogen is contained in the gate insulating film 721, hydrogen may enter the oxide semiconductor film 716 or oxygen in the oxide semiconductor film 716 may be extracted by hydrogen, whereby the oxide semiconductor film 716 may have lower resistance (n-type conductivity); thus, a parasitic channel may be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor film 716 than the insulating film having a high barrier property. Then, the insulating film having a high barrier property is formed so as to overlap with the conductive layers 719 and 720 and the oxide semiconductor film 716 with the insulating film having a low proportion of nitrogen provided therebetween. With the insulating film having a high barrier property, impurities such as moisture or hydrogen can be prevented from entering the oxide semiconductor film 716, the gate insulating film 721, or the interface between the oxide semiconductor film 716 and another insulating film and the vicinity thereof. In addition, by providing the insulating film having a low proportion of nitrogen, such as a silicon oxide film or a silicon oxynitride film, so as to be in contact with the oxide semiconductor film 716, the insulating film having a high barrier property can be prevented from being in direct contact with the oxide semiconductor film 716.

In this embodiment, the gate insulating film 721 has a structure in which a 100-nm-thick silicon nitride film formed by a sputtering method is stacked over a 200-nm-thick silicon oxide film formed by a sputtering method. The substrate temperature in film formation may be higher than or equal to room temperature and lower than or equal to 300° C. and in this embodiment, is 100° C.

After the gate insulating film 721 is formed, heat treatment may be performed thereon. The heat treatment is performed in a nitrogen atmosphere, ultra-dry air, or a rare gas (e.g., argon or helium) atmosphere preferably at a temperature in the range of 200° C. to 400° C., for example, 250° C. to 350° C. It is preferable that the water content in the gas be 20 ppm or less, preferably 1 ppm or less, further preferably 10 ppb or less. In this embodiment, for example, heat treatment is performed for 1 hour at 250° C. in a nitrogen atmosphere. Alternatively, RTA treatment for a short time at a high temperature may be performed before the conductive layers 719 and 720 are formed in a manner similar to that of the heat treatment performed on the oxide semiconductor film for reduction of moisture or hydrogen. Even when oxygen vacancies are generated in the oxide semiconductor film 716 by the heat treatment performed on the oxide semiconductor film 716, oxygen is supplied to the oxide semiconductor film 716 from the gate insulating film 721 by performing heat treatment after the gate insulating film 721 containing oxygen is provided, so that oxygen vacancies that serve as donors can be reduced in the oxide semiconductor film 716 and the stoichiometric composition ratio can be satisfied. The oxide semiconductor film 716 preferably contains oxygen whose composition exceeds that in the stoichiometric composition ratio. As a result, the oxide semiconductor film 716 can be made to be substantially intrinsic and variation in electrical characteristics of the transistor due to oxygen vacancies can be reduced; thus, electrical characteristics can be improved. The timing of this heat treatment is not particularly limited as long as it is after the formation of the gate insulating film 721; this heat treatment may also serve as heat treatment in another step (e.g., heat treatment in formation of a resin film or heat treatment for lowering the resistance of a transparent conductive film), in which case the oxide semiconductor film 716 can be made to be substantially intrinsic without an increase in the number of manufacturing steps.

Further or alternatively, heat treatment may be performed on the oxide semiconductor film 716 in an oxygen atmosphere to add oxygen to the oxide semiconductor, so that oxygen vacancies that serve as donors in the oxide semiconductor film 716 may be reduced. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is preferably less than or equal to 1 ppm, further preferably less than or equal to 0.1 ppm).

Further or alternatively, oxygen may be added to the oxide semiconductor film 716 by an ion implantation method, an ion doping method, or the like, so that oxygen vacancies that serve as donors may be reduced. For example, oxygen made to be plasma with a microwave of 2.45 GHz may be added to the oxide semiconductor film 716.

The gate electrode 722 can be formed in a manner such that a conductive film is formed over the gate insulating film 721 and then is etched. The gate electrode 722 can be formed using a material similar to any of those of the gate electrode 707 and the conductive layers 719 and 720.

The thickness of the gate electrode 722 is 10 nm to 400 nm, preferably 100 nm to 200 nm. In this embodiment, a 150-nm-thick conductive film for the gate electrode is formed by a sputtering method using a tungsten target, and then is etched into an appropriate shape, so that the gate electrode 722 is formed. Note that a resist mask may be formed by an inkjet method. Formation of the resist mask by an inkjet method needs no photomask; thus, manufacturing cost can be reduced.

Through the above process, the transistor 2 is formed.

In the transistor 2, the source and drain electrodes (the conductive layers 719 and 720) do not overlap with the gate electrode 722. In other words, a gap which is larger than the thickness of the gate insulating film 721 is provided between the gate electrode 722 and each of the source and drain electrodes (the conductive layer 719 and the conductive layer 720). Thus, the parasitic capacitance between the source electrode and the gate electrode and between the drain electrode and the gate electrode in the transistor 2 can be suppressed to be low, which enables high-speed operation.

Although the transistor 2 is described as a single-gate transistor, a multi-gate transistor including a plurality of gate electrodes which is electrically connected to each other and is accompanied by a plurality of channel formation regions may be formed when needed.

The insulating film in contact with the oxide semiconductor film 716 (the gate insulating film 721 and the insulating film 713 in this embodiment) may be formed using an insulating material containing a Group 13 element and oxygen. Many of oxide semiconductor materials contain elements of Group 13, and an insulating material containing a Group 13 element is compatible with such an oxide semiconductor; thus, by using the insulating material containing a Group 13 element for the insulating film in contact with the oxide semiconductor layer, the state of the interface between the oxide semiconductor layer and the insulating film can be kept favorable.

An insulating material containing a Group 13 element is an insulating material containing one or more elements that belong to Group 13. As the insulating material containing a Group 13 element, gallium oxide, aluminum oxide, aluminum gallium oxide, gallium aluminum oxide, and the like are given. Here, aluminum gallium oxide refers to a substance in which the amount of aluminum is larger than that of gallium in atomic percent, and gallium aluminum oxide refers to a substance in which the amount of gallium is larger than or equal to that of aluminum in atomic percent.

For example, by using a material containing gallium oxide for an insulating film in contact with an oxide semiconductor film containing gallium, favorable interface characteristics between the oxide semiconductor film and the insulating film can be kept. For example, an insulating film containing gallium oxide is provided in contact with the oxide semiconductor film, pileup of hydrogen at the interface between the oxide semiconductor film and the insulating film can be reduced. A similar effect can be obtained in the case where an element belonging to the same group as a constituent element of the oxide semiconductor is used for the insulating film. For example, it is effective to form an insulating film with the use of a material containing aluminum oxide. Note that water is less likely to permeate aluminum oxide; thus, it is preferable to use such a material containing aluminum oxide in terms of preventing entry of water to the oxide semiconductor layer.

The insulating film which is in contact with the oxide semiconductor film 716 preferably contains oxygen in a proportion higher than that in the stoichiometric composition, by heat treatment in an oxygen atmosphere, by oxygen doping, or the like. The "oxygen doping" refers to addition of oxygen into a bulk. Note that the term "bulk" is used in order to clarify that oxygen is added not only to a top surface of a thin film but also to the inside of the thin film. In addition, the oxygen doping encompasses oxygen plasma doping in which oxygen which is made to be plasma is added to a bulk. The oxygen doping may be performed by an ion implantation method or an ion doping method.

For example, in the case where gallium oxide is used for the insulating film which is in contact with the oxide semiconductor film 716, the composition of gallium oxide can be set to be $Ga_2O_X$ ($X=3+\alpha$, $0<\alpha<1$) by heat treatment in an oxygen atmosphere or oxygen doping.

In the case where aluminum oxide is used for the insulating film which is in contact with the oxide semiconductor film 716, the composition of aluminum oxide can be set to be $Al_2O_X$ ($X=3+\alpha$, $0<\alpha<1$) by heat treatment in an oxygen atmosphere or oxygen doping.

In the case where gallium aluminum oxide (aluminum gallium oxide) is used for the insulating film which is in contact with the oxide semiconductor film 716, the composition of gallium aluminum oxide (aluminum gallium oxide) can be set to be $Ga_XAl_{2-X}O_{3+\alpha}$ ($0<X<2$, $0<\alpha<1$) by heat treatment in an oxygen atmosphere or oxygen doping.

The oxygen doping enables an insulating film which includes a region where the proportion of oxygen is higher than that in the stoichiometric composition to be formed. When the insulating film including such a region is in contact with the oxide semiconductor film, oxygen that exists excessively in the insulating film is supplied to the oxide semiconductor film, and oxygen vacancies in the oxide semiconductor film or at the interface between the oxide semiconductor film and the insulating film is reduced, whereby the oxide semiconductor film can be made to be intrinsic or substantially intrinsic.

The insulating film including a region where the proportion of oxygen is higher than that in the stoichiometric composition may be applied to either the insulating film placed on an upper side of the oxide semiconductor film or the insulating film placed on a lower side of the oxide semiconductor film of the insulating films which are in contact with the oxide semiconductor film 716; however, it is preferable to apply such an insulating film to both the insulating films which are in contact with the oxide semiconductor film 716. The above effect can be enhanced with a structure where the oxide semiconductor film 716 is sandwiched between the insulating films each including a region where the proportion of oxygen is higher than that in the stoichiometric composition, which are used as the insulating films in contact with the oxide semiconductor film 716 and positioned on the upper side and the lower side of the oxide semiconductor film 716.

The insulating films provided on the upper side and the lower side of the oxide semiconductor film 716 may contain the same constituent element or different constituent elements. For example, the insulating films on the upper side and the lower side may be both formed of gallium oxide whose composition is $Ga_2O_X$ ($X=3+\alpha$, $0<\alpha<1$). Alternatively, one of the insulating films on the upper side and the lower side may be formed of $Ga_2O_X$ ($X=3+\alpha$, $0<\alpha<1$) and the other may be formed of aluminum oxide whose composition is $Al_2O_X$ ($X=3+\alpha$, $0<\alpha<1$).

The insulating film which is in contact with the oxide semiconductor film 716 may be formed of a stack of insulating films each including a region where the proportion of oxygen is higher than that in the stoichiometric composition. For example, the insulating film on the upper side of the oxide semiconductor film 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) may be formed thereover. Note that the insulating film on the lower side of the oxide semiconductor film 716 may be formed of a stack of insulating films each including a region where the proportion of oxygen is higher than that in the stoichiometric composition. Alternatively, both the insulating films on the upper side and the lower side of the oxide semiconductor film 716 may be formed of a stack of insulating films each including a region where the proportion of oxygen is higher than that in the stoichiometric composition.

Figure 43C:
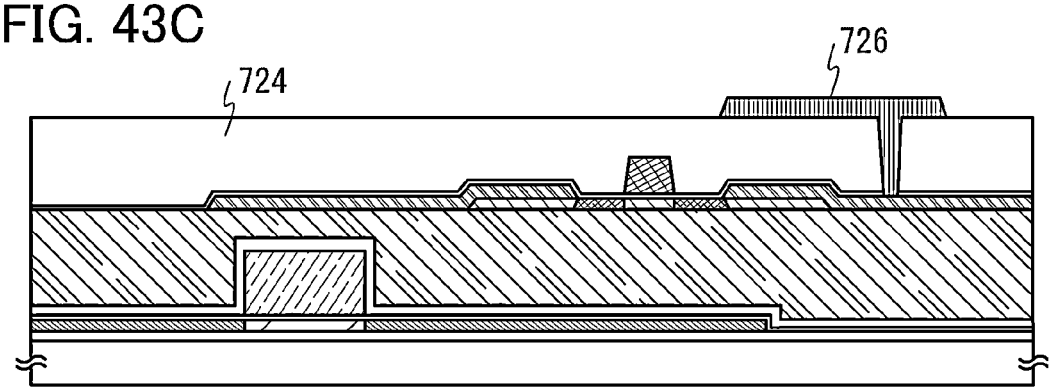

Next, as shown in FIG. 43C, an insulating film 724 is formed so as to cover the gate insulating film 721 and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. It is preferable that for the insulating film 724, a material whose dielectric constant is low or a structure whose dielectric constant is low (e.g., a porous structure) be used. This is because a reduction in the dielectric constant of the insulating film 724 leads to a reduction in parasitic capacitance generated between wirings or electrodes, which results in higher speed operation. Although the insulating film 724 has a single-layer structure in this embodiment, one embodiment of the present invention is not limited to this structure; a stacked-layer structure of two or more layers may be employed.

Next, an opening is formed in the gate insulating film 721 and the insulating film 724, so that part of the conductive layer 720 is exposed. After that, a wiring 726 which is in contact with the conductive layer 720 through the opening is formed over the insulating film 724.

The wiring 726 is formed in such a manner that a conductive film is formed by a PVD method or a CVD method and then is processed by etching. As a material of the conductive film, an element selected from aluminum, chromium, copper, tantalum, titanium, molybdenum, and tungsten; an alloy containing any of these elements as its component; or the like can be used. A material containing one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by a PVD method and a thin titanium film (with a thickness of about 5 nm) is formed by a PVD method, and then an aluminum film is formed so as to fill the opening. Here, the titanium film formed by a PVD method has a function of reducing an oxide film (e.g., a native oxide film) formed on a surface on which the titanium film is formed, to decrease the contact resistance with the lower electrode or the like (here, the conductive layer 720). In addition, hillock of the aluminum film can be prevented. A copper film may be formed by a plating method after the formation of the barrier film of titanium, titanium nitride, or the like.

Further, it is necessary to electrically connect the gate electrode 722 and one of the pair of impurity regions 709, to which the above-described method can be applied.

Figure 43D:
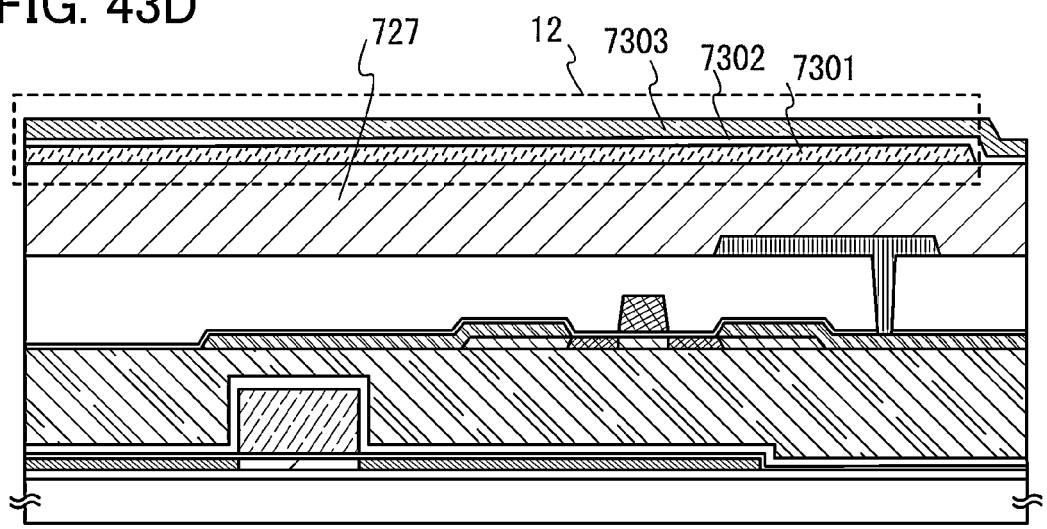

Next, an insulating film 727 is formed so as to cover the wiring 726 as shown in FIG. 43D. Further, a conductive film is formed over the insulating film 727 and then is etched, so that a conductive layer 7301 is formed. After that, an insulating film 7302 is formed so as to cover the conductive layer 7301, and a conductive film 7303 is formed over the insulating film 7302. Thus, a capacitor 12 can be formed. One of a pair of electrodes of the capacitor 12 corresponds to the conductive layer 7301, the other of the pair of electrodes of the capacitor 12 corresponds to the conductive film 7303, and a dielectric layer of the capacitor 12 corresponds to the insulating film 7302. The insulating films 727 and 7302 can be formed using materials similar to those of other insulating films, and the conductive layer 7301 and the conductive film 7303 can be formed using materials similar to those of other conductive layers.

Through the series of steps, the semiconductor device can be formed.

This embodiment can be implemented combining with another embodiment as appropriate.

In the case where a semiconductor substrate is used for the substrate 700, for example, as shown in FIG. 2 in Patent Document 2, the Si transistor 5 may be formed to include the semiconductor substrate and the transistor 2 may be formed over the Si transistor 5.

Reference

Patent Document 2: Japanese Published Patent Application No. 2010-141230

Embodiment 13

In this embodiment, a transistor 2 which uses an oxide semiconductor film and has a structure different from that in Embodiment 12 is described. The same portions as those in FIGS. 43A to 43D are denoted by the same reference numerals and the description thereof is skipped.

Figure 44A:
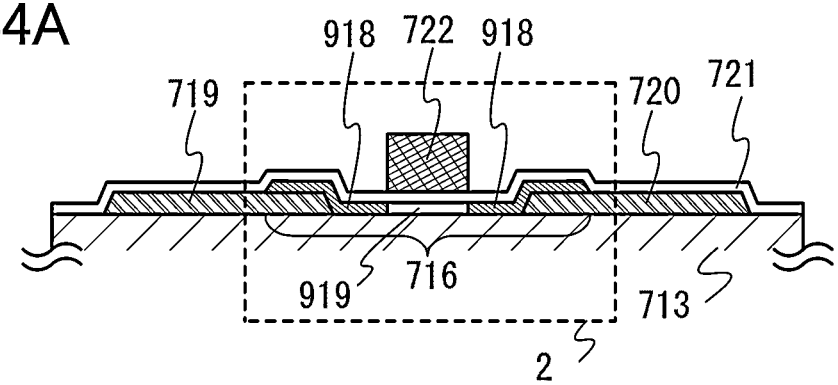
FIGS. 44A to 44C each illustrate a transistor in Embodiment 13.

A transistor 2 shown in FIG. 44A is a top-gate transistor in which a gate electrode 722 is formed over an oxide semiconductor film 716, and is also a bottom-contact transistor in which a source and drain electrodes (conductive layers 719 and 720) are formed below the oxide semiconductor film 716.

The oxide semiconductor film 716 includes a pair of high-concentration regions 918 that can be formed by addition of a dopant imparting n-type conductivity to the oxide semiconductor film 716 after the formation of the gate electrode 722. In addition, in the oxide semiconductor film 716, a region which overlaps with the gate electrode 722 with a gate insulating film 721 provided therebetween is a channel formation region 919. The oxide semiconductor layer 716 includes the channel formation region 919 between the pair of high-concentration regions 918.

The high-concentration regions 918 can be formed in a manner which is similar to that of the high-concentration regions 908 described in Embodiment 12.

Figure 44B:
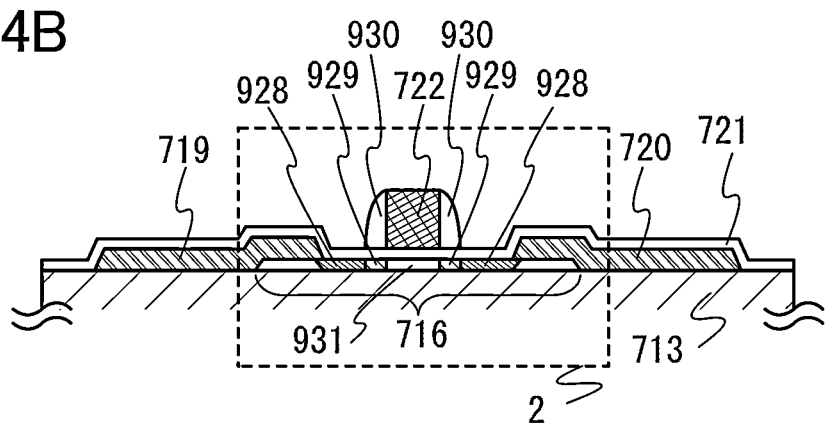

A transistor 2 shown in FIG. 44B is a top-gate transistor in which a gate electrode 722 is formed over an oxide semiconductor film 716 and is also a bottom-contact transistor in which a source and drain electrodes (conductive layer 719 and the conductive layer 720) are formed over the oxide semiconductor layer 716. The transistor 2 further includes a sidewall 930 that is provided on the side surface of the gate electrode 722 and is formed using an insulating film.

The oxide semiconductor film 716 includes a pair of high-concentration regions 928 and a pair of low-concentration regions 929 which are formed by addition of a dopant imparting n-type conductivity to the oxide semiconductor film 716 after formation of the gate electrode 722. In addition, a region of the oxide semiconductor film 716 which overlaps with the gate electrode 722 with the gate insulating film 721 provided therebetween is a channel formation region 931. The oxide semiconductor film 716 includes the pair of low-concentration regions 929 between the pair of high-concentration regions 928 and the channel formation region 931 between the pair of low-concentration regions 929. Further, the pair of low-concentration regions 929 is provided in a region of the oxide semiconductor film 716 which overlaps with the sidewall 930 with the gate insulating film 721 provided therebetween.

The high-concentration regions 928 and the low-concentration regions 929 can be formed in a manner which is similar to that of the high-concentration regions 908 described in Embodiment 12.

Figure 44C:
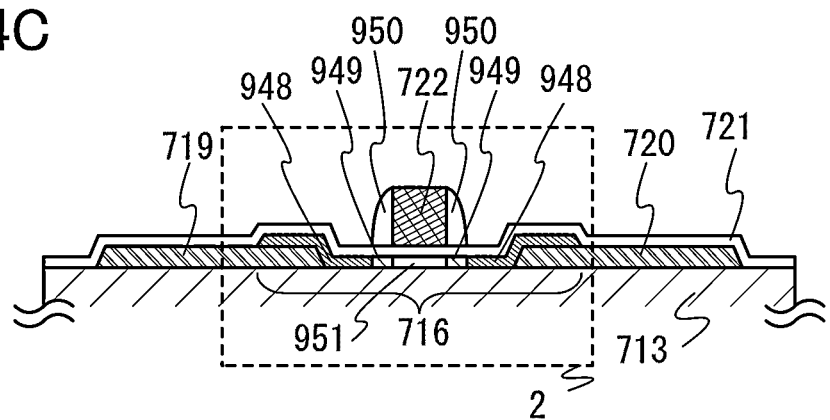

A transistor 2 shown in FIG. 44C is a top-gate transistor in which a gate electrode 722 is formed over an oxide semiconductor film 716 and is also a bottom-contact transistor in which a source and drain electrodes (conductive layers 719 and 720) are formed below the oxide semiconductor film 716. The transistor 2 further includes a sidewall 950 that is provided on the side surface of the gate electrode 722 and is formed using an insulating film.

The oxide semiconductor film 716 includes a pair of high-concentration regions 948 and a pair of low-concentration regions 949 that are formed by addition of a dopant imparting n-type conductivity to the oxide semiconductor film 716 after the formation of the gate electrode 722. In addition, in the oxide semiconductor film 716, a region which overlaps with the gate electrode 722 with the gate insulating film 721 provided therebetween is a channel formation region 951. In the oxide semiconductor film 716, the pair of low-concentration regions 949 is provided between the pair of high-concentration regions 948, and the channel formation region 951 is provided between the pair of low-concentration regions 949. The pair of low-concentration regions 949 is provided in a region which is in the oxide semiconductor film 716 and overlaps with the sidewall 950 with the gate insulating film 721 provided therebetween.

The high-concentration regions 948 and the low-concentration regions 949 can be formed in a manner similar to that of the high-concentration regions 908 described in Embodiment 12.

As one of methods for forming high-concentration regions functioning as a source and drain regions in a transistor using an oxide semiconductor in a self-aligned manner, a method is disclosed in which a surface of an oxide semiconductor film is exposed and argon plasma treatment is performed thereon to reduce resistance of the region in the oxide semiconductor layer which is exposed to plasma (S. Jeon et al. "180 nm Gate Length Amorphous InGaZnO Thin Film Transistor for High Density Image Sensor Applications", *IEDM Tech. Dig.*, pp. 504-507, 2010).

However, in the above-described method, a gate insulating film needs to be partly removed after formation of the gate insulating film so that portions corresponding to the source and drain regions are exposed. Therefore, in partly removing the gate insulating film, part of the underlying oxide semiconductor film below is also over-etched, by which the thickness of the portions corresponding to the source and drain regions is reduced. Consequently, the resistance of the source and drain regions increases, and defects in characteristics of the transistor due to over-etching is more likely to occur.

For further miniaturization of a transistor, it is necessary to adopt a dry-etching method featuring high process accuracy. However, the above-described over-etching remarkably tends to occur in the dry-etching method by which the selection ratio of the gate insulating film to the oxide semiconductor film cannot be sufficiently provided.

For example, although over-etching does not matter as long as the oxide semiconductor film is sufficiently thick, it is necessary that the thickness of part of the oxide semiconductor film which corresponds to a channel formation region be less than or equal to 20 nm, preferably less than or equal to 10 nm when the channel length is less than or equal to 200 nm, considering prevention of a short-channel effect. When such a thin oxide semiconductor film is processed, the over etching of the oxide semiconductor layer is not preferable because an increase in the resistance of the source and drain regions is caused, and defects of the transistor characteristics are generated, as described above.

However, by adding a dopant to the oxide semiconductor film in the state where the oxide semiconductor film is not exposed and the gate insulating film remains, as is in one embodiment of the present invention, the over-etching of the oxide semiconductor film can be prevented and excessive damage to the oxide semiconductor film can be suppressed. In that case also, the interface between the oxide semiconductor film and the gate insulating film can be kept clean. Accordingly, the characteristics and reliability of the transistor can be improved.

This embodiment can be implemented combining with another embodiment as appropriate.

Embodiment 14

In this embodiment, a transistor using an oxide semiconductor layer and has a different structure from that of the transistor according to Embodiment 12 or Embodiment 13. In this embodiment, a transistor which uses an oxide semiconductor film and has a structure different from those in Embodiments 12 and 13 is described. The same portions as those in FIGS. 43A to 43D are denoted by the same reference numerals and the description thereof is skipped. In a transistor 2 described in this embodiment, a gate electrode 722 is provided so as to overlap with a conductive layer 719 and a conductive layer 720. In addition, the transistor 2 of this embodiment is different from the transistor 2 described in Embodiment 12 or 13 in that an impurity element imparting conductivity is not added to an oxide semiconductor film 716 with the gate electrode 722 as a mask.

Figure 45A:
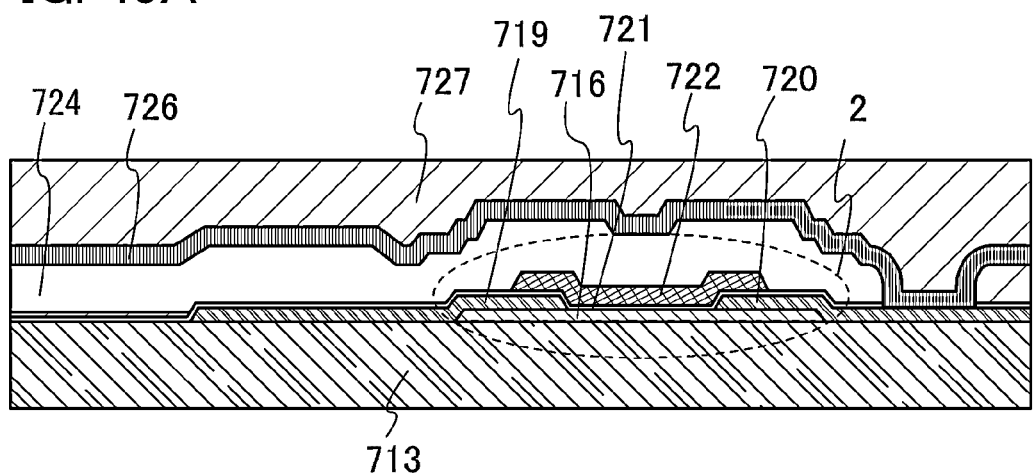
FIGS. 45A and 45B each illustrate a transistor in Embodiment 14.
Figure 45B:
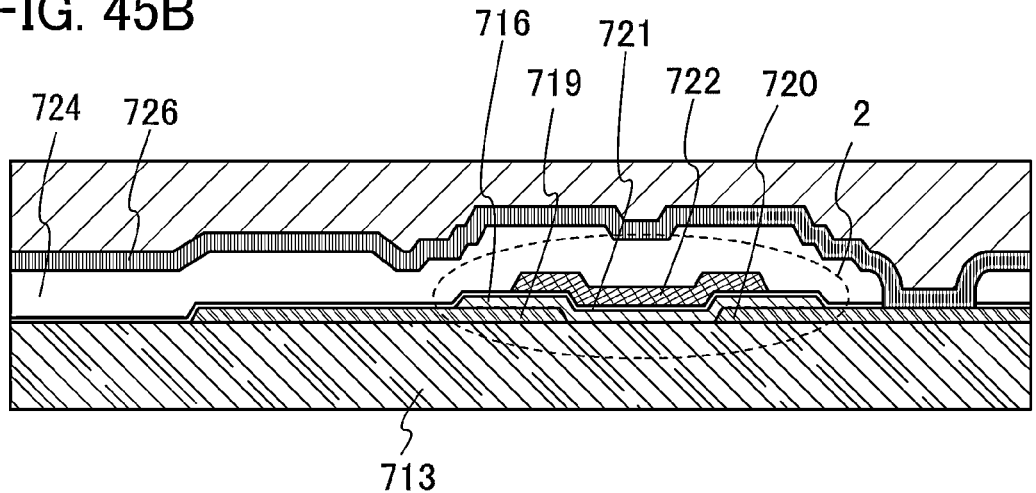

FIG. 45A illustrates an example of the transistor 2 in which the oxide semiconductor film 716 is provided below the conductive layers 719 and 720, whereas FIG. 45B illustrates an example of the transistor 2 in which the oxide semiconductor film 716 is provided above the conductive layers 719 and 720. Although an upper surface of an insulating film 724 is not flattened in FIGS. 45A and 45B, embodiments of the present invention are not limited to this structure. The upper surface of the insulating film 724 may be planarized.

This embodiment can be implemented combining with another embodiment as appropriate.

Embodiment 15

The electrical characteristics (particularly, the field-effect mobility) of a transistor including an oxide semiconductor film in a channel region are described in this embodiment.

The field-effect mobility of an insulated gate transistor tends to be measured lower than its inherent field-effect mobility for a variety of reasons; this phenomenon occurs not only in the case of using an oxide semiconductor. One of the causes for a reduction in the field-effect mobility is a defect inside a semiconductor or a defect at an interface between the semiconductor and an insulating film. However, the field-effect mobility on the assumption that no defect exists inside the semiconductor can be calculated theoretically by using a Levinson model.

Assuming that the inherent field-effect mobility of the transistor is $\mu_0$ and a potential barrier (such as a grain boundary) exists in the semiconductor, the measured field-effect mobility μ is expressed by Formula 2.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. Providing that the potential barrier is attributed to a defect, the height of the potential barrier E is expressed by Formula 3 according to the Levinson model.

$$E = \frac{e^2 N^2}{8\varepsilon n} = \frac{e^3 N^2 t}{8\varepsilon C_{ox} V_{gs}} \quad \text{[Formula 3]}$$

In the formula, e represents the elementary charge, N represents the average defect density per unit area of a channel, $\in$ represents the dielectric constant of the semiconductor, n represents the carrier density per unit area of the channel, $C_{ox}$ represents the capacitance of the gate insulating film per unit area, $V_{gs}$ represents the gate voltage, and t represents the thickness of the channel. In the case where the thickness of the semiconductor layer is 30 nm or less, the thickness of the channel can be regarded as being the same as the thickness of the semiconductor layer. The drain current $I_{ds}$ in a linear region is expressed by Formula 4.

$$I_d = \frac{W \mu V_g V_d C_{ox}}{L} \exp\left(-\frac{E}{kT}\right) \quad \text{[Formula 4]}$$

In the formula, L represents the channel length and W represents the channel width, and L and W are each set at 10 μm. In addition, $V_d$ represents the drain voltage. Dividing both sides of the above formula by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g} \quad \text{[Formula 5]}$$

The right side of Formula 5 is a function of $V_g$. As seen from Formula 5, the defect density N can be obtained from the slope of a line showing a relation between $\ln(I_d/V_g)$ indicated in the ordinate and $1/V_g$ indicated in the abscissa. That is, the defect density N can be obtained from the $I_d$—$V_g$ characteristics of the transistor. The defect density N of an oxide semiconductor in which the ratio of indium (In), tin (Sn), and zinc (Zn) is 1:1:1 is about $1 \times 10^{12}/cm^2$.

Calculating with Formulae 2 and 3 on the basis of the above defect density N, the inherent field-effect mobility $\mu_0$ comes to be 120 cm²/Vs. The measured mobility of an In—Sn—Zn oxide including a defect is about 35 cm²/Vs. However, assuming that no defect exists inside the semiconductor and at the interface between the semiconductor and an insulating film, the mobility $\mu_0$ of the oxide semiconductor is expected to be 120 cm²/Vs.

Further, even when no defect exists inside the semiconductor, scattering at an interface between the channel and the gate insulating film adversely affects the transport properties of the transistor. The field-effect mobility $\mu_1$ at a position that is distance x away from the interface between the channel and the gate insulating film is expressed by Formula 6.

$$\frac{1}{\mu_1} = \frac{1}{\mu_0} + \frac{D}{B}\exp\left(-\frac{x}{G}\right) \quad \text{[Formula 6]}$$

Here, D represents the electric field intensity in the direction of the gate electrode, and B and G represent constants. Values of B and G can be obtained from actual measurement results; according to the above-described measurement, B is $4.75 \times 10^7$ cm/s and G is 10 nm (depth to which interface scattering reaches). As D is increased, i.e., as the gate voltage is increased, the second term of Formula 6 increases and accordingly the field-effect mobility $\mu_1$ decreases.

Figure 46:
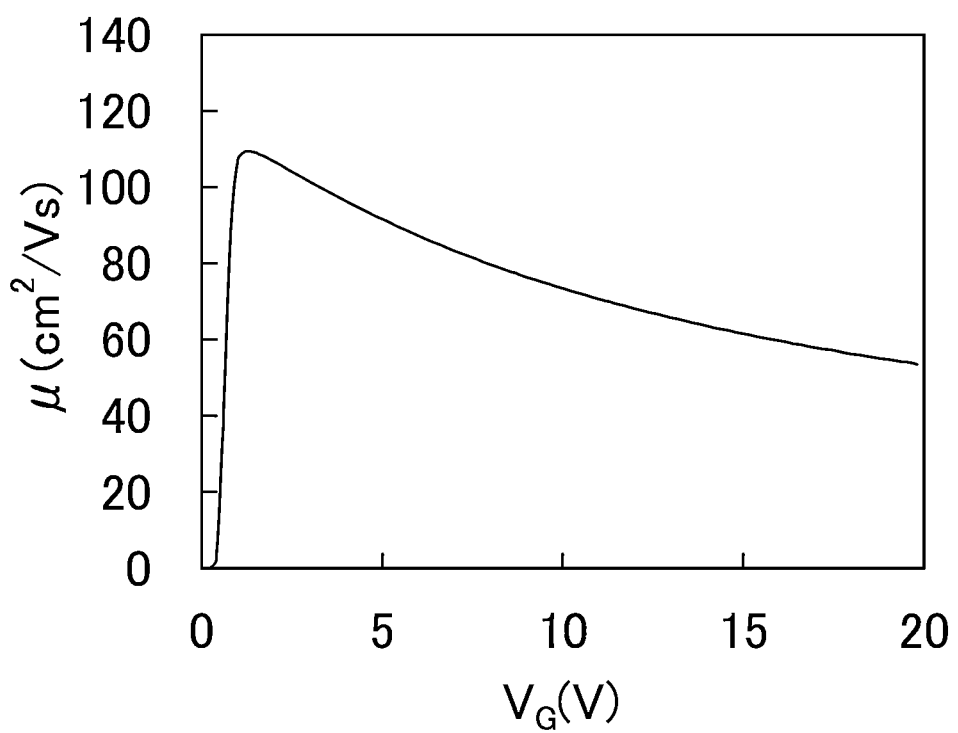
FIG. 46 shows gate voltage dependence of mobility according to calculation.

FIG. 46 shows calculation results of the field-effect mobility $\mu_2$ of a transistor using for a channel an ideal oxide semiconductor in which no defect exists inside the semiconductor. For the calculation, Sentaurus Device manufactured by Synopsys, Inc. was used, and the band gap, the electron affinity, the relative permittivity, and the thickness of the oxide semiconductor were set at 2.8 eV, 4.7 eV, 15, and 15 nm, respectively. These values were obtained by measurement of a thin film formed by a sputtering method.

Further, the work function of a gate of the transistor was set at 5.5 eV and that of each of a source and a drain of the transistor was set at 4.6 eV. The thickness of the gate insulating film was set at 100 nm, and the relative permittivity thereof was set at 4.1. The channel length and the channel width were each set at 10 μm and the drain voltage was set at 0.1 V.

As shown in FIG. 46, the field-effect mobility has a peak of 100 cm²/Vs or more at a gate voltage over 1 V, and then decreases as the gate voltage becomes higher because the interface scattering increases. To reduce interface scattering, it is desirable that a top surface of the semiconductor layer be flat at the atomic level (atomic layer flatness).

Calculation results of characteristics of minute transistors which were manufactured using an oxide semiconductor having such a mobility are shown in FIGS. 47A to 47C, FIGS. 48A to 48C, and FIGS. 49A to 49C. Cross-sectional structures of the transistors used for the calculation are shown in FIGS. 50A and 50B. The transistors shown in FIGS. 50A and 50B each include a semiconductor region 1030a and a semiconductor region 1030c which have n⁺-type conductivity in an oxide semiconductor layer. The resistivities of the semiconductor region 1030a and the semiconductor region 1030c are $2 \times 10^{-3}$ Ωcm.

The transistor shown in FIG. 50A is formed over a base insulating layer 1010 and an embedded insulator 1020 which is embedded in the base insulating layer 1010 and formed of aluminum oxide. The transistor includes the semiconductor region 1030a, the semiconductor region 1030c, an intrinsic semiconductor region 1030b serving as a channel formation region therebetween, and a gate 1050. The width of the gate 1050 is 33 nm.

A gate insulating film 1040 is provided between the gate 1050 and the semiconductor region 1030b. In addition, a sidewall insulator 1060a and a sidewall insulator 1060b are provided on both side surfaces of the gate 1050, and an insulator 1070 is provided over the gate 1050 so as to prevent a short circuit between the gate 1050 and another wiring. The width of the sidewall insulator is 5 nm. A source 1080a and a drain 1080b are provided in contact with the semiconductor region 1030*a* and the semiconductor region 1030*c*, respectively. The channel width of this transistor is 40 nm.

The transistor shown in FIG. 50B is the same as the transistor shown in FIG. 50A in that it is provided over a base insulating layer 1010 and an embedded insulator 1020 formed of aluminum oxide and that it includes a semiconductor region 1030*a*, a semiconductor region 1030*c*, an intrinsic semiconductor region 1030*b* provided therebetween, a gate 1050 having a width of 33 nm, a gate insulating film 1040, a sidewall insulator 1060*a*, a sidewall insulator 1060*b*, an insulator 1070, a source 1080*a*, and a drain 1080*b*.

The transistor shown in FIG. 50A is different from the transistor shown in FIG. 50B in the conductivity type of semiconductor regions under the sidewall insulator 1060*a* and the sidewall insulator 1060*b*. In the transistor shown in FIG. 50A, the semiconductor regions under the sidewall insulator 1060*a* and the sidewall insulator 1060*b* are part of the semiconductor region 1030*a* having n$^+$-type conductivity and part of the semiconductor region 1030*c* having n$^+$-type conductivity, whereas in the transistor shown in FIG. 50B, the semiconductor regions under the sidewall insulator 1060*a* and the sidewall insulator 1060*b* are part of the intrinsic semiconductor region 1030*b*. In other words, in the semiconductor layer of FIG. 50B, a region having a width of Loff which overlaps with neither the semiconductor region 1030*a* (the semiconductor region 1030*c*) nor the gate 1050 is provided. This region is called an offset region, and the width Loff is called an offset length. As is seen from the drawing, the offset length is equal to the width of the sidewall insulator 1060*a* (the sidewall insulator 1060*b*).

Figure 47A:
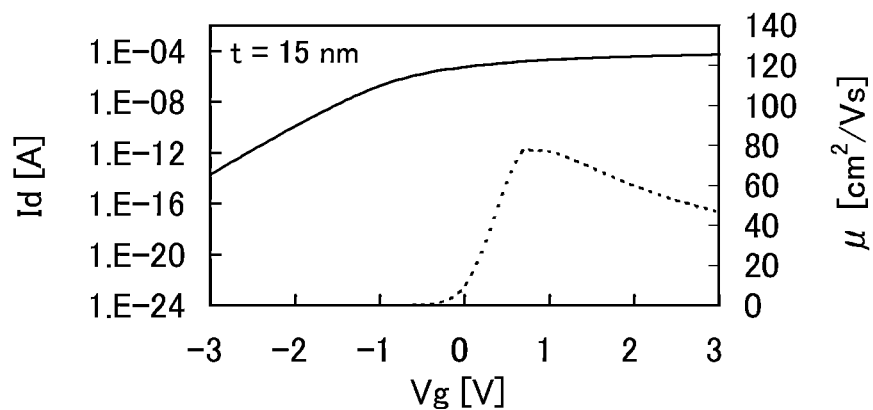
FIGS. 47A to 47C each show gate voltage dependence of drain current and mobility according to calculation.
Figure 47B:
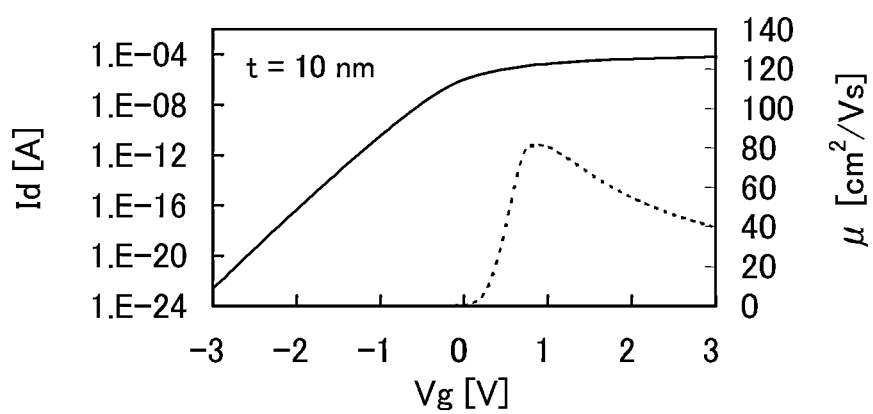
Figure 47C:
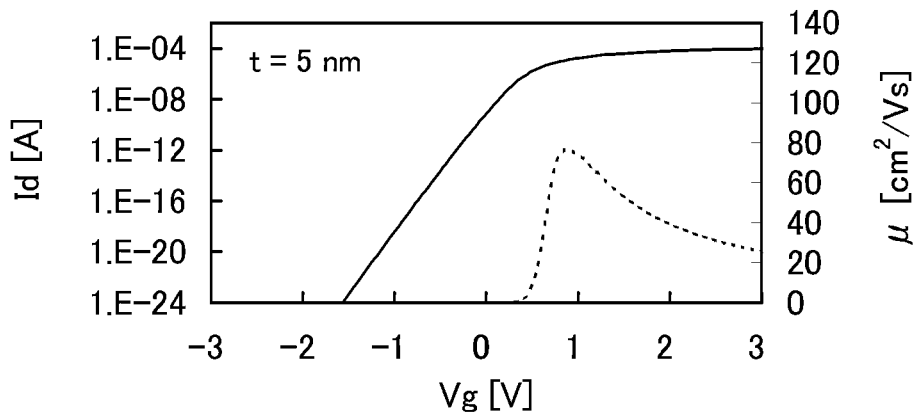

The other parameters used in the calculation are as described above. For the calculation, device simulation software Sentaurus Device manufactured by Synopsys, Inc. was used. FIGS. 47A to 47C show the gate voltage (V$_g$: a potential difference between the gate and the source) dependence of the drain current (I$_d$, a solid line) and the mobility (μ, a dotted line) of the transistor having the structure shown in FIG. 50A. The drain current I$_d$ was calculated at a drain voltage (potential difference between the drain and the source) of +1 V and the mobility μ was calculated at a drain voltage of +0.1 V.

FIG. 47A shows the results when the thickness of the gate insulating film is 15 nm, FIG. 47B shows the results when the thickness of the gate insulating film is 10 nm, and FIG. 47C shows the results when the thickness of the gate insulating film is 5 nm. As the gate insulating film is thinner, the drain current I$_d$ (off-state current) particularly in an off state is significantly decreased. In contrast, there is no noticeable change in the peak value of the mobility μ and the drain current I$_d$ (on-state current) in an on state. The graphs show that the drain current exceeds 10 μA, which is requisite for a semiconductor device, at a gate voltage of around 1 V.

Figure 48A:
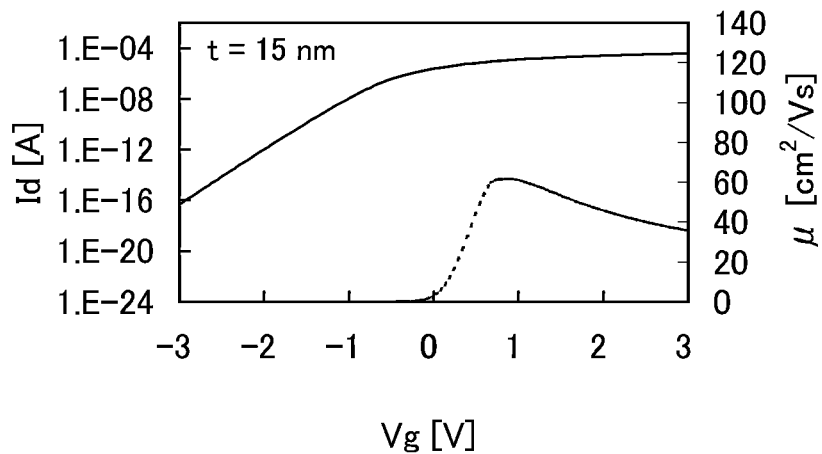
FIGS. 48A to 48C each show gate voltage dependence of drain current and mobility according to calculation.
Figure 48B:
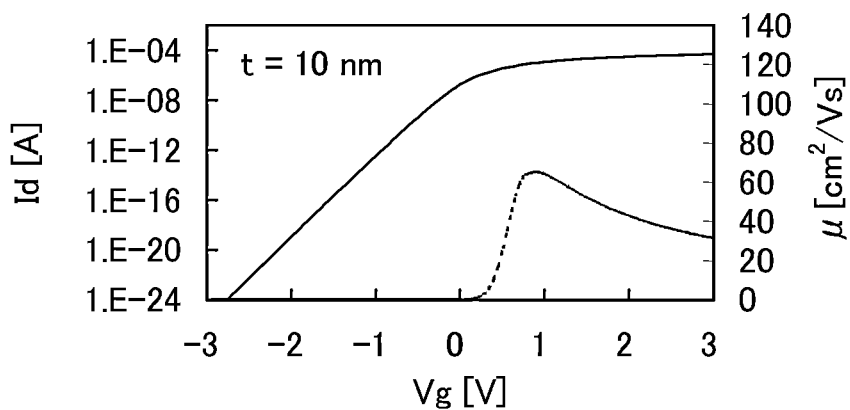
Figure 48C:
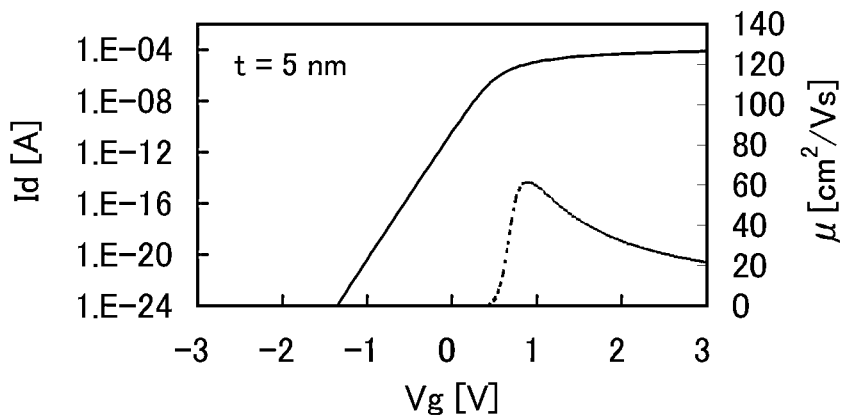

FIGS. 48A to 48C show the gate voltage V$_g$ dependence of the drain current I$_d$ (a solid line) and the mobility μ (a dotted line) of the transistor having the structure shown in FIG. 50B when the offset length Loff is 5 nm. The drain current I$_d$ was calculated at a drain voltage of +1 V and the mobility μ was calculated at a drain voltage of +0.1 V. FIG. 48A shows the results when the thickness of the gate insulating film is 15 nm, FIG. 48B shows the results when the thickness of the gate insulating film is 10 nm, and FIG. 48C shows the results when the thickness of the gate insulating film is 5 nm.

Figure 49A:
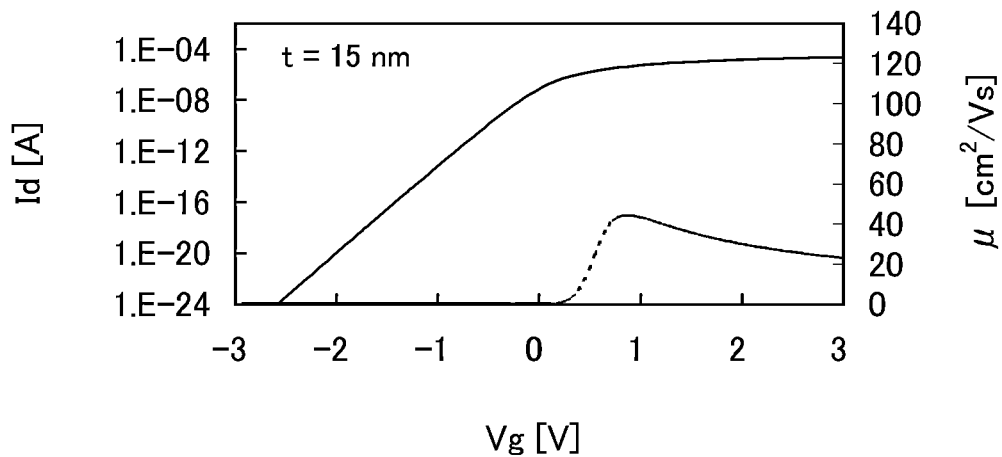
FIGS. 49A to 49C each show gate voltage dependence of drain current and mobility according to calculation.
Figure 49B:
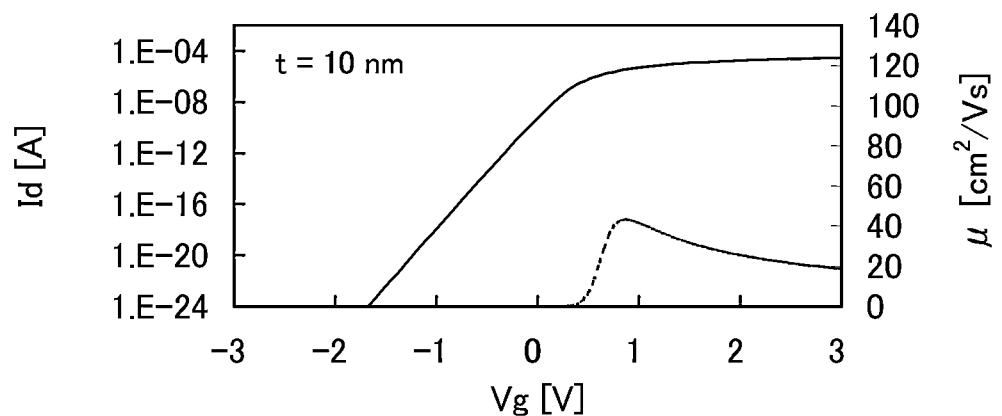
Figure 49C:
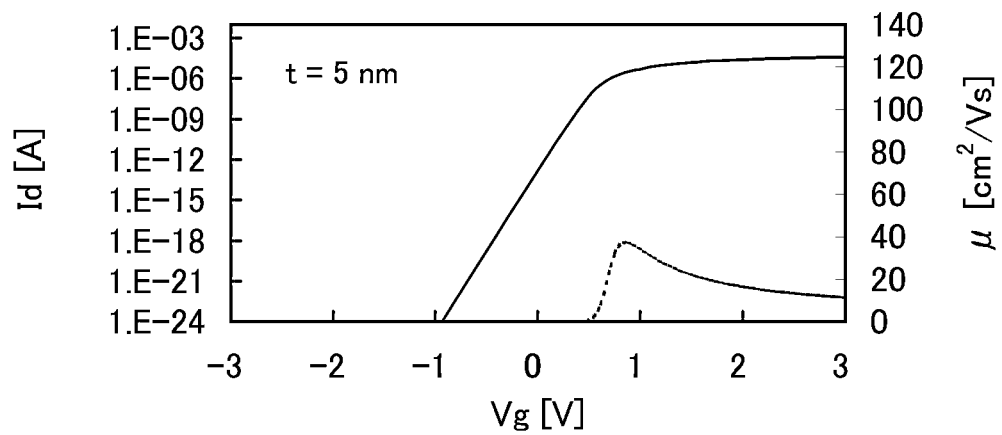
Figure 50A:
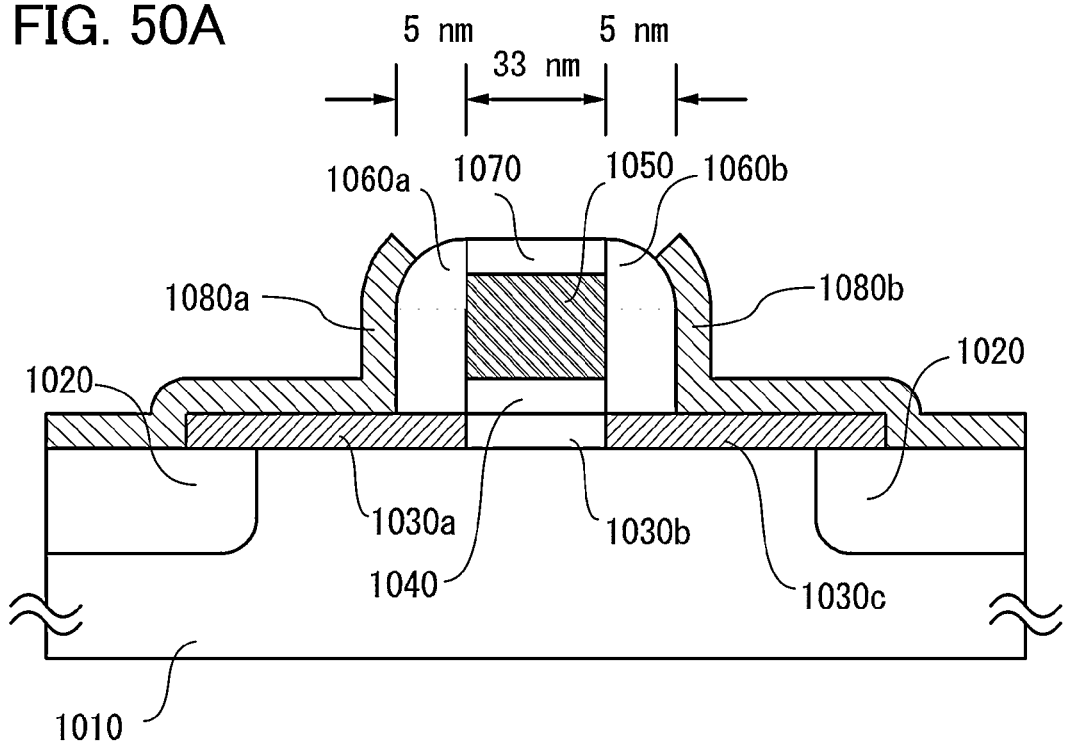
FIGS. 50A and 50B illustrate cross-sectional structures of transistors used for the calculation.
Figure 50B:
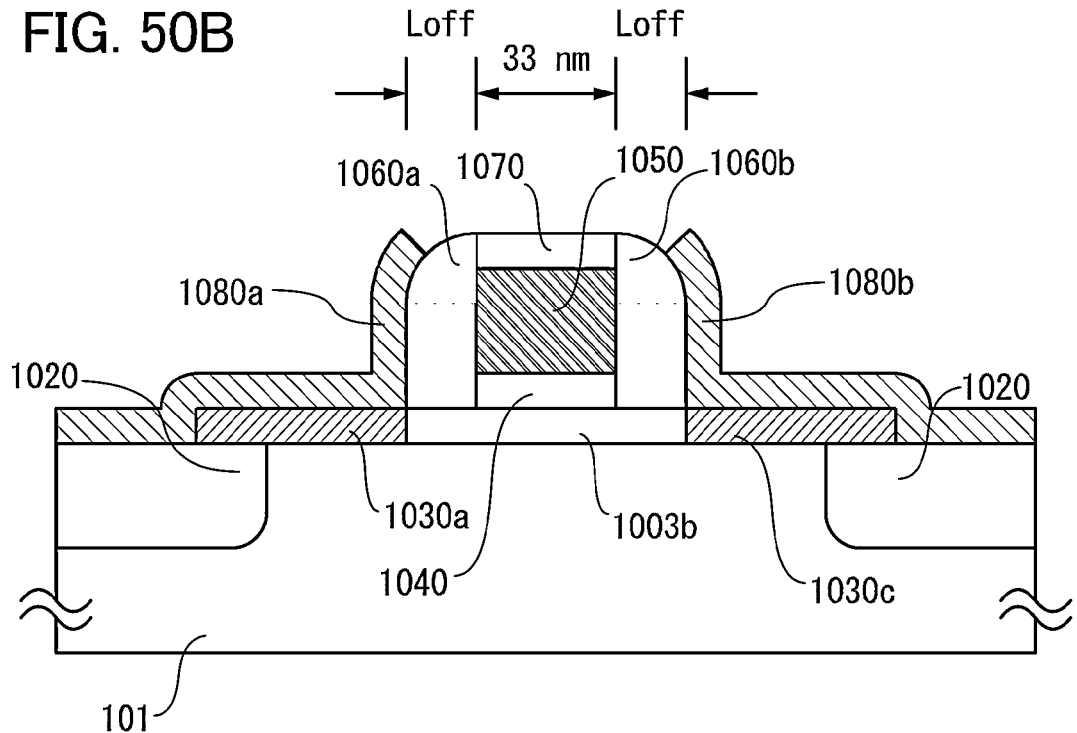

FIGS. 49A to 49C show the gate voltage dependence of the drain current I$_d$ (a solid line) and the mobility μ (a dotted line) of the transistor having the structure shown in FIG. 50B when the offset length Loff is 15 nm. The drain current I$_d$ was calculated at a drain voltage of +1 V and the mobility μ was calculated at a drain voltage of +0.1 V. FIG. 49A shows the results when the thickness of the gate insulating film is 15 nm, FIG. 49B shows the results when the thickness of the gate insulating film is 10 nm, and FIG. 49C shows the results when the thickness of the gate insulating film is 5 nm.

In any of the above-described results, as the gate insulating film is thinner, the off-state current decreases, whereas there is no noticeable change in the peak value of the field-effect mobility μ and the on-state current.

The peak of the field-effect mobility μ is about 80 cm$^2$/Vs in FIGS. 47A to 47C, about 60 cm$^2$/Vs in FIGS. 48A to 48C, and about 40 cm$^2$/Vs in FIGS. 49A to 49C; thus, the peak of the field-effect mobility μ decreases as the offset length Loff is increased. Further, it is found that the same applies to the off-state current. The on-state current also decreases as the offset length Loff is increased, which is, however, much more gradual than the decrease in the off-state current. Any calculation result shows that the drain current exceeds 10 μA, which is requisite for a semiconductor device, at a gate voltage of around 1 V.

Embodiment 16

In this embodiment, characteristics of a transistor in which an oxide semiconductor containing In, Sn, and Zn is used as its main components for a channel region are described.

Characteristics of such a transistor in which an oxide semiconductor containing In, Sn, and Zn as its main components is used for a channel formation region can be increased by depositing the oxide semiconductor while heating a substrate or by performing heat treatment after an oxide semiconductor film is formed. The main component refers to an element contained in composition at 5 atomic % or more.

By intentionally heating the substrate after formation of the oxide semiconductor film containing In, Sn, and Zn as its main components, the field-effect mobility of the transistor can be improved. Further, the threshold voltage of the transistor can be shifted in the positive direction to make the transistor normally off.

Figure 51A:
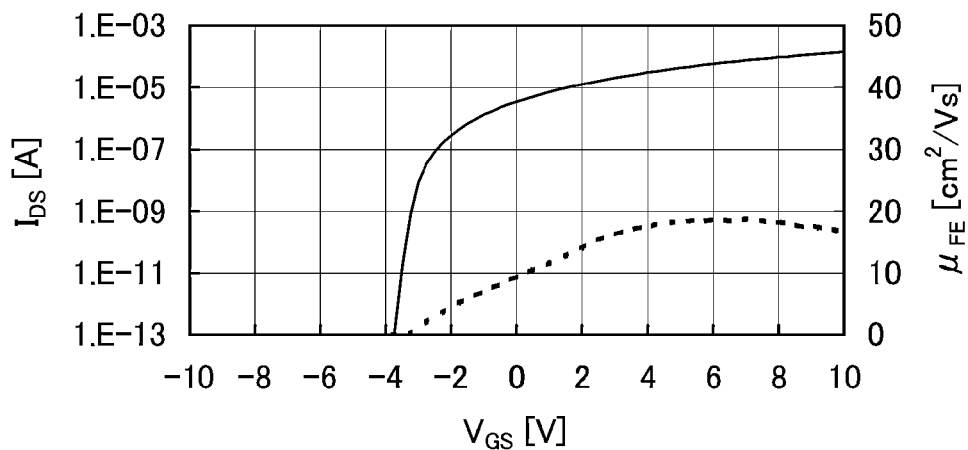
FIGS. 51A to 51C each show transistor characteristics using an oxide semiconductor film.
Figure 51B:
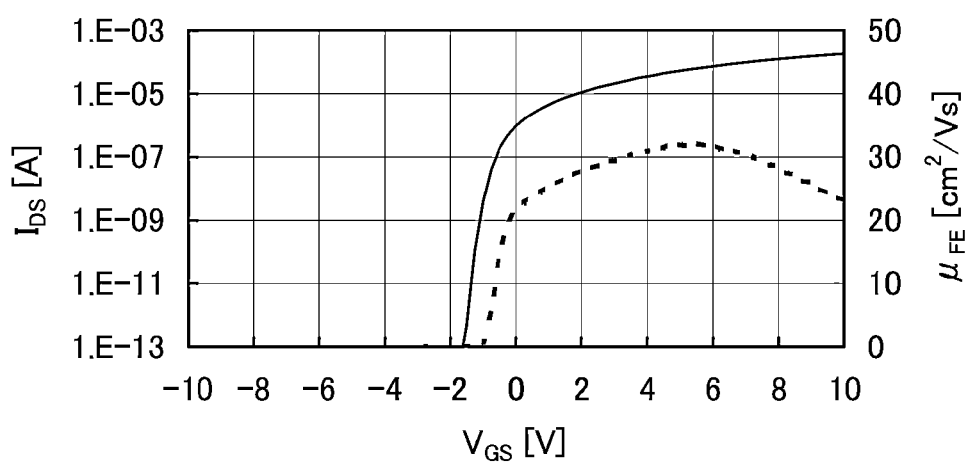
Figure 51C:
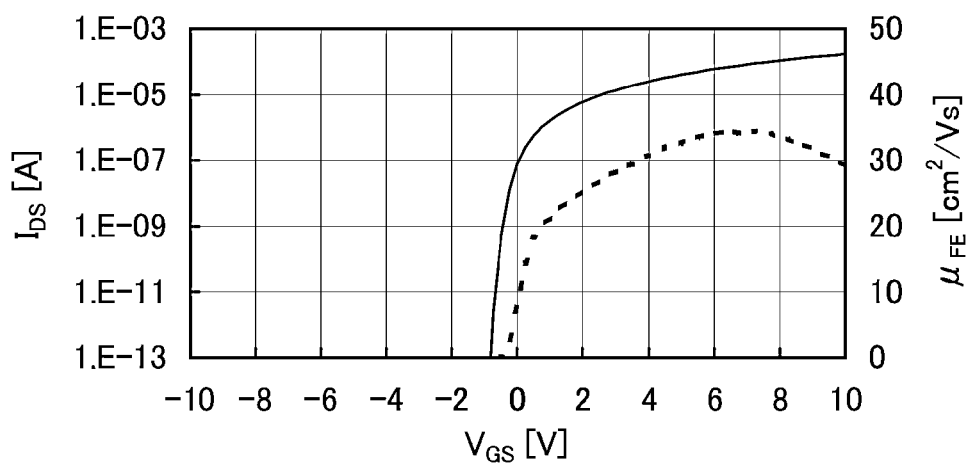

As an example, FIGS. 51A to 51C are graphs each showing characteristics of a transistor in which an oxide semiconductor film containing In, Sn, and Zn as its main components and having a channel length L of 3 μm and a channel width W of 10 μm, and a gate insulating film with a thickness of 100 nm are included. Note that V$_d$ was set to 10 V.

FIG. 51A shows characteristics of a transistor whose oxide semiconductor film containing In, Sn, and Zn as its main components was formed by a sputtering method without intentionally heating a substrate. The field-effect mobility of the transistor is 18.8 cm$^2$/Vsec. On the other hand, when the oxide semiconductor film containing In, Sn, and Zn as its main components is formed while heating the substrate intentionally, the field-effect mobility can be improved. FIG. 51B shows characteristics of a transistor whose oxide semiconductor film containing In, Sn, and Zn as its main components was formed while heating a substrate at 200° C.; the field-effect mobility of the transistor is 32.2 cm$^2$/Vsec.

The field-effect mobility can be further improved by performing heat treatment after formation of the oxide semiconductor film containing In, Sn, and Zn as its main components. FIG. 51C shows characteristics of a transistor whose oxide semiconductor film containing In, Sn, and Zn as its main components was formed by sputtering at 200° C. and then subjected to heat treatment at 650° C.; the field-effect mobility of the transistor is 34.5 cm$^2$/Vsec.

The intentional heating of the substrate is expected to have an effect of suppressing entrance of moisture to the oxide semiconductor film during formation by sputtering. Further, the heat treatment after film formation enables hydrogen, a hydroxyl group, or moisture to be released and removed from the oxide semiconductor film. In this manner, the field-effect mobility can be improved as described above. Such an improvement in field-effect mobility is presumed to be achieved not only by removal of impurities by dehydration or dehydrogenation but also by a reduction in interatomic distance due to an increase in density. The oxide semiconductor can be crystallized by high purification by removal of impurities from the oxide semiconductor. In the case of using such a highly purified non-single-crystal oxide semiconductor, ideally, a field-effect mobility over 100 cm$^2$/Vsec is expected to be realized.

Oxygen ions may be implanted into the oxide semiconductor containing In, Sn, and Zn as its main components, hydrogen, a hydroxyl group, or moisture included in the oxide semiconductor may be released by heat treatment, and the oxide semiconductor may be crystallized by the heat treatment or by the next heat treatment. Through such crystallization treatment or recrystallization treatment, a non-single crystal oxide semiconductor having high crystallinity can be provided.

The intentional heating of the substrate during film formation and/or the heat treatment after the film formation contributes not only to improving field-effect mobility but also to making the transistor normally off. In a transistor in which an oxide semiconductor film containing In, Sn, and Zn as its main components and is formed without intentionally heating a substrate is used for a channel formation region, the threshold voltage tends to be shifted in the negative direction. However, when the oxide semiconductor film formed while intentionally heating the substrate is used, the problem of the negative shift of the threshold voltage can be solved. That is, the threshold voltage is shifted so that the transistor becomes a normally-off transistor; this tendency can be compatible with the result of comparison between FIGS. 51A and 51B.

The threshold voltage can also be controlled by changing the ratio of In, Sn, and Zn; when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. Through film formation or heat treatment performed at a high temperature, the transistor can be made to be a normally-off transistor.

Further, by intentionally heating the substrate during film formation and/or by performing heat treatment after the film formation, the stability against a gate-bias stress can be increased. For example, by application of a gate bias with an intensity of 2 MV/cm at 150° C. for one hour, drift of the threshold voltage can be suppressed to be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_{gs}$—$I_{ds}$ characteristics of each transistor were measured at a substrate temperature of 25° C. at $V_{ds}$ of 10 V. Then, the substrate temperature was changed to 150° C. and $V_{ds}$ was changed to 0.1 V. After that, 20 V of $V_{gs}$ was applied so that the intensity of an electric field applied to the gate insulating film 608 was 2 MV/cm, and the condition was kept for 1 hour. Next, $V_{gs}$ was changed to 0 V. Then, the $V_{gs}$—$I_{ds}$ characteristics of each transistor were measured again at the substrate temperature of 25° C. at $V_{ds}$ of 10 V. This process is called a positive BT test.

In a similar manner, first, $V_{gs}$—$I_{ds}$ characteristics of each transistor were measured at a substrate temperature of 25° C. at $V_{ds}$ of 10 V. Then, the substrate temperature was changed to 150° C. and $V_{ds}$ was changed to 0.1 V. After that, −20 V was applied as $V_{gs}$ so that the intensity of an electric field applied to the gate insulating film 608 was −2 MV/cm, and the condition was kept for 1 hour. Next, $V_{gs}$ was changed to 0 V. Then, the $V_{g}$—$I_{ds}$ characteristics of each transistor were measured again at the substrate temperature of 25° C. at $V_{ds}$ of 10 V. This is called a negative BT test.

Figure 52A:
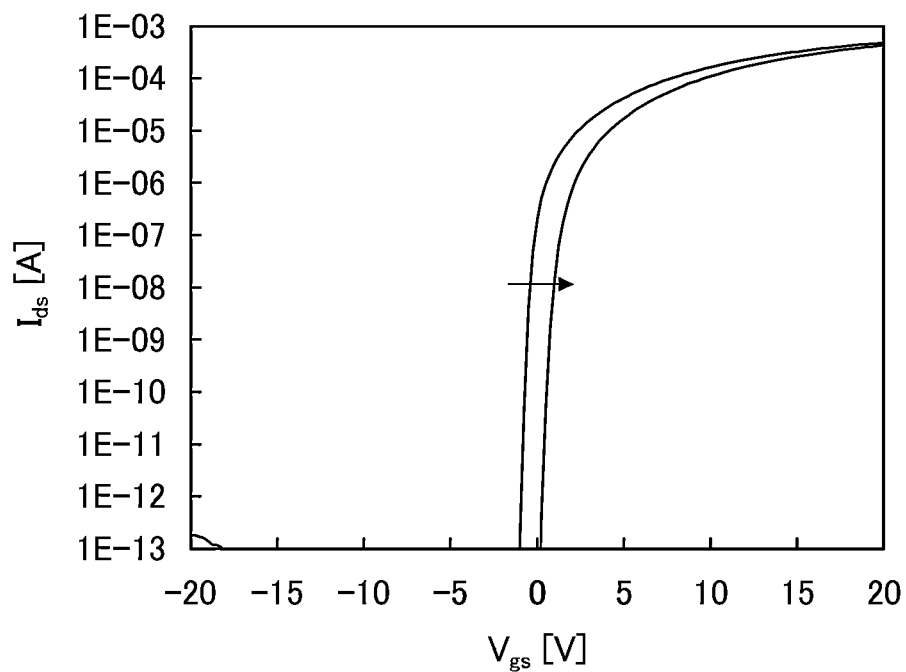
FIGS. 52A and 52B each show $V_{gs}$—$I_{ds}$ characteristics of a transistor of Sample 1 measured before and after a BT test.
Figure 52B:
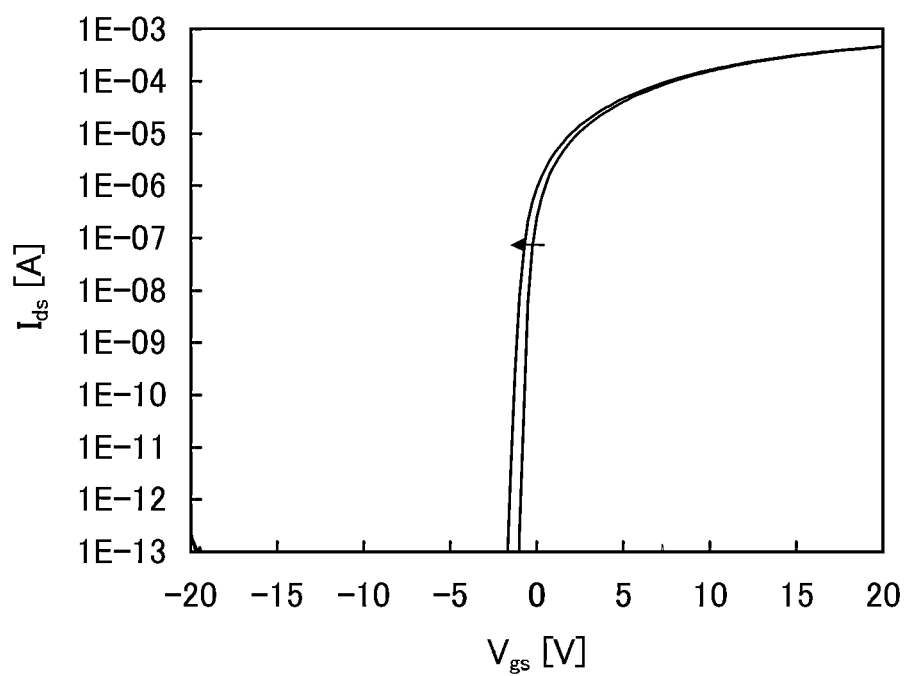
Figure 53A:
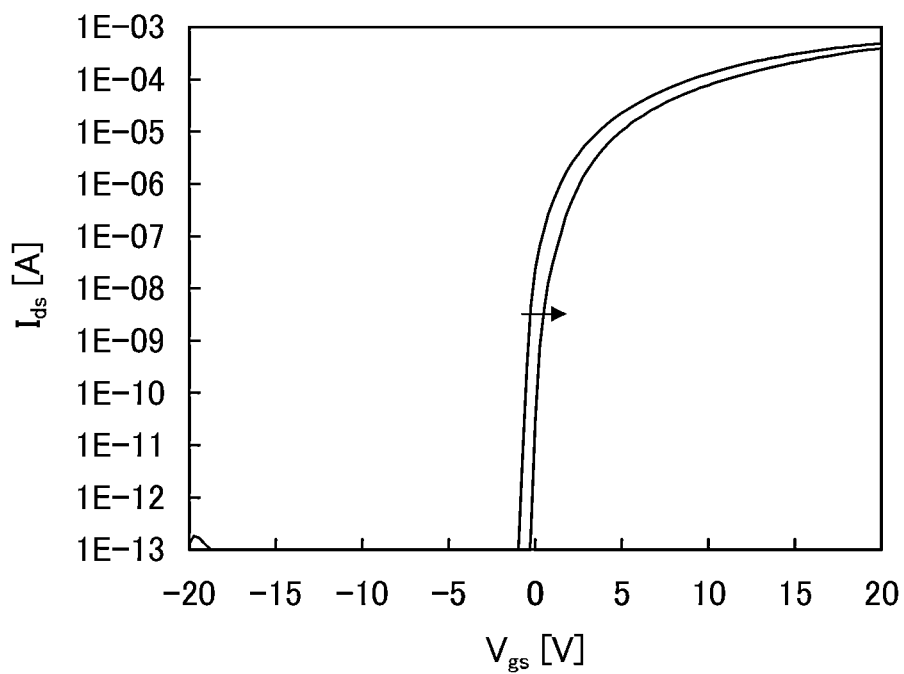
FIGS. 53A and 53B each show $V_{gs}$—$I_{ds}$ characteristics of a transistor of Sample 2 measured before and after a BT test.
Figure 53B:
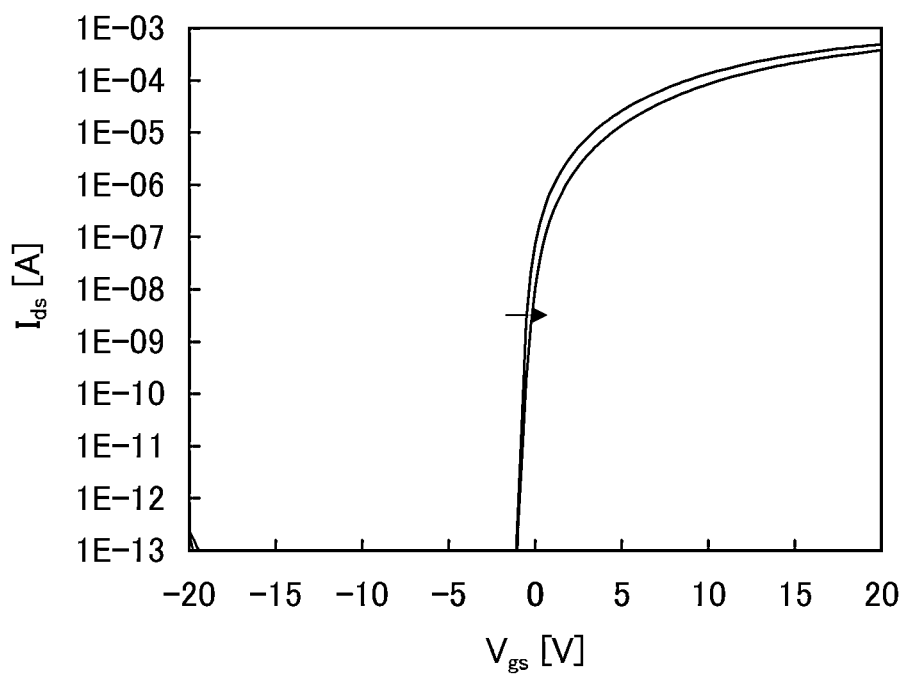

FIGS. 52A and 52B show a result of the positive BT test of Sample 1 and a result of the negative BT test of Sample 1, respectively. FIGS. 53A and 53B show a result of the positive BT test of Sample 2 and a result of the negative BT test of Sample 2, respectively.

Respective amounts of shift in the threshold voltage of Sample 1 due to the positive BT test and due to the negative BT test were 1.80 V and −0.42 V. Respective amounts of shift in the threshold voltage of Sample 2 due to the positive BT test and due to the negative BT test were 0.79 V and 0.76 V. It is found that, in each of Sample 1 and Sample 2, the amount of shift in the threshold voltage measured before and after the BT test is small and thus the reliability is high.

Although the positive BT test and the negative BT test are tests for determining the deterioration level of a transistor, it is found from FIGS. 52A and 53A that the threshold voltage can be shifted in the positive direction by performing at least the positive BT test.

In particular, FIG. 52A reveals that the positive BT test made the transistor a normally-off transistor.

Accordingly, it is found that, by performing the positive BT test in addition to the heat treatment in the manufacturing process of a transistor, a shift of the threshold voltage in the positive direction can be promoted, so that a normally-off transistor can be formed.

The heat treatment can be performed in an oxygen atmosphere; alternatively, the heat treatment may be performed first in an atmosphere of nitrogen or an inert gas or under reduced pressure, and then in an atmosphere including oxygen. By supplying oxygen to the oxide semiconductor after dehydration or dehydrogenation, an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancies tends to be formed in the oxide semiconductor or at an interface between the oxide semiconductor and the next stacked film; however, by supplying oxygen to the oxide semiconductor by the heat treatment such that oxygen included in the oxide semiconductor is excess, the generated oxygen vacancies can be repaired by excess oxygen. The excess oxygen is oxygen existing mainly between lattices. As long as the concentration of excess oxygen is greater than or equal to 1×10$^{16}$/cm$^3$ and less than or equal to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, in an oxide semiconductor film which is formed by sputtering using a target having a composition ratio of In:Sn:Zn=1:1:1 without intentionally heating a substrate, a halo pattern is observed in an X-ray diffraction (XRD). The oxide semiconductor film can be crystallized by heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted by an out-of-plane measurement with an X-ray diffractometer D8 ADVANCE manufactured by Bruker AXS.

Sample A and Sample B were prepared for the XRD analysis. A method for manufacturing Sample A and Sample B is described below.

An In—Sn—Zn—O film with a thickness of 100 nm was formed over the dehydrogenated quartz substrate.

The In—Sn—Zn—O film was formed with a sputtering apparatus with a power of 100 W (DC) in an oxygen atmosphere. An In—Sn—Zn—O target of In:Sn:Zn=1:1:1 [atomic ratio] was used as a target. The substrate heating temperature in film formation was 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for 1 hour and heat treatment in an oxygen atmosphere was further performed for 1 hour without lowering the temperature. A sample manufactured in this manner was used as Sample B.

Figure 56:
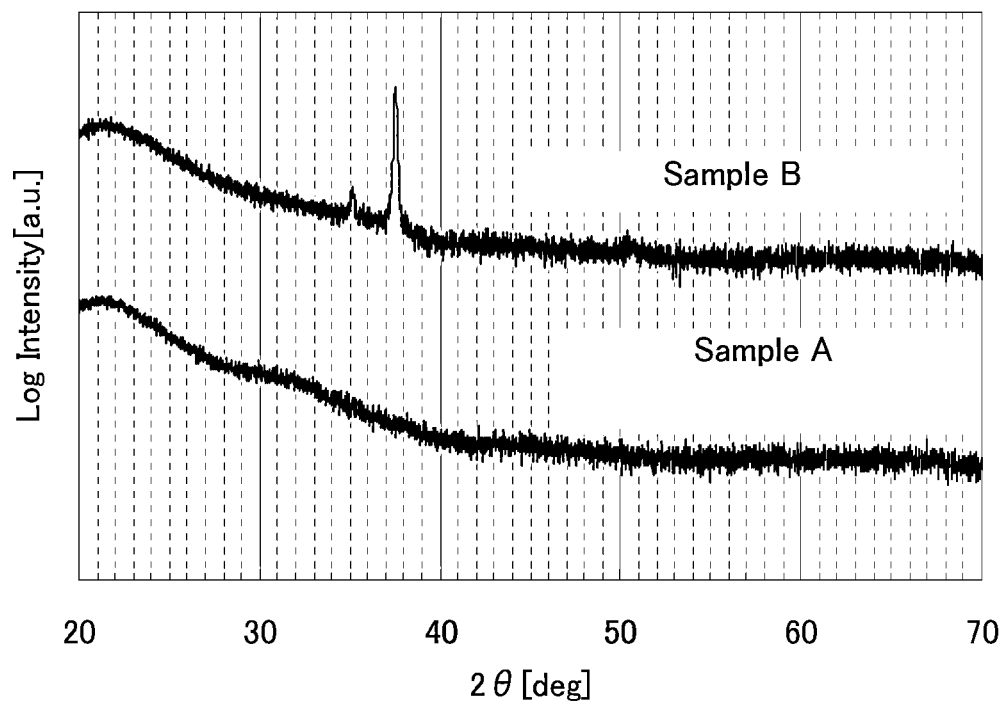
FIG. 56 shows XRD spectra of Sample A and Sample B.

FIG. 56 shows XRD spectra of Sample A and Sample B. No peak derived from crystal was observed in Sample A, whereas peaks derived from crystal were observed at 2θ of around 35 deg and 2θ of 37 deg to 38 deg in Sample B.

As described above, by intentionally heating a substrate during deposition of an oxide semiconductor containing In, Sn, and Zn as its main components and/or by performing heat treatment after the deposition, characteristics of a transistor can be improved.

These substrate heating and heat treatment have an effect of preventing hydrogen and a hydroxyl group, which are adverse impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be provided. The high purification of the oxide semiconductor enables the off-state current of the transistor to be reduced to 1 aA/μm or less. Here, the off-state current is described per micrometer of a channel width.

Figure 57:
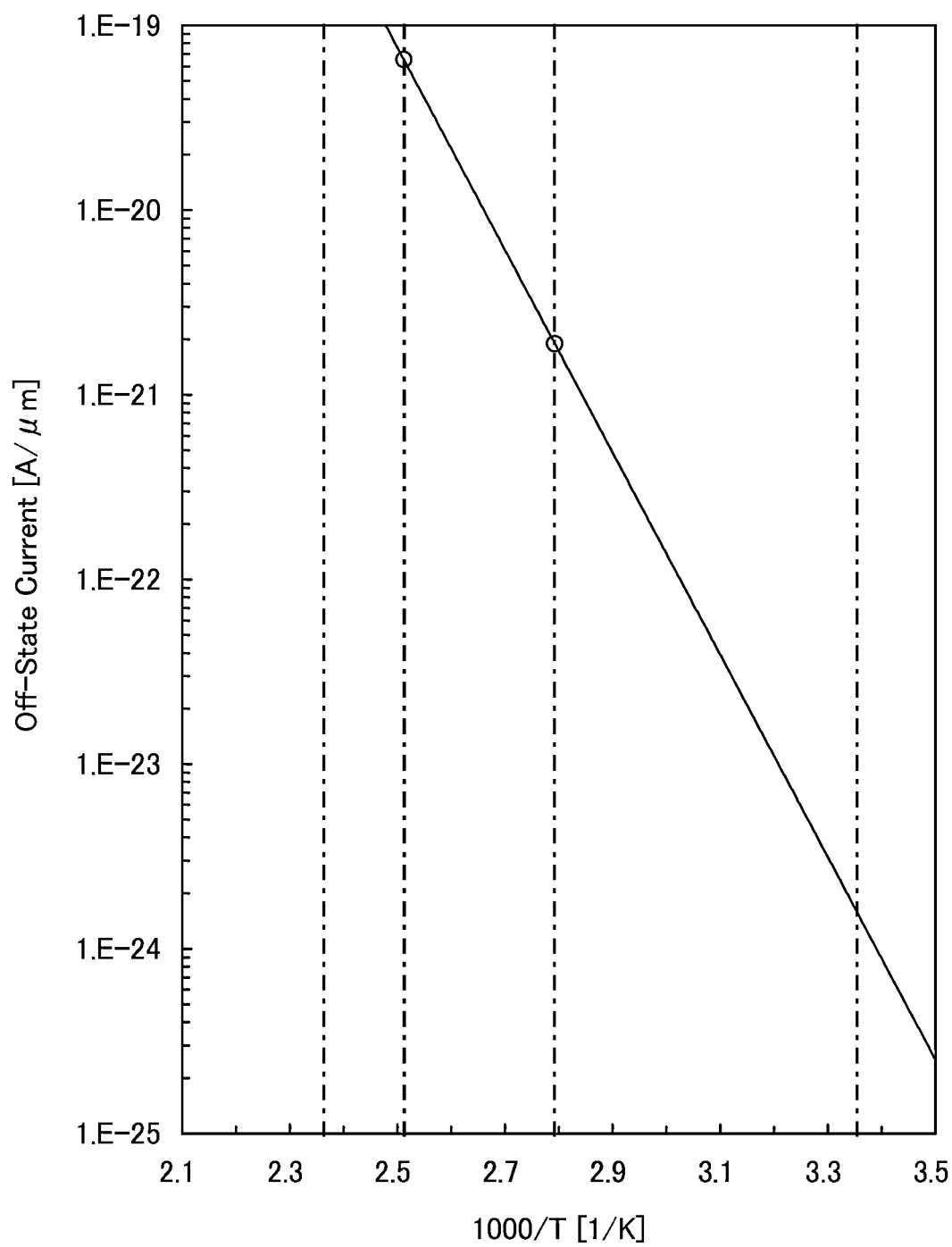
FIG. 57 shows the relation between off-state current of a transistor and the substrate temperature in measurement.

FIG. 57 shows a relation between the off-state current of a transistor and the inverse of the substrate temperature (absolute temperature) at measurement. For simplicity, the horizontal axis represents a value (1000/T) obtained by multiplying an inverse of the substrate temperature at measurement by 1000.

Specifically, as shown in FIG. 57, the off-state currents were 0.1 aA/μm ($1\times10^{-19}$ A/μm) or less and 10 zA/μm ($1\times10^{-20}$ A/μm) or less when the substrate temperatures were 125° C. (about 2.51 as 1000/T) and 85° C. (about 2.79 as 1000/T), respectively. The proportional relation between the logarithm of the off-state current and the inverse of the temperature suggests that the off-state current at room temperature (27° C., about 3.33 as 1000/T) is 0.1 zA/μm ($1\times10^{-22}$ A/μm) or less. As is apparent from the above, the off-state current can be 1 aA/μm ($1\times10^{-18}$ A/μm) or less, 100 zA/μm ($1\times10^{-19}$ A/μm) or less, and 1 zA/μm ($1\times10^{-21}$ A/μm) or less at 125° C., 85° C., and room temperature, respectively. The above values of the off-state current are clearly much smaller than that of a transistor using Si as a semiconductor film.

The off-state current is decreased as the temperature is lower; therefore, it is clear that the off-state current is smaller at room temperature.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as its main components by heat treatment, the oxide semiconductor containing In, Sn, and Zn as its main components is preferably formed so as not to include moisture because the temperature at which moisture is released from the oxide semiconductor containing In, Sn, and Zn as its main components is higher than an oxide semiconductor containing In, Ga, and Zn as its main components.

The relation between the substrate temperature and electric characteristics of a transistor of the sample, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with the oxide semiconductor film, is referred to as dW.

Figure 54:
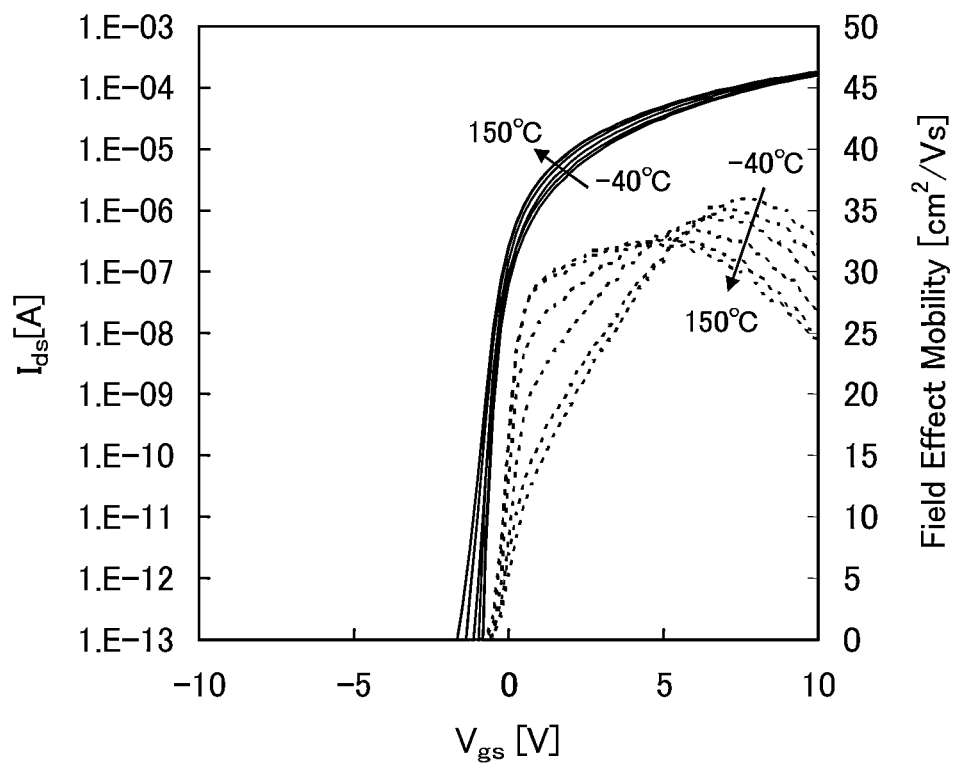
FIG. 54 shows $V_{gs}$ dependence of $I_{ds}$ and field effect mobility.
Figure 55A:
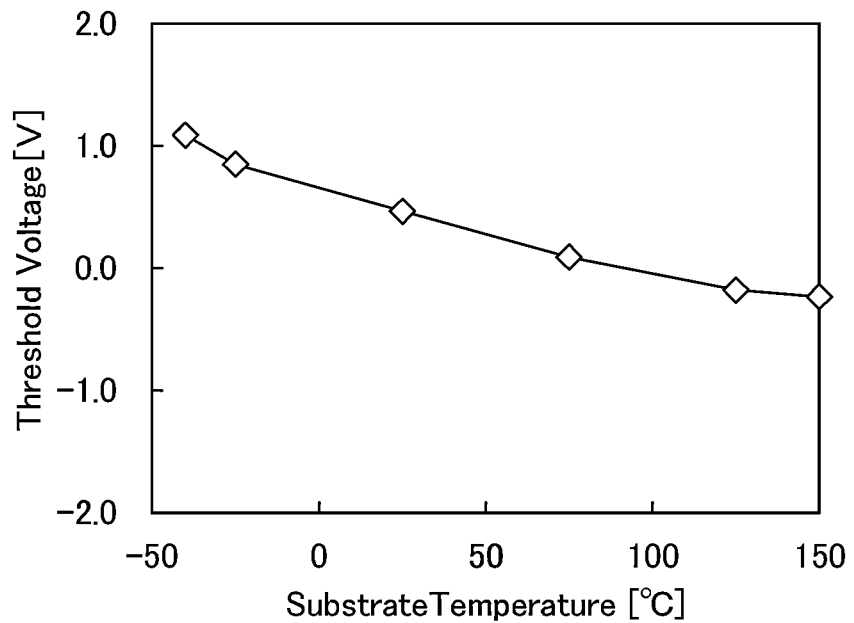
FIGS. 55A and 55B show the relation between substrate temperature and threshold voltage and the relation between substrate temperature and field effect mobility, respectively.

FIG. 54 shows the $V_{gs}$ dependence of $I_{ds}$ (a solid line) and field-effect mobility (a dotted line). FIG. 55A shows a relation between the substrate temperature and the threshold voltage, and FIG. 55B shows a relation between the substrate temperature and the field-effect mobility.

From FIG. 55A, it is found that the threshold voltage gets lower as the substrate temperature increases. Threshold voltage is decreased from 1.09 V to −0.23 V in the range from −40° C. to 150° C.

Figure 55B:
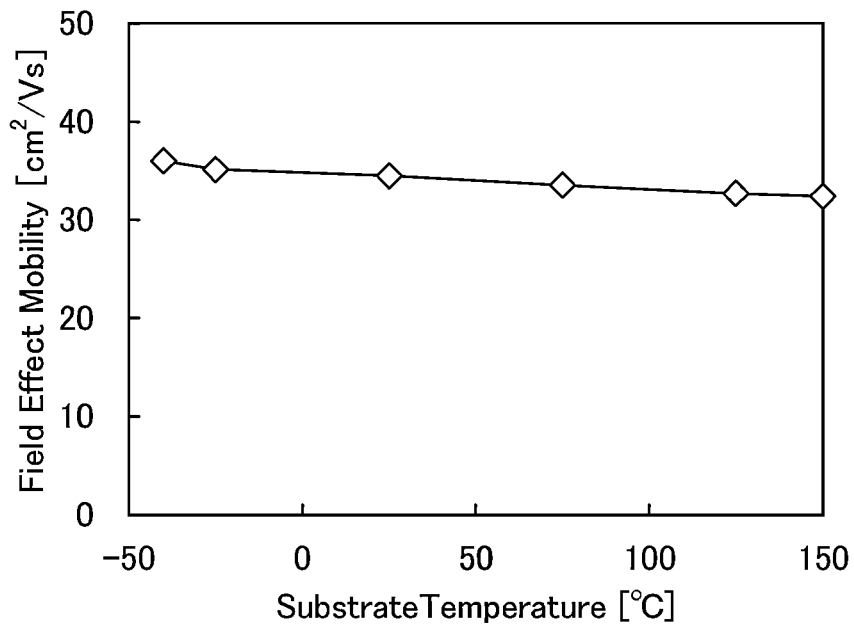

From FIG. 55B, it is found that the field-effect mobility gets lower as the substrate temperature increases. The field-effect mobility is decreased from 36 $cm^2/Vs$ to 32 $cm^2/Vs$ in the range from −40° C. to 150° C. Thus, it is found that variation in electric characteristics is small in the above temperature range.

In a transistor in which such an oxide semiconductor containing In, Sn, and Zn as its main components is used for a channel formation region, a field-effect mobility of 30 $cm^2/Vsec$ or higher, preferably 40 $cm^2/Vsec$ or higher, further preferably 60 cm²/Vsec or higher can be obtained with the off-state current maintained at 1 aA/μm or less, and an on-state current which is requisite for an LSI can be satisfied. For example, in an FET where L/W is 33 nm/40 nm, an on-state current of 12 μA or more can flow when the gate voltage is 2.7 V and the drain voltage is 1.0 V. In addition, sufficient electrical characteristics can be ensured in a temperature range which is requisite for operation of a transistor. With such characteristics, an integrated circuit having a novel function can be realized without decreasing the operation speed even when a transistor using an oxide semiconductor is also provided in an integrated circuit formed using a Si semiconductor.

Embodiment 17

In this embodiment, examples of a transistor in which an In—Sn—Zn—O film is used for an oxide semiconductor film are described with reference to FIGS. 58A and 58B and FIGS. 59A and 59B.

Figure 58A:
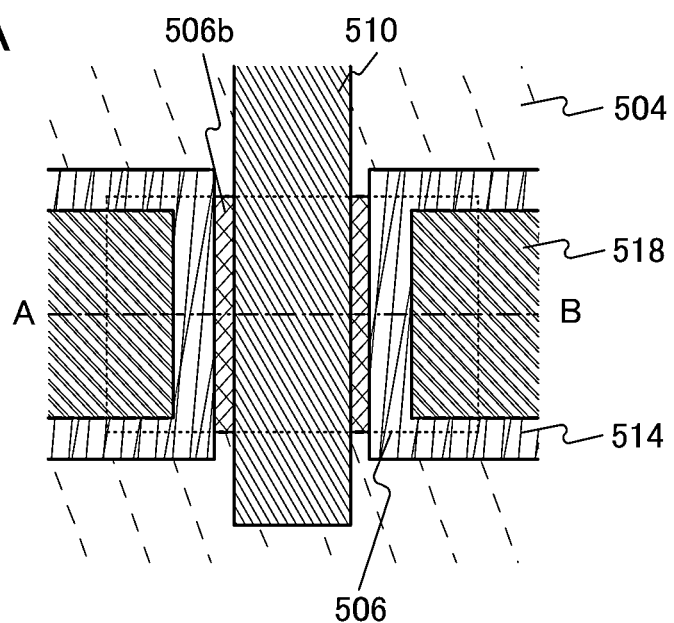
FIGS. 58A and 58B illustrate a transistor.
Figure 58B:
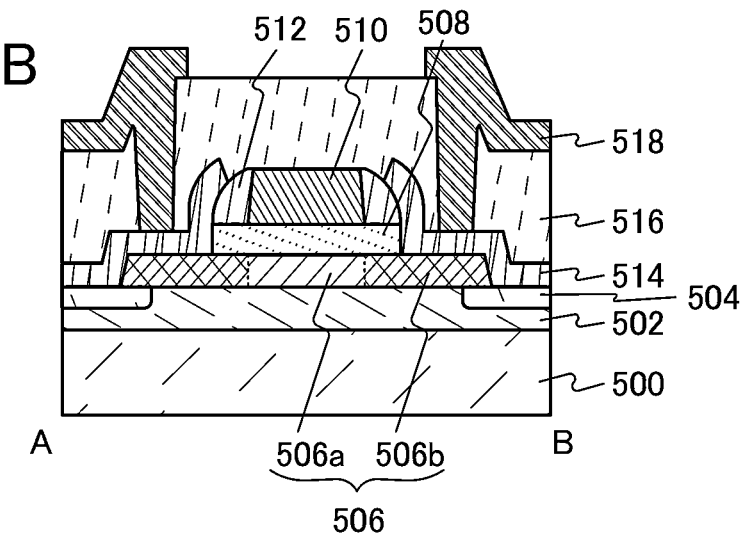

FIGS. 58A and 58B are a top view and a cross-sectional view of a coplanar transistor having a top-gate top-contact structure. FIG. 58A is the top view of the transistor. FIG. 58B illustrates cross section A-B along dashed-dotted line A-B in FIG. 58A.

The transistor shown in FIG. 58B includes a substrate 500; a base insulating film 502 provided over the substrate 500; a protective insulating film 504 provided in the periphery of the base insulating film 502; an oxide semiconductor film 506 provided over the base insulating film 502 and the protective insulating film 504 and including a high-resistance region 506a and low-resistance regions 506b; a gate insulating film 508 provided over the oxide semiconductor film 506; a gate electrode 510 provided to overlap with the oxide semiconductor film 506 with the gate insulating film 508 provided therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

Although not shown, a protective film may be provided to cover the interlayer insulating film 516 and the wiring 518. With the protective film, a minute amount of leakage current generated by surface conduction of the interlayer insulating film 516 can be reduced and thus the off-state current of the transistor can be reduced.

Figure 59A:
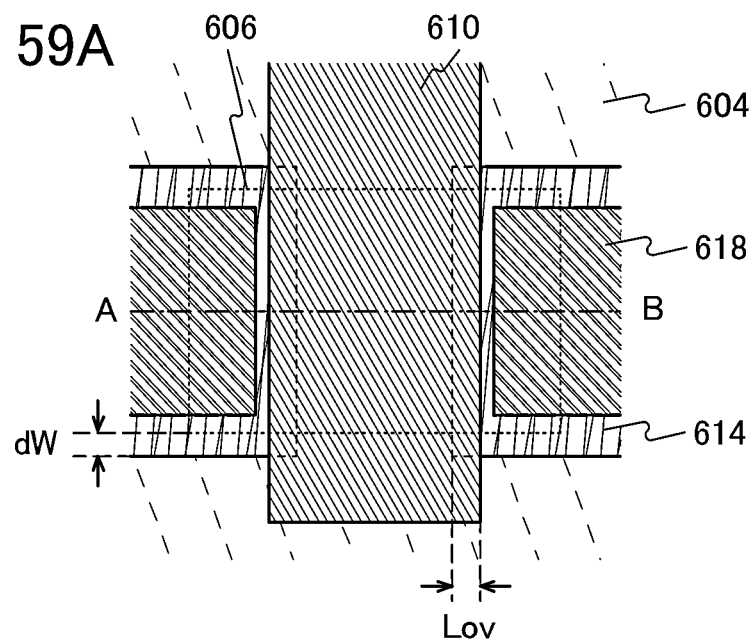
FIGS. 59A and 59B illustrate a transistor.
Figure 59B:
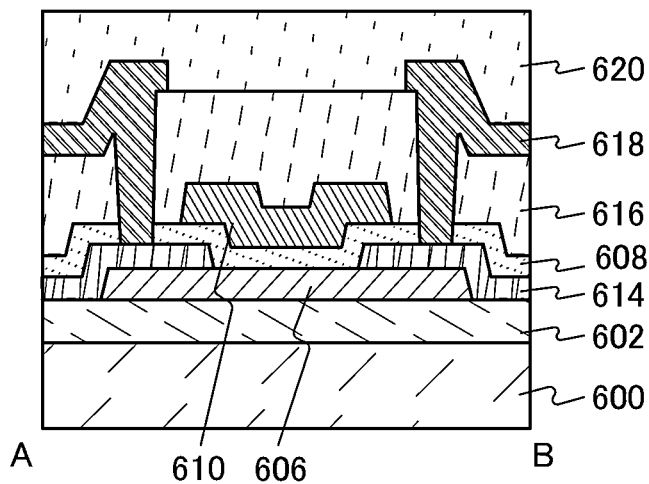

FIGS. 59A and 59B are a top view and a cross-sectional view which illustrate a structure of a transistor. FIG. 59A is the top view of the transistor. FIG. 59B is a cross-sectional view along dashed-dotted line A-B in FIG. 59A.

The transistor shown in FIG. 59B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 provided therebetween; an interlayer insulating film 616 provided to cover the gate insulating film 608 and the gate electrode 610; wirings 618 electrically connected to the pair of electrodes 614 through openings formed in the gate insulating film 608 and the interlayer insulating film 616; and a protective film 620 provided to cover the interlayer insulating film 616 and the wirings 618.

As the substrate 600, a glass substrate can be used. As the base insulating film 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a stacked-layer structure of a tantalum nitride film and a tungsten film. The interlayer insulating film 616 can have a stacked-layer structure of a silicon oxynitride film and a polyimide film. The wirings 618 can each have a stacked-layer structure in which a titanium film, an aluminum film, and a titanium film are formed in this order. As the protective film 620, a polyimide film can be used.

In the transistor having the structure shown in FIG. 59A, the width of a portion where the gate electrode 610 overlaps with the pair of electrodes 614 is referred to as Lov. Further, the width of a portion of the pair of electrodes 614, which does not overlap with the oxide semiconductor film 606, is referred to as dW.

Embodiment 18

With the use of a semiconductor device according to one embodiment of the present invention, a low-power-consumption electronic device can be provided. In particular, in the case where a portable electronic device has difficulty in continuously receiving power, an advantage in increasing the continuous duty period can be provided by adding a semiconductor device with low power consumption according to one embodiment of the present invention as a component of the device.

The semiconductor device according to one embodiment of the present invention can be used for display devices, laptops, or image reproducing devices provided with recording media (typically, devices which reproduce the content of recording media and have displays for displaying the reproduced images such as digital versatile discs (DVDs)). Other than the above, as an electronic device to which the semiconductor device according to one embodiment of the present invention can be applied, mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given as examples thereof.

The case is described in which the semiconductor device according to one embodiment of the present invention is applied to a portable electronic device such as a mobile phone, a smartphone, or an e-book reader.

Figure 60:
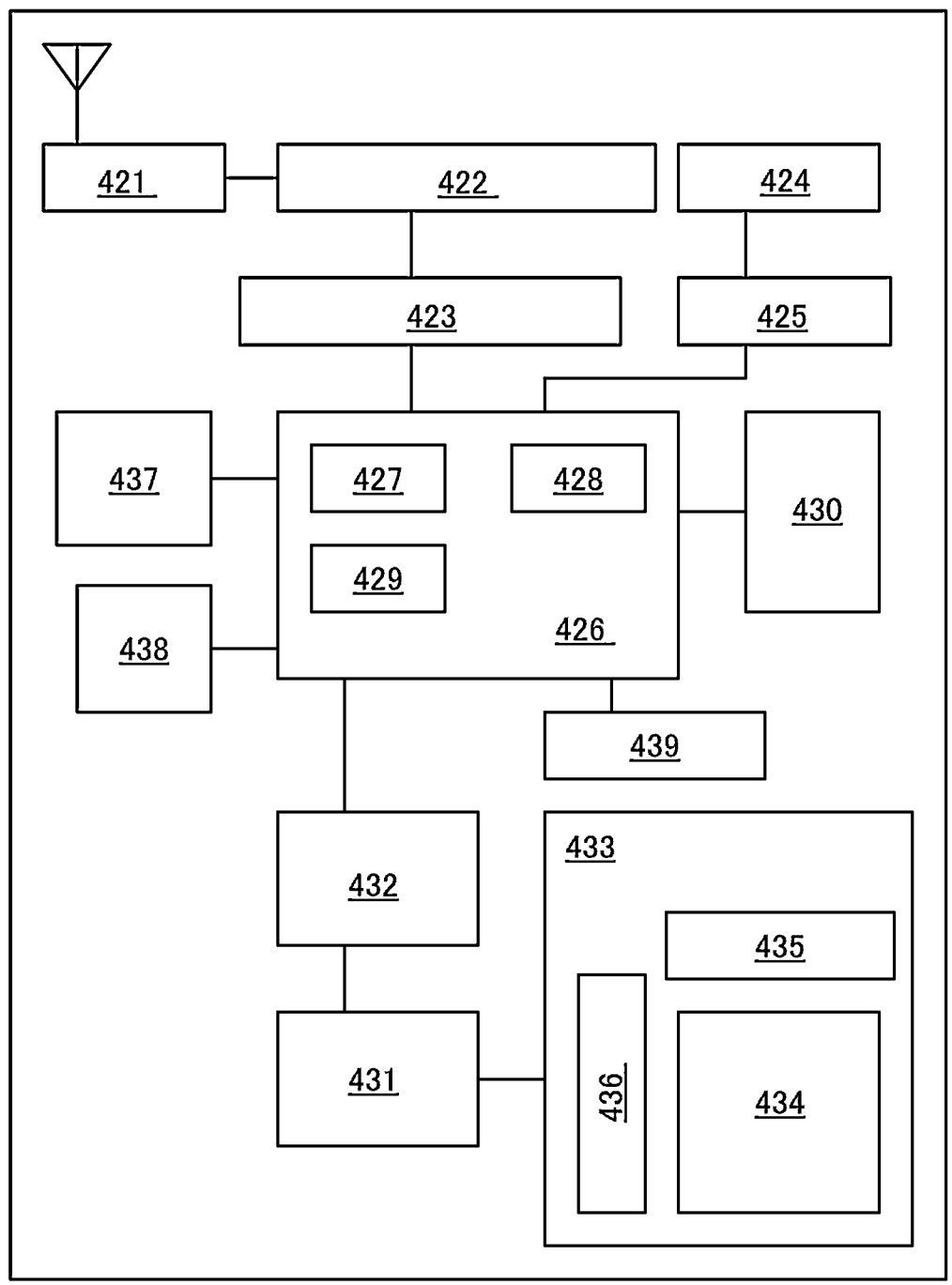
FIG. 60 is a block diagram of a portable electronic device.

FIG. 60 is a block diagram of a portable electronic device. The portable electronic device shown in FIG. 60 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface (IF) 429. For example, adoption of the semiconductor device described in any of the above embodiments for any or each of the CPU 427, the digital baseband circuit 423, the memory circuit 432, the DSP 428, the interface 429, the display controller 431, and the audio circuit 437 leads to a reduction in power consumption.

Figure 61:
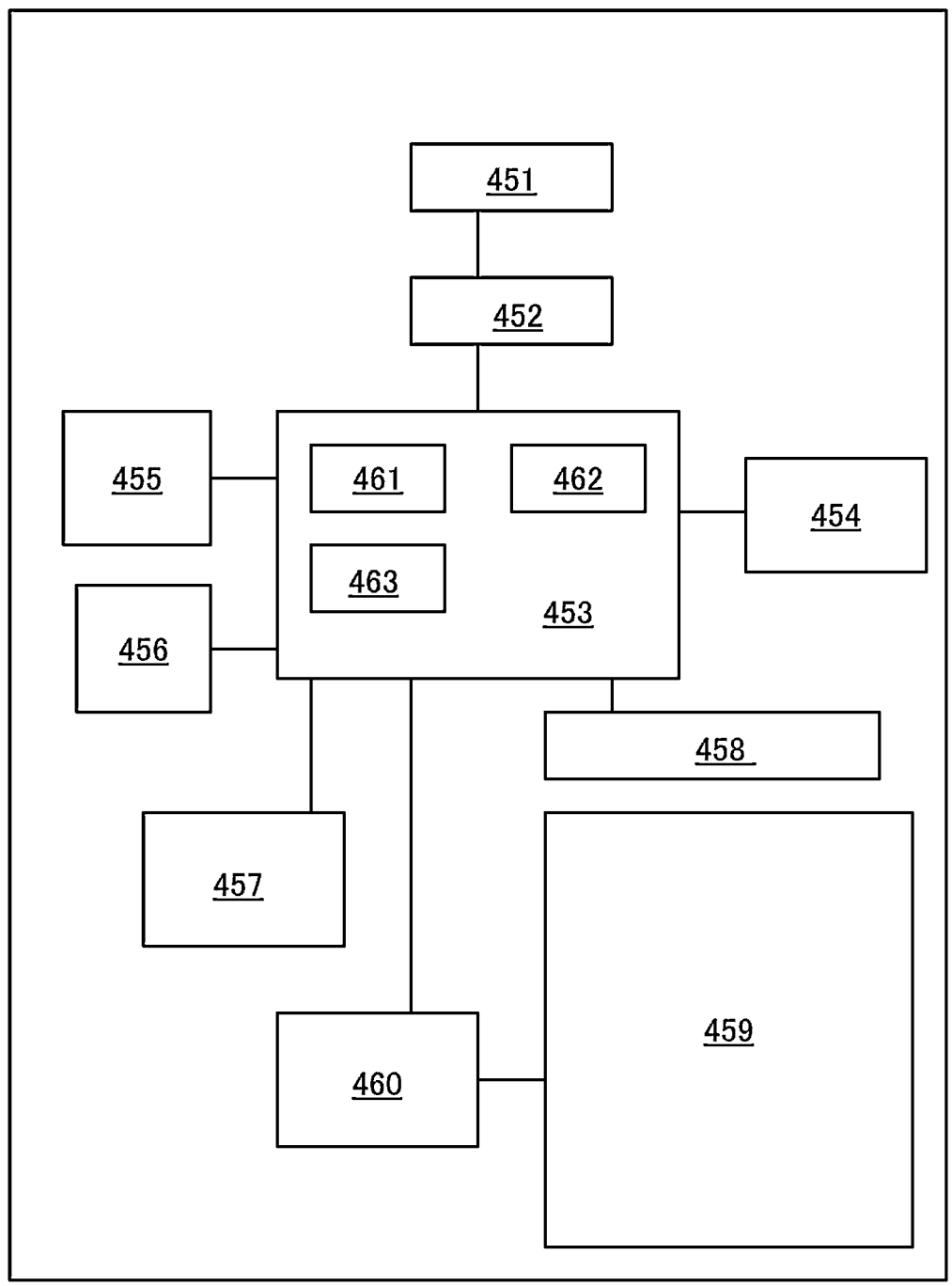
FIG. 61 is a block diagram of an e-book reader.

FIG. 61 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface (IF) 463. For example, adoption of the semiconductor device described in any of the above embodiments for any or each of CPU 461, the audio circuit 455, the memory circuit 457, the display controller 460, the DSP 462, and the interface 463 leads to a reduction in power consumption.

This embodiment can be implemented combining with another embodiment as appropriate.

This application is based on Japanese Patent Application serial no. 2011-113080 filed with Japan Patent Office on May 20, 2011, the entire contents of which are hereby incorporated by reference.

What is claimed is:

1. A semiconductor device comprising:
a first transistor comprising:
a first oxide semiconductor layer and a first gate electrode with a first gate insulating layer therebetween; and
a pair of first conductive layers electrically connected to the first oxide semiconductor layer;
a second transistor comprising:
a second oxide semiconductor layer and a second gate electrode with a second gate insulating layer therebetween; and
a pair of second conductive layers electrically connected to the second oxide semiconductor layer; and
an inverter comprising:
a third transistor and a fourth transistor, each channel region thereof including silicon;
an input electrically connected to the second gate electrode; and
an output electrically connected to the first gate electrode,
wherein each of the first oxide semiconductor layer and the second oxide semiconductor layer includes In and Zn, and
wherein carrier density of each of the first transistor and the second transistor is less than $1\times10^{14}/cm^3$.

2. The semiconductor device according to claim 1, further comprising:
a wiring in direct contact with the output of the inverter and the first gate electrode.

3. The semiconductor device according to claim 1,
wherein when a high voltage is input to the inverter, a low voltage is output from the inverter and is input to the first gate electrode, so that the first transistor is turned off, and
wherein when a low voltage is input to the inverter, a high voltage is output from the inverter and is input to the first gate electrode, so that the first transistor is turned on.

4. A flip-flop comprising the semiconductor device according to claim 1.

5. An electronic device comprising the semiconductor device according to claim 1.

6. The semiconductor device according to claim 1, wherein each of the first transistor and the second transistor is a top gate transistor.

7. The semiconductor device according to claim 1, wherein each of the first oxide semiconductor layer and the second oxide semiconductor layer further includes Sn.

8. The semiconductor device according to claim 1, wherein the carrier density is less than $1\times10^{12}/cm^3$.

9. The semiconductor device according to claim 1, wherein the carrier density is less than $1\times10^{11}/cm^3$.

10. The semiconductor device according to claim 1,
wherein each of the first transistor and the second transistor has an off-state current of $1\times10^{-19}$ A/μm or less.

11. A semiconductor device comprising:
a first transistor comprising:
a first oxide semiconductor layer and a first gate electrode with a first gate insulating layer therebetween; and
a pair of first conductive layers electrically connected to the first oxide semiconductor layer;
a second transistor comprising:
a second oxide semiconductor layer and a second gate electrode with a second gate insulating layer therebetween; and
a pair of second conductive layers electrically connected to the second oxide semiconductor layer; and
an inverter comprising:
a third transistor and a fourth transistor, each channel region thereof including silicon;
an input electrically connected to the second gate electrode; and
an output electrically connected to the first gate electrode,
wherein each of the first oxide semiconductor layer and the second oxide semiconductor layer includes In and Zn,
wherein each of the first transistor and the second transistor comprises a region sandwiching a channel formation region thereof, and
wherein a nitrogen concentration in the region is in a range of $5\times10^{19}/cm^3$ or greater and $1\times10^{22}/cm^3$ or less.

12. The semiconductor device according to claim 11, further comprising:
a wiring in direct contact with the output of the inverter and the first gate electrode.

13. The semiconductor device according to claim 11,
wherein when a high voltage is input to the inverter, a low voltage is output from the inverter and is input to the first gate electrode, so that the first transistor is turned off, and
wherein when a low voltage is input to the inverter, a high voltage is output from the inverter and is input to the first gate electrode, so that the first transistor is turned on.

14. A flip-flop comprising the semiconductor device according to claim 11.

15. An electronic device comprising the semiconductor device according to claim 11.

16. The semiconductor device according to claim 11, wherein each of the first transistor and the second transistor is a top gate transistor.

17. The semiconductor device according to claim 11, wherein each of the first oxide semiconductor layer and the second oxide semiconductor layer further includes Sn.

18. The semiconductor device according to claim 11,
wherein each of the first transistor and the second transistor has an off-state current of $1\times10^{-19}$ A/μm or less.

19. A semiconductor device comprising:
a transistor comprising an oxide semiconductor film with a channel formation region; and an inverter of which an output is electrically connected to a gate of the transistor, wherein:

the inverter comprises transistors of which each channel region includes silicon, the oxide semiconductor film includes at least indium, and a carrier density of the oxide semiconductor film is less than $1\times10^{11}/cm^3$.

20. The semiconductor device according to claim 19, wherein:

when a high voltage is input to the inverter, the transistor is turned off, and when a low voltage is input to the inverter, the transistor is turned on.

21. An electronic device comprising the semiconductor device according to claim 19.

22. A semiconductor device comprising:

a transistor comprising an oxide semiconductor film with a channel formation region; and an inverter of which an output is electrically connected to a gate of the transistor, wherein:

the inverter comprises transistors of which each channel region includes silicon, the oxide semiconductor film includes at least indium, the oxide semiconductor film comprises a region sandwiching the channel formation region, and a nitrogen concentration in the region is in a range of $5\times10^{19}/cm^3$ or greater and $1\times10^{22}/cm^3$ or less.

23. The semiconductor device according to claim 22, wherein:

when a high voltage is input to the inverter, the transistor is turned off, and when a low voltage is input to the inverter, the transistor is turned on.

24. An electronic device comprising the semiconductor device according to claim 22.

* * * * *